(12) United States Patent
Koch et al.

(10) Patent No.: US 8,554,972 B2
(45) Date of Patent: Oct. 8, 2013

(54) LOGIC CHIP, METHOD AND COMPUTER PROGRAM FOR PROVIDING A CONFIGURATION INFORMATION FOR A CONFIGURABLE LOGIC CHIP

(75) Inventors: Dirk Koch, Erlangen (DE); Thilo Streichert, Sindelfingen (DE); Christian Haubelt, Nuremberg (DE); Juergen Teich, Erlangen (DE)

(73) Assignee: Friedrich-Alexander-Universitaet-Erlangen-Nuernberg, Erlangen (DE)

( * ) Notice: Subject to any disclaimer, the term of this patent is extended or adjusted under 35 U.S.C. 154(b) by 428 days.

(21) Appl. No.: 12/677,913

(22) PCT Filed: Sep. 8, 2008

(86) PCT No.: PCT/EP2008/007343
§ 371 (c)(1),
(2), (4) Date: Oct. 27, 2010

(87) PCT Pub. No.: WO2009/033631
PCT Pub. Date: Mar. 19, 2009

(65) Prior Publication Data
US 2011/0055449 A1    Mar. 3, 2011

(30) Foreign Application Priority Data
Sep. 13, 2007  (EP) ..................................... 07017975

(51) Int. Cl.
G06F 13/00    (2006.01)
G06F 17/50    (2006.01)

(52) U.S. Cl.
USPC ............................ 710/305; 710/100; 716/117

(58) Field of Classification Search
USPC .......................... 710/100, 305, 110; 716/117
See application file for complete search history.

(56) References Cited

U.S. PATENT DOCUMENTS

| 5,243,704 A | 9/1993 | Baty et al. |
| 5,682,107 A | 10/1997 | Tavana et al. |

(Continued)

FOREIGN PATENT DOCUMENTS

| EP | 1 164 490 A2 | 12/2001 |
| EP | 1 231 525 A1 | 8/2002 |

(Continued)

OTHER PUBLICATIONS

A. Ahmadinia et al "DyNoC: A dynamic infrastructure for communication in dynamically reconfigurable devices". In Proceedings of the International Conference on Field-Progammable Logic and Applications (FPL), pp. 153-158, Tampere, Finland, Aug. 2005.

(Continued)

Primary Examiner — Glenn A Auve
(74) Attorney, Agent, or Firm — Michael A. Glenn; Perkins Coie LLP

(57) ABSTRACT

A logic chip has a plurality of individually-addressable resource blocks, each comprising logic circuitry. The logic chip also has a bus comprising a plurality of bus information lines. A first of the resource blocks has a coupling between a first strict sub-set of the bus information lines and the logic circuitry of the first resource block. A second of the resource blocks, which is adjacent to the first resource block, has a coupling between a second strict sub-set of the bus information lines and the logic circuitry of the second resource blocks. The first and second sub-sets have different bus lines.

16 Claims, 38 Drawing Sheets

(56) References Cited

U.S. PATENT DOCUMENTS

| | | |
|---|---|---|
| 6,577,159 B1 | 6/2003 | Macias et al. |
| 2006/0004940 A1 | 1/2006 | Saito et al. |
| 2007/0143577 A1* | 6/2007 | Smith ............................ 712/10 |

FOREIGN PATENT DOCUMENTS

| | | |
|---|---|---|
| WO | WO 98/16012 | 4/1998 |
| WO | WO 01/93075 A2 | 12/2001 |
| WO | WO 02/19618 A2 | 3/2002 |
| WO | WO 03/073314 A2 | 9/2003 |
| WO | WO 2004/055986 | 7/2004 |
| WO | WO 2005/073866 A2 | 8/2005 |

OTHER PUBLICATIONS

Advanced RISC Machines Ltd. / AMBA System Architecture, May 2007, available online at: http://www.arm.com/products/solutions/AMBAHomePage.html. 3 pages.

A. Ahmadinia et al "A practical approach for circuit routing on dynamic reconfigurable devices". In Proceedings of the 16th IEEE International Workshop on Rapid System Prototyping (RSP), pp. 84-90, Montreal, Canada, Jun. 2005.

Altera Corporation. "Avalon Interface Specifications"; 2007. Available online Apr. 15, 2009 from website: www.altera.com/literature/manual/mnl_avalon_spec.pdf.

Altera Inc. "Altera Devices", Jun. 2007 www.altera.com/products/devices/dev-index.jsp.

L. Benini et al "Networks on Chips: A new SoC paradigm". Computer, 35(1): pp. 70-78, Jan. 2002.

C. Bieser et al "Rapid prototyping design acceleration using a novel merging methodology for partial configuration streams of Xilinx Virtex-II FPGAs". rsp, 0: pp. 193-199, 2006.

H.A. Elgindy et al "RMB—A reconfigurable multiple bus network"; In Proceedings of the Second International Symposium on High-Performance Computer Architecture (HPCA-2) pp. 108-117, Feb. 1996.

M. Huebner et al "Real-time LUT based network topologies for dynamic and partial FPGA self-reconfiguration". In SBCCI '04: Proceedings of the 17th Symposium on Integrated Circuits and System Design pp. 28-32, New York, NY, USA, 2004. ACM Press.

J. Hagemeyer et al "Design of homogeneous communication infrastructures of partially reconfigurable FPGAs". In Proceedings of the 2007 International Conference on engineering of reconfigurable system and algorithms (ERSA '07), Las Vegas, USA, Jun. 2007. to appear.

H. Hagemeyer et al "Dedicated access in dynamically reconfigurable systems". In Proceedings of the 20th international parallel and distributed processing Symposium (IPDPS), 2006.

M. Huebner et al "New 2-dimensional partial dynamic reconfiguration techniques for real-time adaptive microelectronic circuits". In ISVLSI '06: Proceedings of the IEEE computer society annual Symposium on emerging VLSI technologies and architectures, p. 97, Washington, DC, USA, 2006. IEEE computer society.

Xilinx Inc. "Two flows for partial reconfiguration: Module based or difference based". Sep. 2004 Available online: www.xilinx.com/bvdocs/appnotes/sapp290.pdf.

Xilinx Inc. "Xilinx answer record 18278", May 2007, retrieved on Apr. 6, 2010 from website: Available online: www.xilinx.com/xlnx/xil_ans_display.jsp?getPagePath=18278.

Xilinx Inc. "Xilinx Virtex II Platform FPGA User Guide", Nov. 2007, http://www.xilinx.com/support/library.htm.

International Business Machines Corporation (IBM). "The CoreConnectTMBus Architecture", 1999 Available online: http://www-03.ibm.com/chips/products/coreconnect/.

S. Koh et al "COMMA: A communication methodology for dynamic module-based reconfiguraion of FPGAs". In ARCS 2006—19th international conference on architecture of computing systems, Workshops Proceedings, pp. 173-182, Mar. 2006.

S. Koh et al "COMMA: A communications methodology for dynamic module reconfiguration in FPGAs (extended abstract)"; Apr. 14-16, 2006; In 14th IEEE Symposium on field-programmable custom computing machines (FCCM 2006), pp. 273-274, Napa, CA USA.

D. Koch et al "Efficient hardware checkpointing-concepts, overhead analysis, and implementation". In Proceedings of the 15th ACM/SIGDA international Symposium on field-progammable gate arrays (FPGA 2007), pp. 188-196, Monterey, California, USA, Feb. 2007. ACM.

Y. E. Krasteva et al "Straight method for reallocation of complex cores by dynamic reconfiguration in Virtex II FPGAs". In Proceedings of the 16th IEEE international workshop on rapid system prototyping (RSP '05), pp. 77-83, Washington, DC, USA, 2005. IEEE computer society.

H. Kalte et al "System-on-programmable-chip approach enabling online fine-grained 1D-placement"; Apr. 26-30, 2004 In 11th Reconfigurable Architectures Workshop (RAW 2004), IEEE computer society p. 141, New Mexico, USA.

D. Koch et al "Platform-independent methodology for partial reconfiguration"; Apr. 14-16, 2004; In CF '04. Proceedings of the 1st conference on computing frontiers, pp. 398-403, Ischia, Italy, printed in New York, NY, USA, 2004 by ACM Press.

P. Lysaght et al "Invited paper: Enhanced architectures, design methodologies and CAD tools for dynamic reconfiguration of Xilinx FPGAs". In Proceedings of the 16th international conference on field programmable logic and application (FPL '06), pp. 1-6, 12-17 and 28-30, Aug. 2006.

J. Palma et al "Core communication interface for FPGAs" Sep. 2002, presented at SBCCI '02: Proceedings of the 15th Symposium on integrated circuits and systems design, p. 183, Brazil; printed in Washington, DC, USA, 2000. IEEE computer society.

P. Sedcole et al "Parametric yield in FPGAs due to within-die delay variations: A quantitative analysis"; In Proceedings of the 15th ACM/SIGDA international Symposium on field-programmable gate arrays (FPGA 2007), pp. 178-187, Monterey, California, USA, Feb. 2007. ACM.

SilicoreTM. "WISHBONE System-on-chip (SoC)Interconnection architecture for portable IP cores Rev. B.3, 2002"; Sep. 7, 2002; Available online: http://www.opencores.org/projects.cgi/web/wishbone/wbspec_b3.pdf.

M. Ullmann et al "An FPGA run-time system for dynamical on-demand reconfiguration"; In Proceedings of 18th international parallel and distributed processing Symposium (IPDPS '04), Santa Fe, New Mexico, Apr. 2004.

H. Walder et al "A runtime environment for reconfigurable hardware operating systems"; In Proceedings of the 14th international conference on field programmable logic and application (FPL '04), pp. 831-835, Springer, Sep. 2004.

Xilinx Inc. "Xilinx: Silicon devices", Jun. 2007 www.xilinx.com/products/silicon_solutions/.

B. Blodget et al "A self-reconfiguring platform"; Sep. 1-3, 2003; In Proceedings of international conference on field-programmable logic and applications (FPL) pp. 565-574, Lisbon, Portugal, 2003.

P. Sedcole et al "Modular dynamic reconfiguration in Virtex FPGAs"; IEEE, 153(3): 157-164, 2006.

D. Koch et al "Efficient reconfigurable on-chip buses"; Aug. 7, 2007, p. 83, Erlangen, Germany.

D. Koch et al "Efficient reconfigurable on-chip buses for FPGAs"; FCCM 2008, Stanford, California, Apr. 14-15, 2008.

D. Koch et al "ReCoBus-Builder—a novel tool and technique to build statically and dynamically reconfigurable systems for FPGAs", Sep. 8-10, 2008 accepted for the FPL, pp. 119-124.

D. Koch et al "Bitstream decompression for high speed FPGA configuration from slow memories"; Dec. 12-14, 2007; In Proceedings of the 2007 IEEE international conference on field-programmable technology (ICFPT '07). IEEE, Kitakyushu, Japan.

D. Koch et al "Searching RC5-keys with distributed reconfigurable computing"; In Proceedings of international conference on engineering of reconfigurable systems and algorithms (ERSA 2006), pp. 42-48, Las Vegas, USA, Jun. 2006.

F. Ferrandi et al "A design methodology for dynamic reconfiguration: The caronte architecture"; Apr. 3-8, 2005; In Proc. of the 19th international parallel and distributed processing Symposium (IPDPS). IEEE computer society, Denver, Colorado USA.

M. Huebner et al "Real-time LUT-based network topologies for dynamic and partial FPGA self-reconfiguration" In Proc. of the 12th international conference on very large scale integration VLSI-SoC, Sep. 7-11, 2004, Pernambuco, Brazil.

M. Huebner et al "Elementary block based 2-dimensional dynamic and partial reconficugaration for Virtex-II FPGAs"; Apr. 25-29, 2006; In Proc. of the 20th international parallen and distributed processing Symposium (IPDPS), Rhodes Island, Greece.

H. Kalte et al "Context saving and restoring for multitasking in reconfigurable systems"; Aug. 24-26, 2005; In Proc. of the 15th international conference on field programmable logic and applications (FPL), Tampere, Finland.

H. Kalte et al "REPLICA2Pro: Task relocation by bitstream manipulation in Virtex-II/Pro FPGAs"; May 3-5, 2006; In CF '06: Proceedings of the 3rd conference on computing frontiers, pp. 403-412, Isca, Italy, published New York, NY, USA, 2006. ACM Press.

M. Koester et al "Task placement for heterogeneous reconfigurable architectures"; Dec. 11-14, 2005; In Proc. of the IEEE2005 conference on field-programmable technology (FPT'05), pp. 43-50. IEEE computer society, Singapore.

T. Marescaux et al "Interconnection networks enable fine-grain dynamic multi-tasking on FPGAs"; Sep. 2-4, 2002; In Proc. of the 12th international conference on field-programmable logic and applications (FPL), pp. 795-805. Springer, 2002.

P. Sedcole et al "Modular partial reconfiguration in Virtex FPGAs"; in 15th conference on field programmable logic and applications (FPL2005), pp. 211-216, Aug. 24-26, 2005, Tempere, Finland.

Xilinx. "Early access partial reconfiguration user guide". In UG208, Mar. 6, 2006.

Eto, Emi; "Difference-Based Partial Reconfiguration"; Dec. 3, 2007; Xilinx, XAPP290 (v2.0); 11 pages.

Li, et al.; "Free-space optical mesh-connected bus networks using wavelength-division multiple access"; Nov. 10, 1993; Applied Optics, OSA, Optical Society of America, Washington DC, vol. 32, No. 32, pp. 6425-6437, XP000413276, ISSN: 0003-6935, figure 1, p. 6426 left-hand column, line 5-line 20.

Horng-Ren, et al.; "Optimal Algorithms for the Channel-Assignment Problem on a Reconfigurable Array of Processors with Wider Bus Networks"; Nov. 1, 2002; IEEE Transactions on Parallel and Distributed Systems, IEEE Service Center, Loa Alamitos, CA USA, vol. 13, No. 11, pp. 1124-1138, XP011095158, ISSN: 1045-9219, the whole document.

* cited by examiner

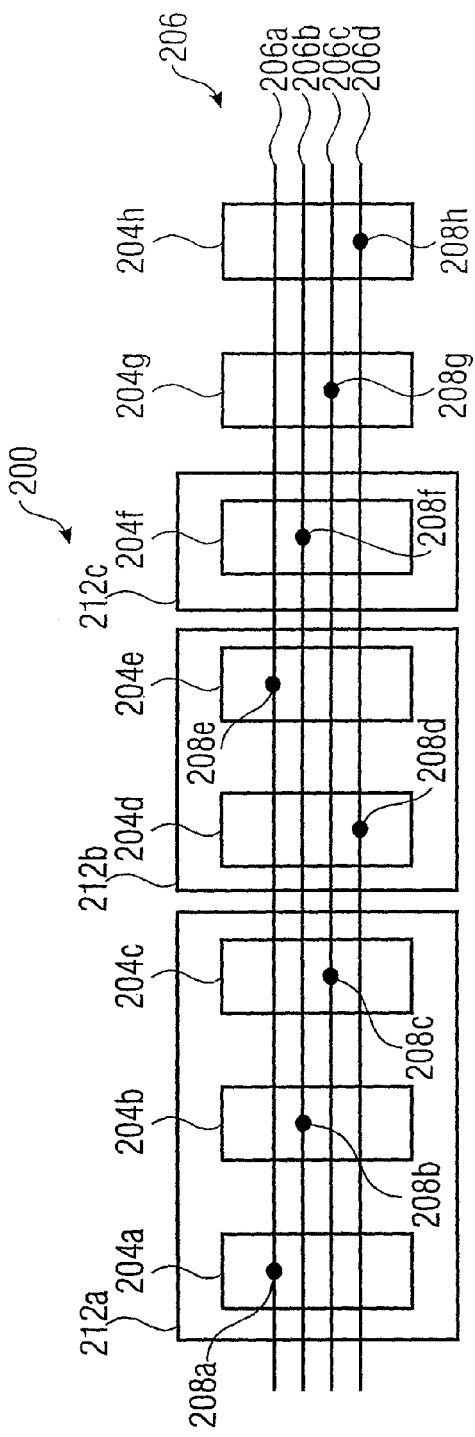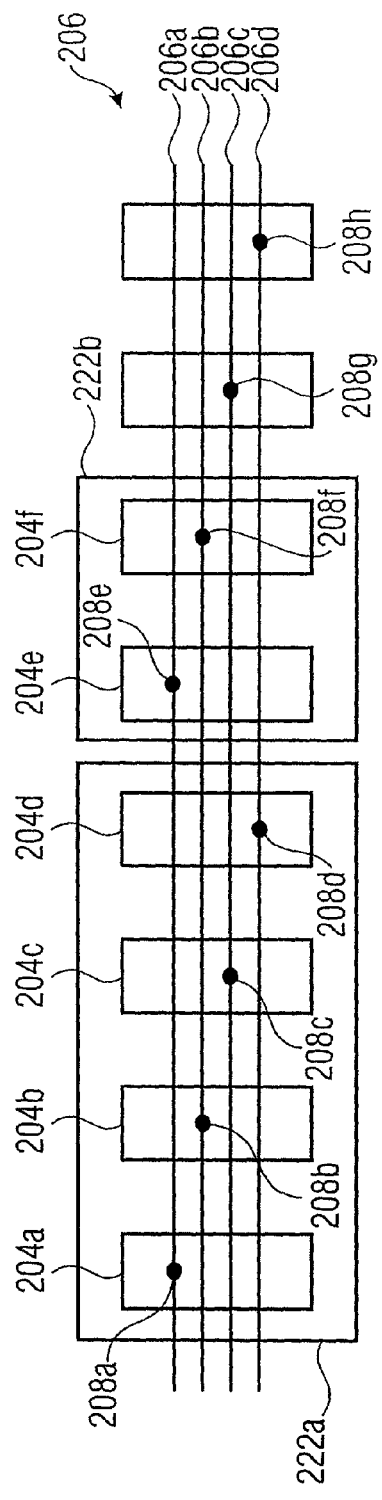

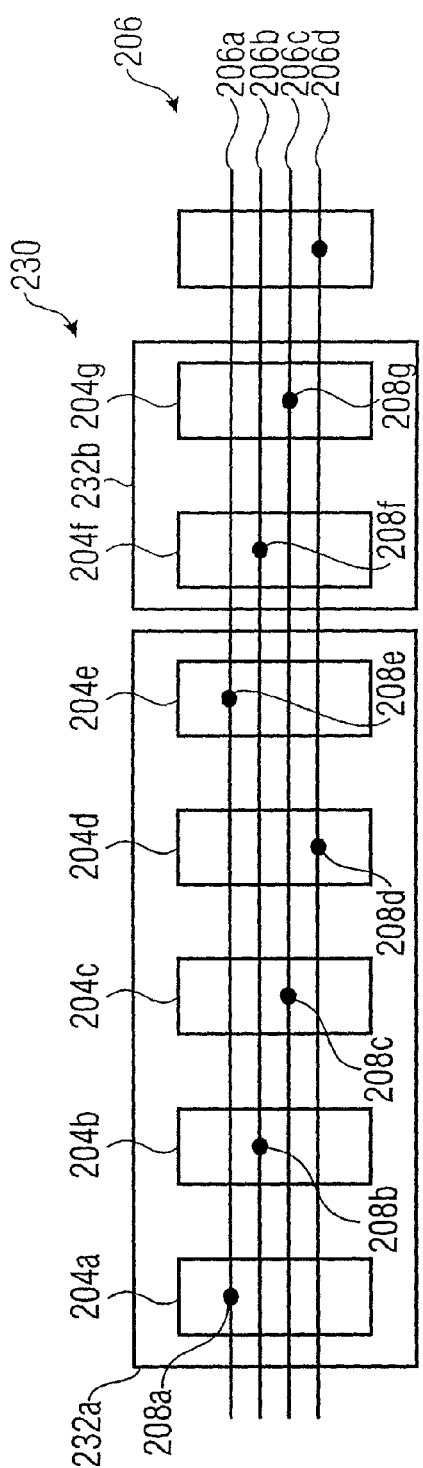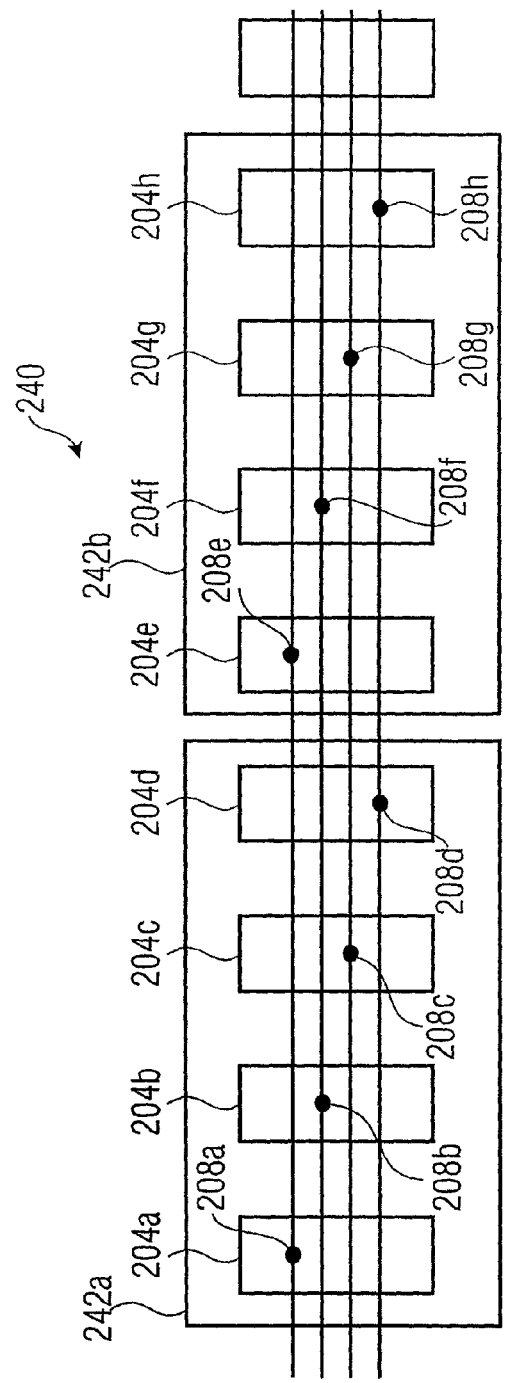

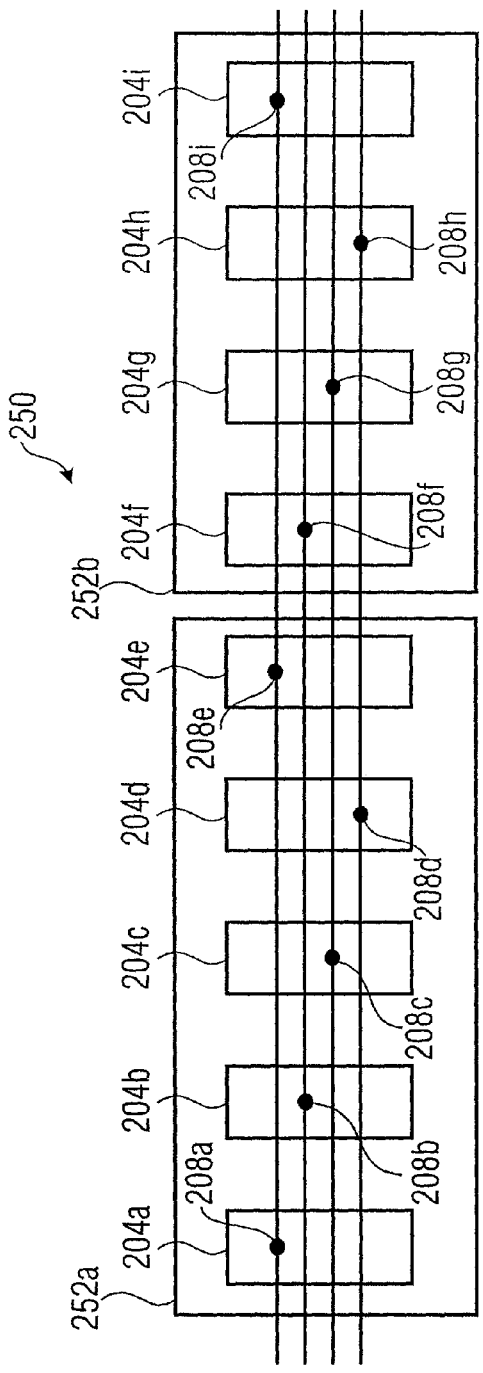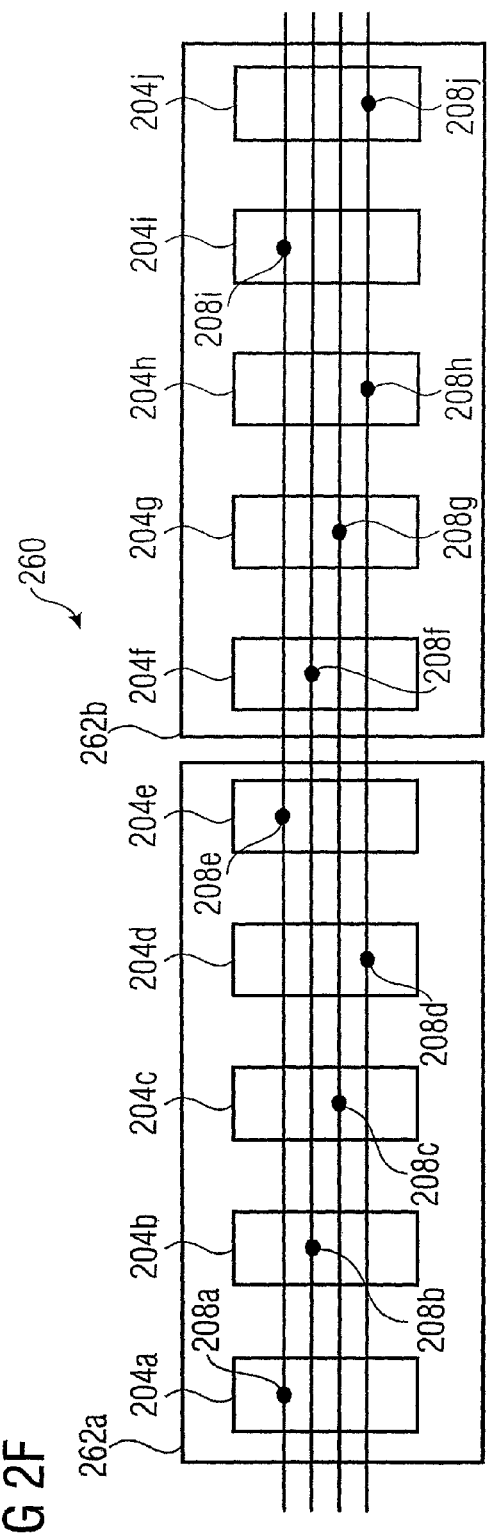

| module identification | module leftmost resource slot | module position (modulate) | module address |
|---|---|---|---|
| video module | 0 | 0 | 1 |
| serial interface module | 3 | 3 | 2 |
| parallel interface module | 4 | 0 | 3 |
| audio module | 6 | 2 | 4 |

FIG 3B

| Module position (modulo 4) | Subset of the hit information lines coupled to reference resource slot of module (e.g. "leftmost" resource slot used by module) |
|---|---|
| 0 | bils 1 |
| 1 | bils 2 |
| 2 | bils 3 |
| 3 | bils 4 |

FIG 3C

| module identification | module leftmost resource slot | module position (modulate) | module address |
|---|---|---|---|
| video module | 2 | 2 | 2 |
| serial interface module | 5 | 1 | 3 |
| parallel interface module | 6 | 2 | 4 |
| audio module | 0 | 0 | 1 |

FIG 4B

Mapping:

| Modulo-4 Module position information 349 of addressed module | Mapping / connection d:↔bils j for communication with addressed module |
|---|---|
| 0 | $d_1$↔ bils 1<br>$d_2$↔ bils 2<br>$d_3$↔ bils 3<br>$d_4$↔ bils 4 |
| 1 | $d_1$↔ bils 2<br>$d_2$↔ bils 3<br>$d_3$↔ bils 4<br>$d_4$↔ bils 1 |
| 2 | $d_1$↔ bils 3<br>$d_2$↔ bils 4<br>$d_3$↔ bils 1<br>$d_4$↔ bils 2 |
| 3 | $d_1$↔ bils 4<br>$d_2$↔ bils 1<br>$d_3$↔ bils 2<br>$d_4$↔ bils 3 |

FIG 5

|  | | | | | |
|---|---|---|---|---|---|
| bils4 | bils1 | bils2 | bils3 | bils4 | bils1 |
| bils1 | bils2 | bils3 | bils4 | bils1 | bils2 |
| bils2 | bils3 | bils4 | bils1 | bils2 | bils3 |
| bils3 | bils4 | bils1 | bils2 | bils3 | bils4 |
| bils4 3 | bils1 0 | bils2 1 | bils3 2 | bils4 3 | bils1 0 |
| bils1 0 | bils2 1 | bils3 2 | bils4 3 | bils1 0 | bils2 1 |

FIG 6

$P = (m+n) \bmod N$

| Module Position $P=(m+n) \bmod N$ | Subset of the bitinformation lines coupled to reference resource slot of the bottommost and leftmost resource slot used by module |
|---|---|
| p=0 | bils1 |
| p=1 | bils2 |
| p=2 | bils3 |
| p=3 | bils4 |

| module identification | leftmost slot (m) | bottommost slot (n) | module Position $P = (m+n) \bmod N$ |
|---|---|---|---|
| audio module | m=0 | n=1 | n=1 |
| video module | m=2 | n=3 | n=1 |
| serial interface module | m=2 | n=1 | n=3 |
| parallel interface module | m=4 | n=0 | n=0 |

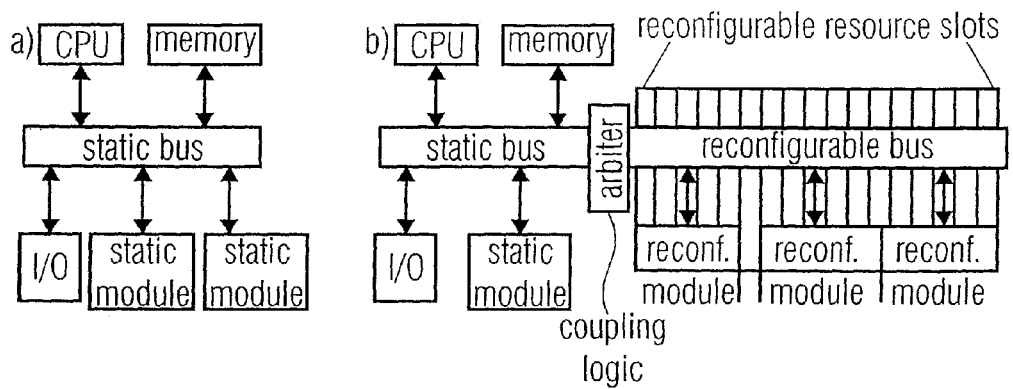
FIG 22
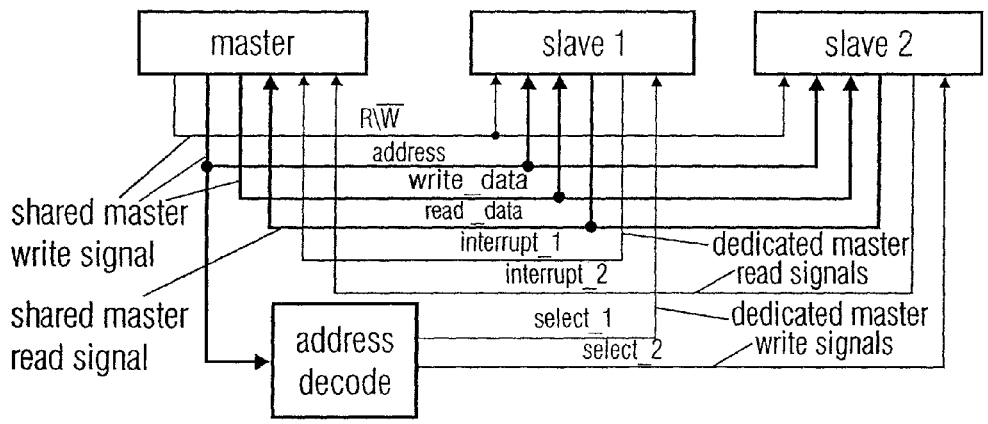
FIG 23
| | shared | dedicated (non-shared) |
|---|---|---|
| write | address<br>data_out<br>write_enable<br>read_enable<br>byte_select | module_enable<br>bus_request* |
| read | data_in<br>address_in | interrupt<br>wait_request<br>bus_grant* |
*Signal for master-arbiter communication
FIG 24

LOGIC CHIP, METHOD AND COMPUTER PROGRAM FOR PROVIDING A CONFIGURATION INFORMATION FOR A CONFIGURABLE LOGIC CHIP

CROSS-REFERENCE TO RELATED APPLICATIONS

This application is a National Phase of PCT/EP2008/007343 filed 8 Sep. 2008, which claims priority from German Patent Application No. 07017975.9, which was filed on 13 Sep. 2007, and is incorporated herein in its entirety by reference.

BACKGROUND OF THE INVENTION

Some embodiments according to the invention are related to a logic chip and to a method and computer program for providing a configuration information for a configurable logic chip.

Some embodiments according to the invention are related to a logic chip, a logic system and a method and computer program for designing a logic chip.

Some embodiments according to the invention are related to efficient re-configurable on-chip buses.

Some embodiments according to the invention are related to further developments regarding efficient re-configurable on-chip buses.

Some embodiments according to the invention are related to efficient re-configurable on-chip buses for field programmable gate arrays (FPGAs).

Some embodiments according to the invention are related to details regarding a mapping of a so-called "ReCoBus" on a FPGA.

The design of logic circuits has been a challenging task. However, at present, the complexity of logic circuits, logic chips and logic systems is steadily increasing. This brings along significant challenges in the design of such logic circuits. Also, with increasing complexity of the logic circuits, it is getting more and more difficult to provide an efficient way of interconnecting different logic blocks.

Also, it is often desired to have a high flexibility regarding the configuration of a logic circuit, which flexibility may be desirable in some cases at design time and in some cases even at a run time. To summarize, the design of logic circuits brings along a plurality of challenges.

In the following, some aspects regarding the design of logic circuits will be described.

The article "Design of homogeneous communication infrastructures for partially re-configurable FPGAs" of J. Hagemeyer (published in: proceedings of the 2007 International Conference on Engineering of Re-configurable Systems and Algorithms, Las Vegas, USA, Jun. 25-28, 2007) describes the concept of dynamic re-configuration as a promising approach to enhance the resource efficiency of FPGAs beyond the current possibilities. A communication infrastructure is described that enables data transfer between the hardware modules that are placed on the FPGA at run-time. A communication macro for Xilinx FPGAs is described that considers the special requirements of these systems. The approach described in said paper implements an infrastructure that allows free placement of hardware modules at run time. Methodologies like 2D-placement of modules can be implemented. A tool-flow is described that automatically generates the essential communication infrastructure for FPGAs of the Xilinx Virtex-E to Virtex-5 family.

Further details can be taken from the "development system reference guide", published online by Xilinx, for example in chapters 4 and 5 thereof.

Further aspects regarding the configuration of FPGAs are, for example, described in the "Spartan-3 generation FPGA user guide", published online by Xilinx under document number UG331. For example, in chapter 5 of said document, the use of configurable logic blocks is described. In chapter 12 of said document, the use of interconnects is described.

Also, further aspects regarding interconnects are described in the "product specification", published online by Xilinx under document number DS312-2 (v3.7), for example on pages 65 to 67.

Further Conventional Concepts

In the following, some further conventional systems will be described.

Systems using FPGA resources in a time variant manner by exploiting partial reconfiguration have been presented in various academic publications. One important issue of this work is the interfacing of hardware accelerators to on-chip buses (OCBs) and to the static system containing typically a CPU, the memory, and the I/O interface modules. Existing approaches for on-chip communication are based on i) circuit switching techniques, ii) packet switching mechanisms, and iii) on-chip buses. In the following, we will present each class separately.

Circuit Switching

In the following, a so-called circuit switching will be described.

Circuit switching is a technique where physically wired links are established between two or more modules for a certain amount of time. Typically, these links are realized by more or less complex crossbar switches. The switching state of the switches may be controlled centralized by the static part of the system [UHB04] or distributed by some logic in the crossbar switches itself [ESS+96, Ali05].

In [UHB04], a system is presented where hardware modules (e.g., a dedicated accelerator or a control function) can be configured into predefined FPGA resource areas of fixed size called a slot. The communication is implemented through dedicated communication macros attached at the bottom of a module's slot. The communication macros have dedicated crossbar like switch resources combined with connection points on the left and right border each. These macros allow a circuit switching between the modules and a bridge that connects the module to the OCB that is based on segmented buses. The routing and therefore the control of the switch elements is determined by a centralized arbiter. This approach does not allow a direct connection to I/O-peripherals connected to the OCB. All I/O communication has to be implemented over the bridge by the CPU subsystem. The bridge concept necessitates a specialized module interface and furthermore a specialized driver interface for the CPU subsystem.

In [ESS+96, Ali05] a circuit switching architecture is presented where the switching state is determined by the crossbar switches themselves with respect to currently used routing resources. The approach necessitates fully equipped crossbars. As a consequence, the approach allows only a few modules to be integrated into a re-configurable system.

Both approaches do not allow a module to directly access any memory of the system. In addition, the large multiplexers needed for circuit switching allow only a very coarse-grained placement of modules. The large multiplexers have also significant propagation delays leading to decreased throughputs when using circuit switching.

Another approach [HSKB06] for two dimensional circuit switching is based on templates for turning, forking, crossing, or routing through a set of signals. By attaching these templates together through partial reconfiguration, it is possible to set a fixed routing path between some modules. This approach necessitates a significant amount of area on the FPGA around the modules in order to build the routing because there is no technique available to share the routing wires inside the templates for building multiple routing tracks. As modules are obstacles for this kind of routing, the area necessitated for routing cannot be used to implement the module's logic. This circuit switching technique necessitates online routing algorithms and also an online timing verification.

Packet Switching

In the following, the so-called packet switching will be described.

The motivation for packet switching comes from the ASIC domain where more and more functional units were integrated. In order to deal with multiple clock domains, modularity for IP-reuse, and in order to support parallelism in communication and computation, networks on a chip (NoC) [BM02] have been proposed. This was the motivation in [ABM+05] to integrate a dynamic re-configurable network on an FPGA called a DyNoC. Here, a grid of routers that are arranged in a mesh structure is used for the communication among the re-configurable modules. Each data packet has a header containing the destination address that is specified by the horizontal and vertical coordinates of the target module. Therefore, each router can decide locally when to deliver a packet to an attached module or where to send the packet further. The routers are capable to deal with obstacles. However, the approach in [ABM+05] demands a relatively fine grid of routers while the implementation revealed that the logic for a single router necessitates several hundreds or even thousands of look-up tables (depending on the supported packet sizes) in order to implement the routing logic. We can conclude that packet routing produces an enormous overhead when implemented on FPGAs.

Buses

In the following, some buses will be described.

Buses are the native way to link communicating modules together within a system-on-a-chip (SoC). All major FPGA vendors offer tools that allow easily to integrate a set of user-defined modules or IP cores into complete systems by the use of on-chip buses. Consequently, buses are good candidates for integrating also partial re-configurable modules into a system at runtime. Most work [WP04], [KJdlTR05], [KPR04], [BMG06], and [PdMM+02] done in this field is based on older Xilinx Virtex FPGA architectures that provide wires that span over the complete horizontal width of the devices and that can be used to build buses with tristate drivers. However, newer FPGA architectures have no support for tristate wires and none of these approaches deal efficiently with dedicated signals, e.g., interrupt lines and chip select signals.

In [WP04], [KD06b] and [KD06a], systems are proposed where fixed resource areas with also fixed connection points to a bus interface are used for the integration of partially re-configurable modules into a runtime system. The main drawback of this solution is that all modules have to fit into such a resource area and that the resource areas could not be shared by multiple modules, even if the logic of multiple modules would fit into the same resource area. A suitable bus infrastructure for integrating re-configurable modules should (but not necessarily) be able to connect modules of different sizes efficiently to the rest of the system.

In [HKP06], a more flexible approach is presented that uses on-chip tristate wires in order to build a bus for re-configurable systems. This approach allows variable module sizes but necessitates tristate wires that are not found on newer FPGA architectures. In addition, [HKP06] presents four different approaches for distributing enable signals to dedicated modules connected to the bus. The first approach assigns a module to a predefined location. This is a template based methodology, where the bus interface is a fixed part in the macro infrastructure forming a tristate-based bus and where the respective module is plugged into this fixed resources. The module enable signals are distributed in a non-uniform way to particular module resources, preventing to use this approach for re-locatable modules or for multiple instances of the same module on the bus.

The second approach uses an exclusive horizontal enable signal spanning over all re-configurable slots of the FPGA for each individual module. Therefore, modules may be re-locatable but they cannot be instantiated more than once as they all would respond to the same enable signal.

The third approach compensates the disadvantage of no multiple instances of the same module by reserving extra logic resources for routing one of the horizontal enable signals to another connecting point at the same relative position for each module.

The last approach in [HKP06] utilizes a serial shift register with parallel load that is distributed over all modules with one bit in each module connecting point. The enable signal to a specific slot is distributed by shifting in a one hot encoded enable stream combined with a following load enable for the output flip-flops. These flip-flops determine which module is allowed to drive a signal onto the bus. This variant allows to access multiple instances of the same module combined with the capability of module relocation as the third approach and further saves the need of additional resources for the vertical routing of the enable signals. But this shift register enable scheme necessitates R+1 clock cycles for R resource slots provided by the bus in order to distribute a select signal to a specific module. Furthermore, this approach necessitates additional control logic inside the bus interface to make it compatible for traditional device drivers.

More related work will be presented below where we point out the advantages and novelties of the present methodology against these conventional technologies.

In view of the above, there is a need for a resource-efficient concept of providing signals to resource slots or modules.

SUMMARY

According to an embodiment, a logic chip may have a plurality of individually-addressable resource blocks, each comprising logic circuitry; a bus comprising a plurality of bus information lines; wherein a first of the resource blocks has a coupling between a first strict sub-set of the bus information lines and the logic circuitry of the first resource block; wherein a second of the resource blocks, which is adjacent to the first resource block, has a coupling between a second strict sub-set of the bus information lines and the logic circuitry of the second resource blocks; wherein the first and second sub-sets have different bus lines; wherein the bus has a plurality of sub-sets of bus information lines; wherein a first strict sub-set of the bus information lines is periodically, in terms of space, coupled with resource slot logic circuitry once per N of the individually-addressable resource blocks; wherein a second strict sub-set of the bus information lines is periodically, in terms of space, connected with resource slot logic circuitry once per N of the individually-addressable resource slots;

wherein N is greater than or equal to 2; wherein the bus information lines of the first sub-set are coupled to block logic circuitry of different resource blocks than the bus information lines of the second sub-set; wherein the different sub-sets of bus information lines are periodically connected to coupling circuits with a periodicity of N resource slots, such that each of N subsequent resource blocks has a coupling circuit connected to a different sub-set of the bus information lines; and wherein the coupling circuits are configured to provide a coupling between the bus information lines connected thereto and the logic circuitry of the resource slots.

According to another embodiment, a logic chip may have a plurality of individually addressable resource blocks, each comprising logic circuitry; a bus comprising a plurality of subsets of bus information lines; wherein a first strict subset of the bus information lines is periodically, in terms of space, connected with resource slot logic circuitry once per N of the individually addressable resource slots; wherein a second strict subset of the bus information lines is periodically connected with resource slot logic circuitry once per N of the individually addressable resource slots; wherein N is greater than or equal to 2; and wherein the bus information lines of the first subset are coupled to slot logic circuitry of different resource slots than the bus information lines of the second subset.

According to another embodiment, a method for providing a configuration information for a configurable logic chip, the configurable logic chip comprising a plurality of resource slots, wherein the method may have the steps of providing a configuration information describing a plurality of individually addressable modules, such that each of the modules has one or more resource slots; providing a configuration information describing a bus, such that the bus has a plurality of strict subsets of bus information lines, wherein the configuration information describing the bus defines that a first strict subset of the bus information lines is periodically, in terms of space, connected to resource slot logic circuitry once per N of the resource slots, wherein the configuration information describing the bus defines that a second strict subset of the bus information lines is periodically, in terms of space, connected to resource slot logic circuitry once per N of the resource slots, and wherein N is greater than or equal to 2; wherein the configuration information describing the bus defines that the bus information lines of the first subset are coupled to slot logic circuitry of different resource slots than the bus information lines of the second subset; and wherein the configuration information describing the plurality of individually addressable modules is provided such that an extension, in terms of resource slots, of an individually addressable module differs from a bus periodicity of N resource slots.

According to another embodiment, a computer program may perform the method for providing a configuration information for a configurable logic chip, the configurable logic chip comprising a plurality of resource slots, wherein the method may have the steps of providing a configuration information describing a plurality of individually addressable modules, such that each of the modules has one or more resource slots; providing a configuration information describing a bus, such that the bus has a plurality of strict subsets of bus information lines, wherein the configuration information describing the bus defines that a first strict subset of the bus information lines is periodically, in terms of space, connected to resource slot logic circuitry once per N of the resource slots, wherein the configuration information describing the bus defines that a second strict subset of the bus information lines is periodically, in terms of space, connected to resource slot logic circuitry once per N of the resource slots, and wherein N is greater than or equal to 2; wherein the configuration information describing the bus defines that the bus information lines of the first subset are coupled to slot logic circuitry of different resource slots than the bus information lines of the second subset; and wherein the configuration information describing the plurality of individually addressable modules is provided such that an extension, in terms of resource slots, of an individually addressable module differs from a bus periodicity of N resource slots.

Some embodiments according to the invention create a logic chip comprising a plurality of individually addressable resource blocks (e.g. resource slots or modules), each resource block comprising logic circuitry. The logic chip further comprises a bus. The bus comprises a plurality of bus information lines. A first of the resource blocks comprises a coupling between a first strict subset of the bus information lines and the logic circuitry of the first resource block. A second of the resource slots, which is adjacent to the first resource block, comprises a coupling between a second strict subset of the bus information lines and the logic circuitry of the second resource block. The first and second subsets comprise different bus information lines.

Further embodiments according to the invention create a chip comprising a plurality of resource slots. The chip may comprise a plurality of individually addressable modules, each of the modules comprising one or more of the resource slots. A bus comprises a plurality of bus information lines, wherein the bus comprises a plurality of strict subsets of the bus information lines. A first strict subset of the bus information lines is periodically, in terms of space, connected with resource slot logic circuitry once per N of the resource slots. A second strict subset of the bus information lines is periodically, in terms of space, connected with resource slot logic circuitry once per N of the resource slots. N is greater than or equal to two. The bus information lines of the first subset of bus information lines are coupled to slot logic circuitry of different resource slots than the bus information lines of the second subset of bus information lines. The (spatial) extension, in terms of resource slots, of an individually addressable module, which is embedded between two further individually addressable modules, differs from a bus periodicity of N resource slots.

Another embodiment according to the invention creates a logic chip comprising a plurality of separately addressable resource slots (or resource blocks), each of the resource slots (or resource blocks) comprising logic circuitry. The logic chip comprises a bus. The bus comprises a plurality of subsets of bus information lines. A first strict subset of the bus information lines is periodically, in terms of space, connected with resource slot logic circuitry once per N of the individually addressable resource slots. A second strict subset of the bus information line is periodically, in terms of space, connected with resource slot logic circuitry once per N of the individually addressable resource slots. N is greater than or equal to 2. The bus information lines of the first subset are coupled to slot logic circuitry of different resource slots than the bus information lines of the second subset.

Another embodiment comprises a method for providing a configuration information for a configurable logic chip.

Another embodiment comprises a computer program for setting up a configurable logic chip.

Some embodiments according to the invention are based on the finding that a particularly resource efficient implementation of a bus can be obtained by coupling different strict subsets of bus information lines to different individually addressable resource blocks (for example, resource slots or modules), wherein a granularity of the resource blocks is smaller than a repetition period of the different subsets of bus information lines.

For example, by providing couplings with different strict subsets of bus information lines of a bus in adjacent resource slots, it can be achieved that resource slots can be combined in a very flexible way, to obtain the functionality of a module comprising, for example, a plurality of resource slots.

For example, if a first individually addressable resource slot and a second individually addressable resource slot are combined to obtain a module comprising at least two resource slots, the module may comprise access to the bus information lines of the first strict subset, coupled to the first resource slot, and to the bus information lines of the second strict subset, coupled to the second resource slot. Thus, a module comprising two or more adjacent resource slots may, for example, have access to more of the bus information lines than a module comprising only a single one of the resource slots. Accordingly, the number of bus information lines available in a module scales (at least over a certain range) with a size of a module in terms of resource slots.

Further, a resource overhead, which would be necessitated by providing access to all of the bus information lines in all of the resource blocks or resource slots can be avoided. Nevertheless, by providing access to different subsets of the bus information lines in adjacent resource slots, a scaling of a size of modules can be used to obtain access to a desired number of bus information lines of the bus.

It has been found that in many cases, a size of a module, in terms of resource slots, scales with the number of bus information lines needed by a module. Accordingly, the concept described herein is well-adapted to the requirements of different types of modules having different module sizes.

Also, the concept described herein can be applied in logic chips comprising a plurality of modules having different module sizes, for example measured in terms of resource slots. Accordingly, a number of bus information lines, to which the modules have access, may scale with a number of resource slots used by the different modules (at least up to a module size which is identical to a periodicity-length of the bus, measured in terms of resource slots).

In some embodiments according to the invention, the bus may optionally comprise a plurality of subsets of bus information lines. A first strict subset of the bus information lines may be coupled, periodically in terms of space, with resource slot logic circuit once per N of the separately (or individually) addressable resource slots. A second strict subset of the bus information lines may be periodically connected with resource slot logic circuitry once per N of the separately (or individually) addressable resource slots. N may be greater than or equal to 2. The bus information lines of the first subset may be coupled to slot logic circuit of different resource slots than the bus information lines of the second subset. Accordingly, a highly periodic bus structure can be obtained, which facilitates an assignment of modules to the resource slots. Also, the periodicity of the bus structure allows for the usage of predefined modules.

In some embodiments, the different subsets of bus information lines are periodically connected, with a periodicity of N resource slots, to coupling circuits, such that each of N subsequent resource slots comprises a coupling circuit connected to a different subset of the bus information lines. The coupling circuits (for example in the form of a configurable switching matrix, or in the form of a hard wired signal routing structure) may be configured to provide a coupling between the bus information lines connected thereto and the logic circuitry (for example hard wired or configurable logic blocks implementing a combinatorial logic, which combinatorial logic may go beyond the functionality of a switching matrix) of the resource slots. Accordingly, it may be achieved that a module comprising N subsequent resource slots comprises a coupling with all of the bus information lines.

In an embodiment, the different subsets of bus information lines may be arranged in a spatially interleaved manner with respect to the resource slots to which the bus information lines are connected (or coupled). Spatial interleaving may result in a highly periodic bus structure. Also, a spatial interleaving may bring along the advantage that the coupling circuits in the different resource slots may be configured identically. Thus, the coupling circuits in the different resource slots may be physically identical. Accordingly, the resource slots (or the physical circuit structure of the resource slots) may be predefined before the resource slots (or resource slot configurations) are actually allocated to their physical position (e.g. to available resource slots on the logic chip).

In some embodiments, the logic chip may comprise a first module. The first module may comprise a plurality of resource slots. The resource slots of the first module may comprise separate bus coupling circuits. A coupling between a module functional circuitry of the first module (comprising the module functional circuitries of all the resource slots belonging to the module) and the bus information lines may be distributed across the resource slots of the first module, such that a coupling between the module functional circuitry and different strict subsets of the bus information lines is established in different resource slots. Accordingly, the periodic structure of the bus can be maintained and exploited.

In an embodiment, the chip may further optionally comprise a second module. The second module may comprise a plurality of resource slots. The resource slots of the second module may be addressable separately from the resource slots of the first module. A coupling between a module functional circuitry of the second module and the bus information lines may be distributed across the resource slots of the second module, such that a coupling between the module functional circuitry and different strict subsets of the bus information lines is established in different resource slots.

In some embodiments, the different resource slots may comprise functionally identical coupling circuits configured to allow for a unidirectional or bi-directional access to the bus information lines.

In some embodiments, the bus comprises m*N bus information lines. The resource slots may, for example, each comprise a coupling with subsets of m of the bus information lines. The coupling in the different resource slots may be configured such that the coupling circuits of an entirety of N adjacent resource slots allow for a coupling with all of the m*N bus information lines. In some embodiments, m may be equal to one. In other embodiments, m may be larger than 1. Also, in some embodiments m*N may be equal to a total number of bus information lines of the bus.

Accordingly, the m*N bus information lines of the bus (or the coupling with the m*N bus information lines) may be distributed equally to N adjacent resource slots.

In some embodiments, each of the bus information lines may comprise a plurality of bus line segments (which may be coupled directly or via coupling circuits). First bus line segments of the one or more bus information lines of the i-th strict subset of bus information lines may, for example, extend from the i-th resource slot to the (i+N)-th resource slot. Further, second bus line segments of the one or more bus information lines of i-th strict subset extend from the (i+N)-th resource slot to the (i+2N)-th resource slot. Further, third bus line segments of the one or more bus information lines of the i-th strict subset may (optionally) extend from the (i+2N)-th resource slot to the (i+3N)-th resource slot. For example, $1 \leq i \leq N$.

Accordingly, a highly regular structure of the bus lines may be obtained. Also, individual bus lines may be divided into segments, which segments may be connected, for example, via the coupling circuits in the resource slots.

Optionally, the first bus line segments of the i-th strict subset may be unconnected, i.e., not connected to any coupling circuit, between the i-th resource slot and the (i+N)-th resource slot, wherein $1 \leq i \leq N$.

In other words, the bus lines segments may provide direct connections between remote resource slots. Accordingly, a propagation delay of the bus lines can be minimized in that the bus line segments are not connected (or coupled) to each resource slot (or to logic circuitry of each resource slot).

Optionally, ends of the one or more first bus line segments of the i-th strict subset may be connected with ends of the corresponding one or more second bus line segments of the i-th strict subset via a coupling circuit arranged in the (i+N)-th resource slot. Accordingly, the resource slots have (full) access to the bus line segments using the coupling circuits and can decide whether data originating from the first bus line segments are routed through to the second bus line segments, or are replaced by data provided by the respective resource slot, or are amended in accordance with date provided by the respective resource slot. Thus, it is under the control of the resource slot whether a read access, a write access or a read/write access or a read/modify/write access is performed with respect to the bus information lines.

In some embodiments, the coupling circuits of different resource slots, for coupling different strict subsets of the bus information lines with the logic circuitry of different resource slots, comprise identical interface specifications with respect to the bus information lines. In other words, the coupling circuits can be physically identical. Accordingly, a predefined resource block circuitry can be assigned to an arbitrary one of the resource slots.

In some embodiments, the bus information lines are routed such that a given coupling circuit structure, comprising given interface definitions, provides access to a first subset of the bus information lines when applied in a first one of the resource slots and provides access to the second subset of bus information lines when applied in a second one of the resource slots.

In some embodiments, a re-configurable select generator may be applied.

For example, the logic chip may optionally comprise an addressable module. The module may comprise at least one of the resource slots. The module may further comprise a re-configurable select generator. The re-configurable select generator may comprise a chain of flip-flops forming a shift register. A logic chip may be configured to initialize the chain of flip-flops with a sequence of initialization values. The logic chip may further be configured to shift a configuration word into the chain of flip-flops subsequent to an initialization of the chain of flip-flops. A trailing value of the configuration word may be different from the initialization value. The select generator may be configured to lock the chain of flip-flops, to avoid a further shift operation, in response to the trailing value of the configuration word reaching an end flip-flop of the chain of flip-flops. The re-configurable select generator may be further configurable to provide a select signal for the module in dependence on an address information and a configuration word stored in the chain of flip-flops.

Accordingly, in some embodiments a particularly efficient configuration of individual modules may be obtained. For example, using the above described re-configurable select generator, it can be achieved that the configuration procedure is automatically terminated as soon as the configuration word is entered completely into the chain of flip-flops. Also, it is even possible to connect the inputs of re-configurable select generators of different modules to the same configuration line. For example, if it is ensured that a first module is configured before the initialization generator of a second module is programmed to the initialization value, the re-configurable select generator of the first module is no longer affected by a shifting of a configuration word into the re-configurable select generator of the second module, even if the data input and the clock inputs of the re-configurable select generators of the different modules are connected to a common data line and a common clock line.

Optionally, the re-configurable select generator may comprise a multiplexer configured to select, in dependence on the address information, one of the binary values out of the plurality of binary values stored in the chain of flip-flops, to obtain the select signal for the module. Accordingly, the individual bits or binary values stored in the chain of flip-flops indicate, whether the modules comprising the re-configurable select generator should be addressed for different values of the address information. Accordingly, it can obtained, by an appropriate programming of the binary values stored in the chain of flip-flops, that the module is selected for a plurality of different values of the address information. Thus, a group communication features and a group trigger features can be implemented.

Some embodiments according to the invention may optionally comprise an advantageous concept for an association of bus lines.

For example, the logic chip may optionally comprise a bus master, a mapping circuit and a plurality of modules. The bus master may comprise a plurality of bus master information lines, to provide information to the modules, or to receive information from the modules. Each of the modules may comprise one or more resource slots, wherein adjacent resource slots comprise couplings with different strict subsets of the bus information lines. The mapping circuit may be configured to couple different subsets of the bus master information lines to different subsets of the bus information lines in dependence on a module position information describing a position of a currently addressed module.

The given concept may allow for a compensation of an actual position of a module under the assumption that a module can be placed in different positions. For example, if is assumed that a module can be placed in different positions, a leftmost slot of the module may be coupled with different subsets of the bus information lines in dependence on the position of the module. For example, if a given module is placed at a first position, the leftmost resource slot of the given module may be coupled with a first subset of the bus information lines. In contrast, if the module is placed differently, a leftmost resource slot of the given module may be coupled with another subset of the bus information lines, for example with a second subset of the bus information lines. Assuming, however, that the module will expect a certain portion of data at the leftmost module (for example, data having a predetermined weight, like, for example, least significant bits or most significant bits).

Accordingly, the mapping circuit may be configured to map the information, which is expected by the leftmost resource slot of the module, to the subset of bus information lines coupled to the leftmost slot of the module. Nevertheless, as the subset of bus information lines coupled to the leftmost resource slot of the modules varies with (or depends on) the actual position of the given module, a mapper is configured to adjust the mapping in dependence on the actual position of the given module.

Optionally, the logic chip may comprise a resource slot manager configured to allocate modules to available resource slots. The resource slot manager may be configured to set up a programmable logic of one or more resource slots in dependence on an information describing a module, in order to allocate a module to an available resource slot. Accordingly, the mapping circuit may, for example, cooperate with the resource slot manager, in that the resource slot manager provides the module position information used by the mapping circuit. Although, the combination of the mapping circuit and the resource slot manager allows for a dynamic allocation of modules with a granularity that is smaller than a repetition length (in terms of resource slots) of the bus information lines.

In an embodiment, the resource slot manager may be configured to decide, on the basis of a content of the available resource slots, to which of the resource slots a module to be added is to be allocated.

Optionally, the slot manager may be configured such that a granularity with respect to an allocation of modules to available resource slots is smaller than N resource slots, wherein a coupling between the different subsets of bus information lines and the resource slots comprises a spatial periodicity length of N resource slots.

Some embodiments according to the invention may optionally comprise a two dimensional mesh of resource slots. For example, the logic chip may comprise a two dimensional mesh of resource slots.

The bus may, for example, comprise I different subsets of bus information lines. Each of the resource slots may comprise a coupling circuit configured to couple a functional circuitry of the resource slot with one of the subsets of the bus information lines. The coupling circuits may be configured such that I adjacent resource slots arranged along a first direction in the mesh of resource slots comprise, via their coupling circuits, a coupling with I different subsets of bus information lines.

In an alternative embodiment, the logic chip may comprise a two dimensional mesh of resource slots, wherein the bus comprises I different subsets of bus information lines. Each of the resource slots may comprise a coupling circuit configured to couple a functional circuitry of the resource slots with one of the subsets of bus information lines. The coupling circuits may be configured such that a sequence of different subsets of the bus information lines, to which adjacent to resource slots of a first row of resource slots are coupled via corresponding coupling circuits, is spatially shifted with respect to a sequence of different subsets of the bus information lines, to which adjacent recourse slots of a second row of resource slots are coupled via corresponding coupling circuits.

The coupling circuits may also be configured such that a sequence of different subsets of the bus information lines, to which adjacent resource slots of a second column of the resource slots are coupled via corresponding coupling circuits, is spatially shifted with respect to a sequence of different subsets of the bus information lines, to which adjacent resource slots of a second column of resource slots are coupled via corresponding coupling circuits.

Accordingly, a number of different subsets of bus information lines, to which a module is coupled, may be determined both by an extension of the module in a first direction and by an extension of the module in a second direction. Accordingly, it can be achieved that modules of different shape can be used, for example elongate modules or compact (square-shaped or near-square-shaped) modules.

In an embodiment, the logic chip comprises a two dimensional mesh of resource slots and at least a first module and a second module. The first module comprises a larger number of contiguous resource slots than the second module. The first module is coupled with a larger number of bus information lines than the second module.

In other words, using a two dimensional mesh of resource slots, it can be achieved that the number of bus information lines, to which a module can be coupled, scales with a size of the module, in terms of contiguous resource slots.

BRIEF DESCRIPTION OF THE DRAWINGS

Embodiments according to the invention will subsequently be described taking reference to the enclosed FIGS., in which:

FIGS. 2a to 2f show block schematic representations of different configurations of the logic chips according to embodiments of the invention;

FIG. 3b shows a graphical representation of a relationship between a module identification, a module position information and a module address;

FIG. 3c shows a table representing a relationship between a module position information and a subset of the bus information lines coupled to a reference resource slot of the module;

FIG. 4b shows a graphical representation of a relationship between a module identification, a module position information and a module address;

FIG. 5 shows a graphical representation of a mapping between bus master information lines and subset of bus information lines in dependence on the module position information;

FIG. 6 shows a block schematic diagram of a logic chip, comprising a two-dimensional array of resource slots;

FIG. 22a shows a schematic diagram of an example of a traditional FPGA-based system on chip (SoC);

FIG. 22b shows a block schematic diagram of an alternative system that allows exchanging reconfigurable master or slave modules through partial reconfiguration in order to share reconfigurable resource slots over the time;

FIG. 23 shows a block schematic diagram of an example of a system consisting of a master and two slave modules communicating through a bus;

FIG. 24 shows a table describing a classification of bus signals taking reference also to FIG. 23;

DETAILED DESCRIPTION OF THE INVENTION

Embodiments according to the invention will subsequently be described taking reference to the enclosed FIGS.

Figure 1:
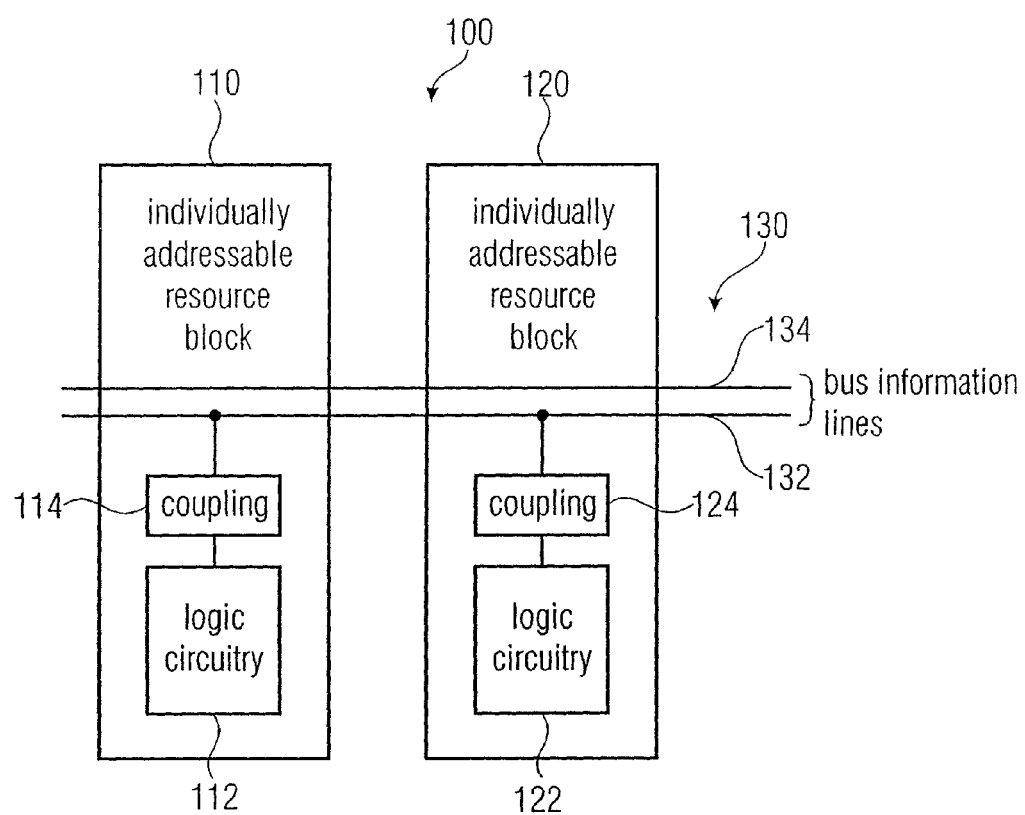
FIG. 1 shows a block schematic diagram of a logic chip, according to an embodiment of the invention.

FIG. 1 shows a block schematic diagram of a logic chip, according to an embodiment of the invention. The logic chip is designed in its entirety with 100. The logic chip comprises a plurality of individually-addressable resource blocks (or resource slots), for example, a first individually-addressable resource block 110 and a second individually-addressable resource block 120. Each of the individually-addressable resource blocks comprises logic circuitry 112, 122.

It should be noted that the individually-addressable resource blocks may, for example, be individually-addressable resource slots. Alternatively, the individually-addressable resource blocks may be modules, wherein a module may comprise a plurality of resource slots. However, a mixed configuration may be used, wherein the first individually-addressable resource block may be an individually-addressable resource slot, and wherein the second individually-addressable resource block 120 may be an individually-addressable resource module.

The logic chip 110 further comprises a bus 130. The bus 130 may, for example, comprise a plurality of bus information lines. For example, the bus may be a data bus. In this case, the bus may comprise a plurality of data lines, which may be considered as bus information lines. In contrast, any control lines (for example, for the activation of the individually-addressable resource blocks), are not considered as bus information lines, but are considered as control signals. In other words, the bus management lines (like selection lines, addressing lines enable lines, and the like) are not considered as bus information lines in some embodiments.

To summarize the above, the bus information lines of the bus 130 carry a useful information to be processed by the individually-addressable resource blocks 110, 120, or a useful information provided by one or more of the individually-addressable resource blocks 110, 120.

Generally speaking, the bus information lines are lines which are shared by a plurality of resource blocks, rather than individual lines.

The first resource block 110 comprises a coupling 114 between a first strict sub-set 132 of the bus information lines and the logic circuitry 112 of the first resource block 110. Further, the second resource block 120 comprises a coupling 124 between the second strict sub-set 134 of the bus information lines and the logic circuitry 122 of the second resource block 120. The first and second sub-sets 132, 134 of bus information lines comprise different bus lines.

To summarize the above, in the embodiment shown in FIG. 1, different individually-addressable resource blocks 110, 112 have couplings 114, 124 with different sub-sets 132, 134 of the bus information lines.

Using the logic chip 100, it is possible to apply a particularly-flexible placing of the individually-addressable resource blocks. For example, in different individually-addressable resource blocks, couplings with different sub-sets of the bus information lines are available. Accordingly, different sub-sets of a total information content carried by the bus information lines are available in the individually-addressable resource blocks via the couplings 114, 124. Thus, a circuit overhead for the coupling circuit per individually-addressable resource block is kept sufficiently small. Further, by combining a plurality of individually-addressable resource blocks, access to more than one of the sub-sets of the bus information lines is obtained. Accordingly, with an increasing number of combined individually-addressable resource blocks, an increasingly larger portion of the total information carried by the bus information lines is made available.

Further details will be described in the following.

However, it should be noted that an individually-addressable resource block is individually-addressable for an access to the bus 130. For example, an individually-addressable resource block may comprise an individual selection determinator or an individual bus access select input.

Alternatively, in some embodiments, an individually-addressable resource block may be a resource block, which is individually re-programmable, for example, independently from other adjacent resource blocks. For example, in some field programmable gate arrays, there are regions, which are adapted to be configured as a whole. For example, in some FPGAs there is the need to erase (or initialize) a certain region as a whole when a re-configuration is desired. Such a region, which is configured to be (necessarily) erased or initialized as a whole, may be considered as an individually-addressable resource block in some embodiments.

Taking reference to FIGS. 2a to 2f, different configurations of a logic chip will be described.

FIGS. 2a to 2f show block schematic diagrams representing different configurations of a logic chip, for example of the logic chip 100.

A first possible configuration is shown in FIG. 2a. The configuration shown in FIG. 2a is designated in its entirety with 200. The logic chip, the configuration of which is shown in FIG. 2a, comprises a plurality of resource slots 204a to 204h. Moreover, it is assumed that the logic chip comprises a bus 206, which bus comprises four sub-sets 206a to 206d of bus information lines. The resource slots 204a to 204h may, for example, be arranged side-by-side in a linear way. The bus information lines may further extend across the resource slots 204a to 204h, as shown in FIG. 2a. Moreover, there may be periodic couplings between the resource slots 204a to 204h and the sub-sets of bus information lines 206a to 206d. For example, the first resource slot 204a may comprise a coupling 208a with the first sub-set 206a of bus information lines, the second resource slot 204b may comprise a coupling with the second sub-set 206b of bus information lines, the third resource slot 204c may comprise a coupling 208c with the third sub-set 206c of bus information lines, the fourth resource slots 204d may comprise a coupling 208d with the fourth sub-set 206d of bus information lines and the fifth resource slot may comprise a coupling 208e with the first sub-set 206a of bus information lines. Further, the sixth, seventh and eighth resource slots 204f, 204g and 204h may comprise couplings 208f, 208g, 208h with the second, third and fourth sub-sets 206b, 206c, 206d of bus information lines, as shown in FIG. 2a. As mentioned above, the resource slots 204a to 204h may, for example, be individually-reconfigurable blocks comprising logic circuitry (wherein a switch matrix may be used for implementing the coupling, possibly in combination with a part of the logic circuitry). Alternatively, the resource slots 204a to 204h may be spatially delimited blocks of logic circuitry in an application-specific integrated circuit (ASIC).

In the configuration shown in FIG. 2a, the resource slots 204a, 204b and 204c may be grouped together to form a first module 212a. Similarly, the resource slots 204d and 204e may be grouped together to form a second module 212b. Optionally, the resource slot 204f may form a single-resource-slot module 212c. The other resource slots 204g and 204h may, for example, form one-resource slot modules or may be part of other larger modules.

For example, the first module 212a may be a first individually-addressable resource block. Accordingly, the first module 212a may comprise a single bus access addressing circuit. Similarly, the second module 212b may be an individually-addressable resource block and may, for example, comprise a single bus access addressing circuit. For example, the connections 208a, 208b, 208c of the resource slots 204a, 204b, 204c may be addressed or activated jointly if the first module 212a is addressed. Similarly, the coupling 208d, 208e may be activated jointly if the second module 212b is addressed. Thus, if the first module 212a is addressed, the resource slots 204a, 204b, 204c may comprise a simultaneous coupling with the first sub-set 206a, the second sub-set 206b and the third sub-set 206c of the bus information lines. Accordingly, the first module 212a may comprise a simultaneous access to three out of four sub-sets of the bus information lines.

Similarly, when the second module 212b is addressed, the second module 212b may comprise a simultaneous access to the fourth sub-set 206d and the first sub-set 206a of the bus information lines. Accordingly, the second module may comprise, when addressed, a simultaneous access to two out of four sub-sets of the bus information lines. The optional third module 212c may comprise, when addressed, an access to one of the four sub-sets of the bus information lines, namely the second sub-set 260b.

As can be seen, the number of sub-sets of the bus information lines, to which the modules 212a, 212b, 212c have access, varies with the size of the module. For example, the first module 212a, which comprises three resource slots 204a, 204b, 204c, has access to three sub-sets of bus information lines, while the second module 212b, which only comprises two resource slots 204d, 204e, comprise access to only two sub-sets of the bus information lines. Finally, the third module 212e, which comprises only a single resource slot 204f, comprises only access to a single sub-set of the bus information lines.

In total, the first module 212a comprises access to a different first total sub-set of bus information lines (comprising the first, second and third sub-sets of bus information lines) when compared to the second module, which second module comprises access to a second total sub-set of bus information lines. The second total sub-set of bus information lines comprises the first sub-set of bus information lines and the fourth sub-set of bus information lines.

In the following, different possible configurations will be shown taking reference to FIGS. 2b to 2f. However, identical means will be designed with identical reference numerals.

The configuration shown in FIG. 2b is designated in its entirely with 220. The configuration 220 comprises a first module 222a, and a second module 222b. The first module 222a comprises four adjacent resource slots 204a to 204d. Also, the first module 222a comprises couplings 208a to 208d with all four sub-sets 206a to 206d of bus information lines. In contrast, the second module 222b comprises resource slots 204e and 204f, and only comprises couplings 208e, 208f with two of the sub-sets 206a, 206b of bus information lines.

FIG. 2c shows a third configuration, which is designated in its entirety with 230. The third configuration 230 comprises a first module 232a and a second module 232b. The first module 232a comprises five resource slots 204a to 204e. However, if it is assumed that there are only four sub-sets of bus information lines, it may be sufficient that the first module 232a comprises only four couplings 208a to 208d. Accordingly, the coupling 208e may be considered as optional.

The second module 232b comprises the resource slots 204f and 204g, and couplings 208f, 208g with two of the sub-sets of bus information lines.

Further configurations can be seen in FIGS. 2d, 2e and 2f. As can be seen, the width of two adjacent modules can vary. The width of the adjacent modules (in terms of resource slots) can be smaller than the number of sub-sets of bus information lines, equal to the number of information lines or larger than the number of bus information lines.

A, configuration 240 shown in FIG. 2d comprises a first module 242a and a second module 242d, a configuration 250 shown in FIG. 2e comprises a first module 252a and a second module 252d, and a configuration 260 shown in FIG. 2f comprises a first module 262a and a second module 262d.

Figure 3A:
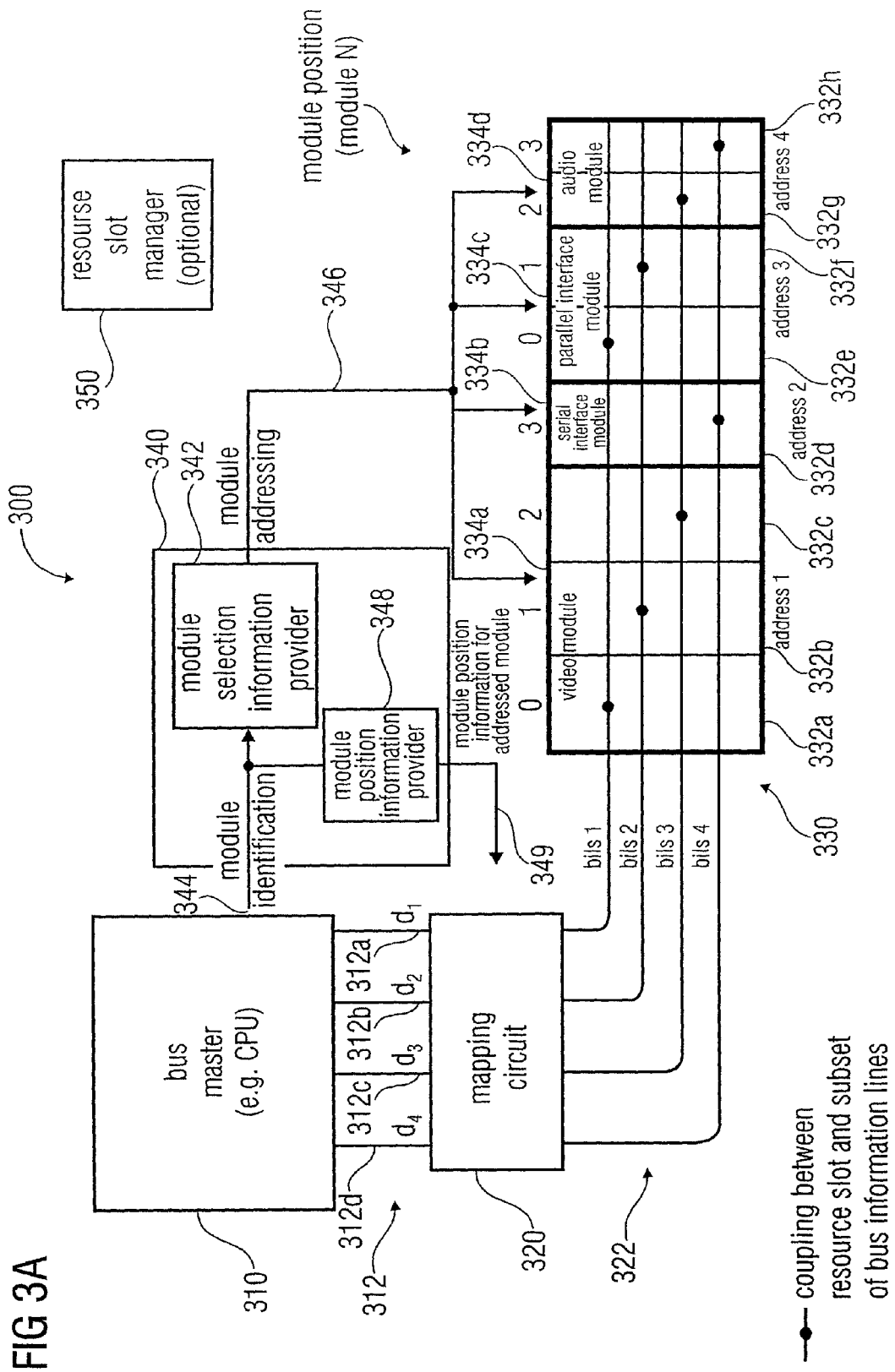
FIG. 3a shows a block schematic diagram of a logic chip, according to an embodiment of the invention.

In the following, a system will be described taking reference to FIG. 3a. FIG. 3a shows a block schematic diagram of a logic circuit (which will be arranged on a logic chip), according to an embodiment of the invention. The logic circuit shown in FIG. 3a is designated in its entirety with 300. The logic circuit 300 comprises a bus master 310, a mapping circuit 320, a resource slot component or module component 330. Further, the circuit 300 comprises a control circuitry 340 and an optional resource slot manager or module manager 350.

The bus master 310, which may comprise, for example, a central processing unit (CPU), is configured to communicate with a plurality of modules of the resource slot component or module component 330 using a plurality of bus master information lines 312, which are coupled to a bus 322 using the mapping circuit 320.

In some embodiments, the bus-master may optionally be located off-chip (for example as an external CPU). In this case, the logic chip may comprise a bus master connection instead of the bus master itself.

In some embodiments, the bus master may optionally be located within the reconfigurable resource slots.

The bus master information lines may, for example, comprise a plurality of different sub-sets 312a, 213b, 312c, 312d of bus master lines. Furthermore, the bus 322 may comprise different sub-sets BILS1, BILS2, BILS3, BILS4 of bus information lines. In some embodiments, there may be a variable one-to-one association between the bus master information lines 312 a to 312d and the sub-sets BILS1 to BILS4 of the bus information lines, which adjustable one-to-one association may be adjusted using the mapping circuit 320.

For example, assuming that the busses 312, 322 are dataline busses, the first sub-set 312a of the bus master information lines may comprise data lines D0 to D3 (carrying data bits having the weight 1, 2, 4 and 8). The second sub-set 312b of the bus master information lines may, for example, comprise data lines D4 to D7 (carrying bits having the weights of 16, 32, 64 and 128). The third sub-set 312c of the boost master information lines may comprise data lines D8 to D11, and the fourth sub-set 312d of the bus master information lines may comprise data lines D12 to D15. However, other allocations are naturally possible. For example, the first sub-set 312a of the bus master information lines may comprise data lines D0, D4, D8 and D12, while the second sub-set 312d comprises data lines D1, D5, D9 and D13, and so on. Naturally, a 16-bit data bus should be considered as an example only. Data busses of other bus widths can naturally also be used. Also, the bus master information lines 312 and the bus 322 could represent an address bus, rather than a data bus. Also, the bus master information lines and the bus 322 could represent a complex bus, comprising different types of bus information lines, like, for example, a combination of data lines and address lines.

The resource slot portion or module portion may comprise a plurality of resource slots 322a to 322h. The resource slots 322a to 322h are allocated to a plurality of modules, which modules may be considered as individually-addressable resource blocks. For example, a first module, for example a video module 344a, comprises three resource slots 322a, 322b, 322c. A second module 334b, for example, a serial interface module, comprises the fourth resource slot 332d. A third module, for example, a parallel interface module 334c, comprises the fifth resource slot 332e and the sixth resource slot 322f. A fourth module, for example, an audio module, 334d comprises the seventh resource slot 332g and the eighth resource slot 332h. The different modules 334a, 334b, 334c, 334d are individually-addressable. Moreover, the different resource slots comprise couplings to the different sub-sets BILS1 to BILS4 of the bus information lines. For example, the first resource slot 332 is coupled to the first sub-set BILS1 of bus information lines, while the second resource slot 332b is coupled to the second sub-set BILS2 of the bit information lines. The third resource slot 332c is coupled to the third sub-set BILS3, the fourth resource slot 332d is coupled to the fourth sub-set BILS4, the fifth resource slot is coupled to the first sub-set BILS1, the sixth resource slot is coupled to the second sub-set BILS2, the seventh resource slot is coupled to the third sub-set BILS3 and the eighth resource slot is coupled to the fourth sub-set BILS4. Accordingly, there is a periodic coupling of different resource slots to different sub-sets of the bus information lines.

Moreover, it should be noted that position numbers can be associated with the resource slots. For example, the position number 0 can be associated with the first resource slot 332a, the position number 1 can be associated with the second resource slot 332d, the position number 2 can be associated with the third resource slot 332c, the position number 3 can be associated with the fourth resource slot 332d, the position number 4 can be associated with the fifth resource slot 332e, and so on. In other words, the position number (i−1) can be associated with the i-th resource slot. If a periodicity length, in terms of resource slots, of a coupling between sub-sets of bus information lines and resource slots is equal to N, a number obtained as a modulo-N value of the position number describes with which sub-set of bus information lines a certain resource slot is coupled. As can be seen from FIG. 3a, the resource slots 332a to 332h are associated in ascending order with modulo position numbers 0, 1, 2, 3, 0, 1, 2 and 3. In other words, the first resource slot 332a and the fifth resource slot 332e both comprise modulo-four position numbers of 0, indicating that both the first resource slot 332a and the fifth resource slot 332e are coupled to the first sub-set of bus information lines. Similarly, the second resource slot 332b and the sixth resource slot 332f both comprise identical modulo position numbers of 1, and are both coupled to the second sub-set of bus information lines. Similar conditions also apply to the other resource slots, as can be seen from FIG. 3a.

In the following, the addressing of the individual modules (for example, the video module, the serial interface module, the parallel interface module and the audio module) will be described. This addressing is obtained using the control circuit 340. For example, the control circuit 340 comprises a module selection information provider 342, which may be configured to receive a module identification information 344 from the bus master 310 and to provide a module-addressing information 346 (for example, in the form of one or more common or separate signals) to the modules 334a, 334b, 334c, 334d. For example, the module identification information 344 may describe, in an abstract form, which module is to be accessed by the bus master 310. For example, the module identification information 344 may indicate that the video module, the serial interface module, the parallel interface module or the audio module should be addressed (or accessed). The module selection information provider 342 may map this information to the selection information 346, for example, using a knowledge where (in which slots) the specific modules are located or which physical addresses are associated to the different modules.

For example, an increasing sequence of addresses may be allocated to the different modules in the order of their physical arrangement in the resource slots. Accordingly, the video module, arranged in the resource slots 332a to 332c, may comprise a first address value, the serial interface module may comprise a second address value, the parallel interface module may comprise a third address value and the audio module may comprise a fourth address value. Alternatively, the module selection information provider 342 may apply a knowledge about a physical arrangement of the module to decide, to which of the resource slots enable signals should be forwarded.

In other words, many different concepts can be used to address the individual modules.

For example, an address-lookup (ADR lookup) may be executed to switch the alignment multiplexer (also designated as "Mapping circuit").

In some embodiments, an additional address comparison (ADR comparison) may be executed (or may take place) within the resource slots themselves.

Moreover, the control circuit 340 also comprises a module position information provider 348, which is configured to receive the module identification information 344 and to control the mapping circuit 320. Details regarding the functionality of the mapping 320 will be subsequently described.

FIG. 3b shows a graphical representation of a relationship between a module identification, a module position information and a module address. The module identification describes a logical "name" of the module, by which the module is referenced by the bus master 310. For example, symbolic names may be associated to the modules, which can be represented, as usual, by a numeric value. As the module address may be unique in some embodiments, it can optionally be used as the numeric value representing the symbolic name. In the present example, the following modules are available: Video module, serial interface module, parallel interface module, audio module. Further, model positioning information is available for each of the modules. The module position information may, for example, describe a position of respective reference resource slots, for example left-most resource slots, of the different modules.

If, for example, the resource slots are designated in ascending order, the module's left-most resource slot may designate the resource slot of the module having the smallest resource slot number. For example, the left-most resource slot of the video module comprises resource slot number 0, the left-most (and only) resource slot of the serial interface module comprises resource slot number 3, the left-most resource slot of the parallel interface module comprises resource slot number 4 and the left-most resource slot of the audio model comprises resource slot number 6. The modulo-4 module position for the different modules is shown in FIG. 3b. The video module comprises a modulo-4 module position of 0, the serial interface model comprises a modulo-4 position of 3, the parallel interface module comprises a modulo-4 module position of 0 and the audio model comprises a modulo 4 module position of 2.

Further, module addresses are associated to different modules in ascending order, as shown in FIG. 3b.

Furthermore, a relationship between the modulo-4 module position (generally: an information describing which subset of the bus information lines is coupled to the reference resource slot of the module) and the sub-set of the bit information lines coupled to a reference resource slot of a module (e.g. to a left-most resource slot of the module) is shown in FIG. 3c. If a module comprises a modulo-4 module position of 0, the sub-set BILS1 of the bus information lines is coupled to the reference resource slot of the module. If a module comprises a modulo-4 module position of 1, the sub-set BILS2 of bus information lines is coupled to the reference resource slot of the module, and so on.

Figure 4A:
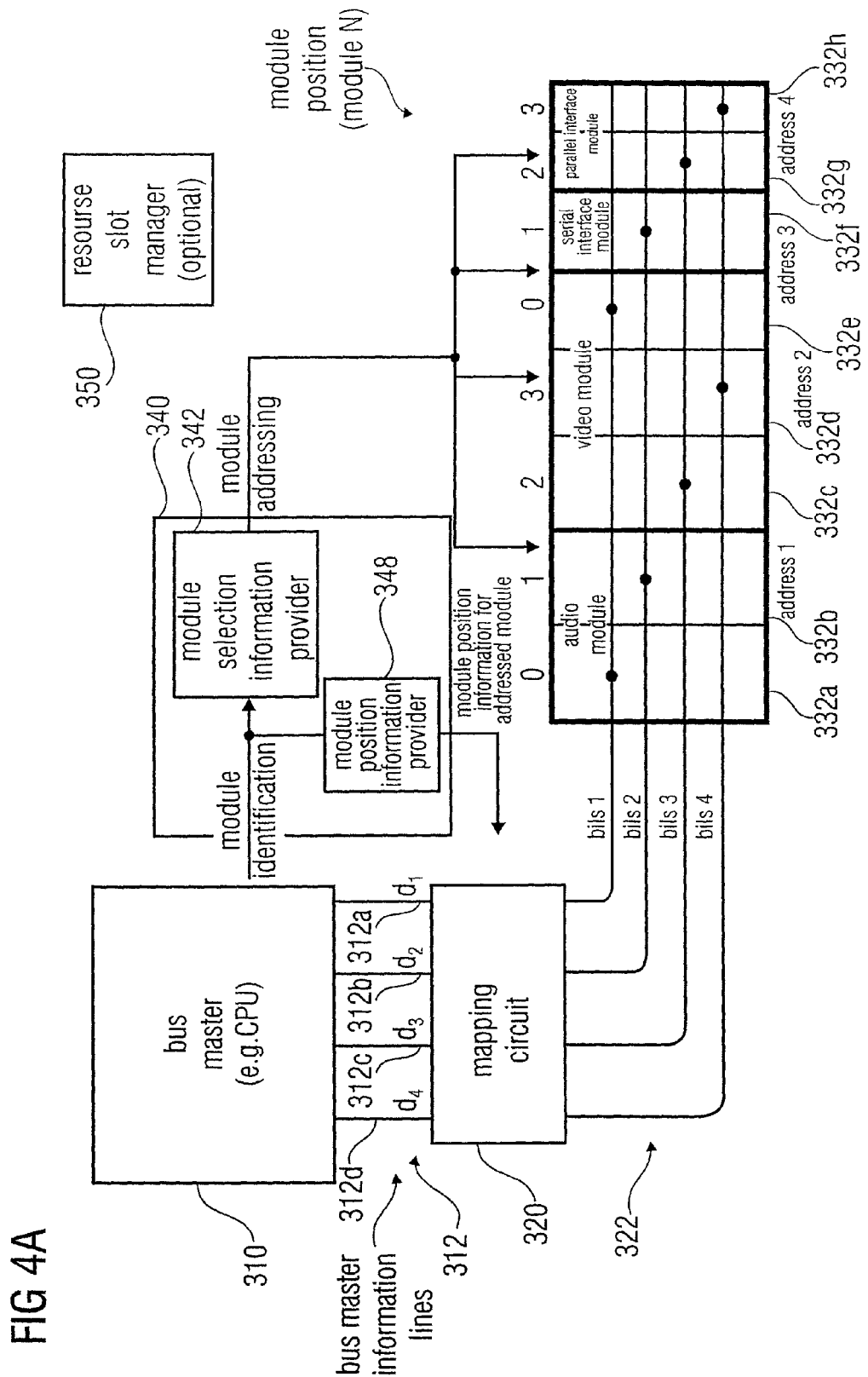
FIG. 4a shows a block schematic diagram of a logic chip, according to an embodiment of the invention.

In order to facilitate the understanding, another possible configuration is shown in FIG. 4a. It should be noted that the configuration shown in FIG. 4a is very similar to the configuration shown in FIG. 3a, such that identical reference numerals are used for identical means and signals. However, in the configuration shown in FIG. 4a, the audio module is allocated to the first and second resource slot 332a, 332b. The video module is associated to the third, fourth and fifth resource slot 332c, 332d, 332e. The serial interface module is allocated to the sixth resource slot 332f and the parallel interface module is allocated to the seventh and eighth resource slots 332g, 332h.

In other words, the allocation of the different modules to the resource slots of the configuration shown in FIG. 4a differs from the allocation of the configuration shown in FIG. 3a.

FIG. 4b describes the module left-most resource slot, the modulo-4 module position and the module address of the different modules.

Taking reference to FIGS. 3a and 4a, it can be seen that the present concept allows for a flexible placement of the different modules with respect to the resource slots. However, depending on the actual configuration, the coupling between the different modules and the bus information lines (or subsets of bus information lines) varies in dependence on the actual configuration.

For example, if the video module is placed as shown in FIG. 3a, the leftmost resource slot of the video module is coupled to the first subset of bus information lines. If, however, the video module is placed as shown in FIG. 4a, the leftmost resource slot of the video module is coupled to the third subset of bus information lines. In view of this situation, the mapping circuit may provide, in combination with the module position information provider 348, for a mapping between these master information lines and the bus information lines, such that the leftmost resource slot of the video module (or a predetermined reference slot of the video module) is coupled to a predetermined subset of the bus master information lines, irrespective of the actual location of the video module.

For example, the mapping circuit 320 may effect, in combination with the module position information provider 348, a mapping as described in FIG. 5. For example, if the modulo-4 module position information for an addressed module, which is provided by the module position information provider 348 to the mapping circuit 320, indicates that the modulo-4 module position of the addressed module is 0, the mapping circuit 320 may provide the following connections between subsets d1, d2, d3, d4 of bus master information lines and subsets bils1, bils2, bils3, bils4 of the bus information lines:
d1-bils1;
d2-bils2;
d3-bils3; and
d4-bils4.

If however, the modulo-4 module position information indicates that the modulo-4 position of the addressed module is 1, the following connections may be established:
d1-bils2;
d2-bils3;
d3-bils4; and
d4-bils1.

Connections established by the mapping circuit 320 for the modulo-4 module position information of 2 and 3 can be seen from FIG. 5.

To summarize the above, the module position information provider 348 may provide the information 349 describing the position of a characteristic resource slot of a currently addressed module with respect to a physical periodicity of the bus 320. The mapping circuit 320 may apply this information 349 to adjust the mapping (for example in the form of a connection or a coupling) between subsets of bus master information lines and subsets of bus information lines. Accordingly it can be achieved that the predetermined slot of a module (predetermined with respect to the boundaries of the module) is coupled with an identical subset of the bus master information line irrespective of the actual placement of the module, even though the predetermined slot of the module is coupled with different subsets of the bus information lines in dependence on the placement of the module.

In the example as shown in FIG. 3a, the video module is placed such that the left most slot of the video module is coupled to bils1, and bils1 is coupled to d1 if the video module is addressed. The middle slot of the video module is coupled to bils2, and bils2 is coupled to d2 if the video module is addressed. The right most slot of the video module is coupled to bils3, and bils3 is coupled to d3, if the video module is addressed. Actually, in the configuration of FIG. 3a, the left most slot of the video module is coupled to d1, the middle slot of the video module is coupled to d2 and the right slot of the video module is coupled to d3.

In the configuration of FIG. 4a, the left most slot of the video module is coupled to bils3, and bils3 is coupled to d1 if the video module is addressed. Effectively, the left most slot of the video module is again coupled to d1 if the video module is addressed. Similarly, the middle slot of the video module is coupled to bils4, and bils4 is coupled to d2 if the video module is addressed. Effectively, the middle slot of the video module is coupled to d2 if the video module is addressed. The right slot of the video module is coupled to bils1, and bils1 is coupled to d3 if the video module is addressed. Effectively, the right slot of the video module is coupled to d3, if the video module is addressed.

Similarly, in the configuration of FIG. 3a, the serial interface module is coupled to bils4. bils4 is coupled to d1 if the serial interface module is addressed, as the modulo-4 module position information of the serial interface module is equal to 3 in the configuration shown in FIG. 3a. Accordingly, the serial interface module is effectively coupled to d1, if the serial interface module is addressed.

Similarly, in the configuration of FIG. 4a, the serial interface module is coupled to bils2. If the serial interface module comprises a modulo-4 module position of 1 in the configuration shown in FIG. 4a, bils2 is connected to d1 if the serial interface module is addressed. Accordingly, the serial interface module is effectively coupled to d1, even in the configuration of FIG. 4a.

To summarize the above, the mapping between the subsets of the bus information lines and subsets of the bus master information lines is performed in dependence on the modulo-4 module position information of the currently addressed module (generally: in dependence indicating to which of the subsets of the bus information lines a reference slot of a currently addressed module is coupled). The modulo-4 module position information for the currently addressed module provided by the module position provider in dependence on the module identification information designating the currently addressed modules.

In some embodiments, the modules are pre-assigned to resource slots. However, in some other embodiments, a dynamic allocation (or even a re-allocation) may be performed by the resource slot manager 350. For example, if a requirement information indicates a change of the system requirements, a module may be added to a free resource slot. Alternatively, a module may be removed from the resource slots, if it is indicated that the module is no longer needed. Naturally, one module may be replaced by a different module, if desired. In any case, the resource slot manager may decide about the configuration. Also, the resource slot manager may naturally update the information available to the module position information provider 348, such that the module position information provider can continuously provide a correct modulo-4 module position information to the mapping circuit 320.

In the following, an optional extension of the concept described herein will be discussed taking reference to FIG. 6. FIG. 6 shows a schematic representation of a 2-dimensional array of resource slots. The 2-dimensional array of resource slots is designated in its entirety with 600. As can be seen, the 2-dimensional array of resource slots comprises a plurality of lines 610a to 610f of resource slots and a plurality of columns 612a to 612f of resource slots. As can be seen, the different resource slots may comprise couplings with different subsets of bus information lines. For example, assuming that a bus comprises four different subsets of bus information lines, it can be assumed that there are four different types of resource slots, wherein a first type of resource slot comprises a coupling with a first subset of the bus information lines, wherein a second type of resource slot comprises a coupling with a second subset of bus information lines, wherein a third type of resource slot comprises a coupling with a third subset of bus information lines, and wherein a fourth type of resource slot comprises a coupling with a fourth subset of bus information lines.

As can be seen from FIG. 6, each of the resource slots of the array of 36 resource slots comprises a label "bils1" or "bils2" or "bils3" or bils4", which indicates, to which subset of the bus information lines the resource slot (or the logic circuitry thereof) is coupled.

As can be seen from FIG. 6, a first line 610a of the array of resource slots comprises a sequence of couplings with different subsets of the bus information lines. Also, a second row 610b comprises a sequence of couplings with different subsets of the bus information lines. However, the sequence of couplings with different bus information lines in adjacent rows (for example in rows 610a, 610b) is shifted.

Similarly, sequences of couplings with different subsets of the bus information lines are shifted in adjacent columns, as can be seen in FIG. 6.

In the following, further details regarding a 2-dimensional arrangement will be described.

Moreover, it should be noted that the concept described with reference to FIGS. 3a and 4a can also be applied in a case of a 2-dimensional array of resource slots.

Figure 43:
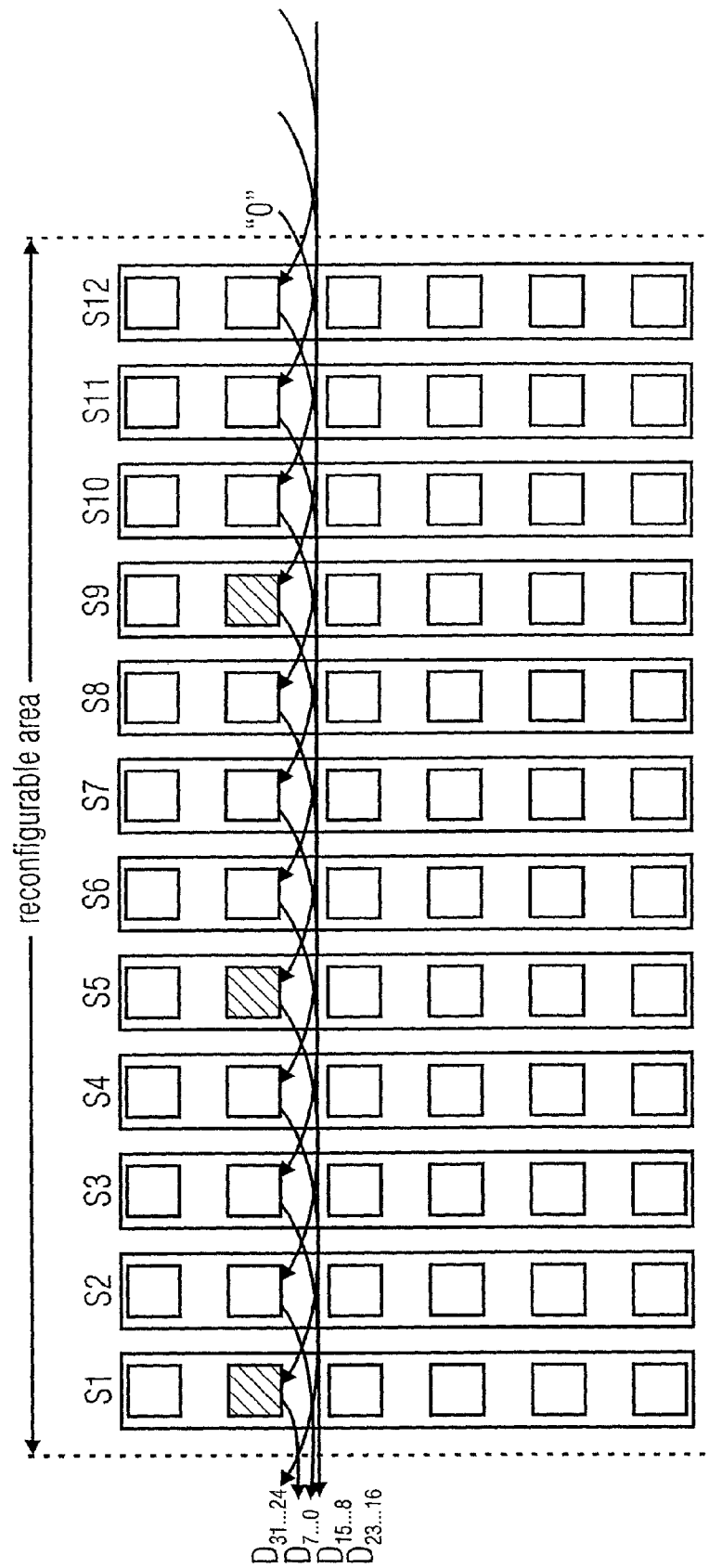
FIG. 43 shows a block schematic diagram of a bus comprising multiple interleaved read multiplexer chains.

FIG. 43 shows a block schematic diagram of a logic chip, comprising a two-dimensional array of resource slots, according to an embodiment of the invention. The circuit shown in FIG. 43 is designated in its entirety with 4300.

The 2-dimensional array of resource slots is designated in its entirety with 4300. As can be seen, the 2-dimensional array of resource slots comprises a plurality of lines 4310a to 4310f of resource slots and a plurality of columns 4312a to 4312f of resource slots. As can be seen, the different resource slots may comprise couplings with different subsets of bus information lines. For example, it is assumed that the bus comprises four different subsets bils1, bils2, bils3, bils4 of bus information lines. For example, each of the resource slots is coupled to a (single) subset of the bus information lines, as indicated in FIG. 43.

Assuming that the columns are consecutively numbered, and that the rows are consecutively numbered, a column index m and a row index n (for example in the form of an integer number) can be associated with each resource slot. Consequently, a modulo position number P can be calculated according to $$P=(m+n) \bmod N,$$

wherein N designates a spatial periodicity.

Figures 14, 15:
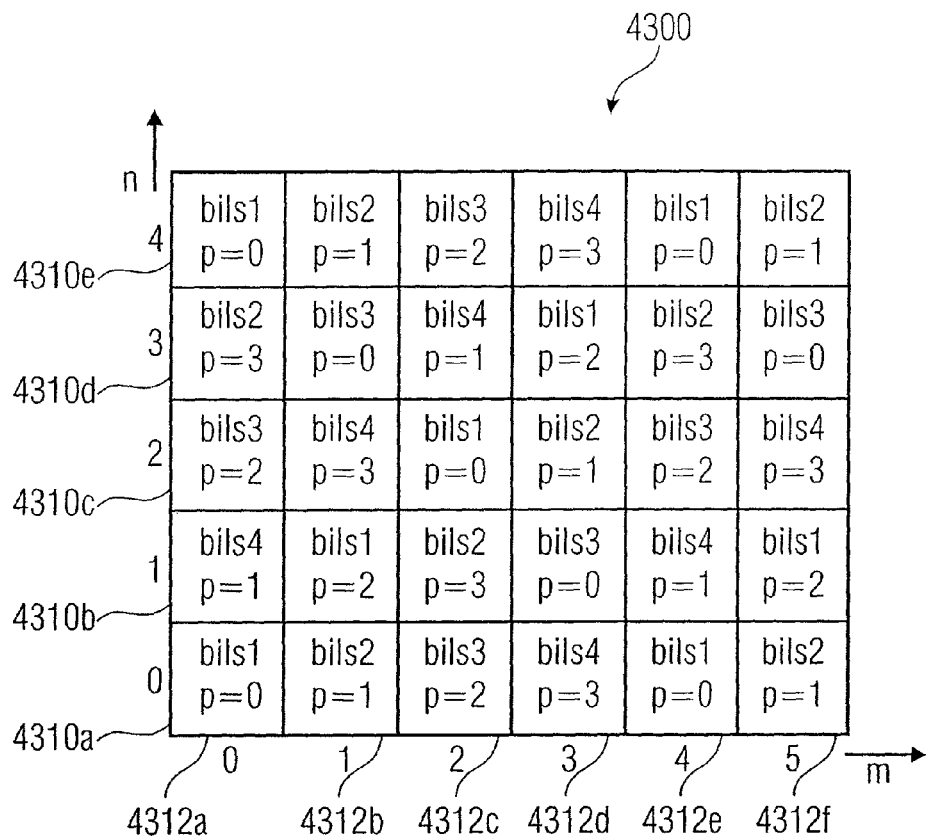
FIG. 14 shows a block schematic diagram of a logic chip, comprising a two-dimensional array of resource slots, according to an embodiment of the invention.
FIG. 15 shows a table describing a relationship between a modulo position number of a module and a subset of the bus information lines associated to a reference resource slot of the module.

Accordingly, the modulo position number P indicates which of the subsets of bus information lines is coupled to the resource slot having column index m and row index n, as can be seen from the table shown in FIG. 15.

To summarize the above, an equation has been described for a determination of a "starting position" for the leftmost and bottommost (or lower left) resource slot of a module.

The starting position can be used as a control signal of the alignment multiplexer (or mapping circuit). In other words, the starting position may be identical to the control signal of the alignment multiplexer.

The indexing is different from the embodiment shown in FIG. 6. However, it can be seen that different arrangements of the resource slot can be used.

In the following, another embodiment using a 2-dimensional arrangement (also designated as "embodiment 2D") will be described taking reference to FIGS. 16a and 16b.

Figures 16A, 16B:
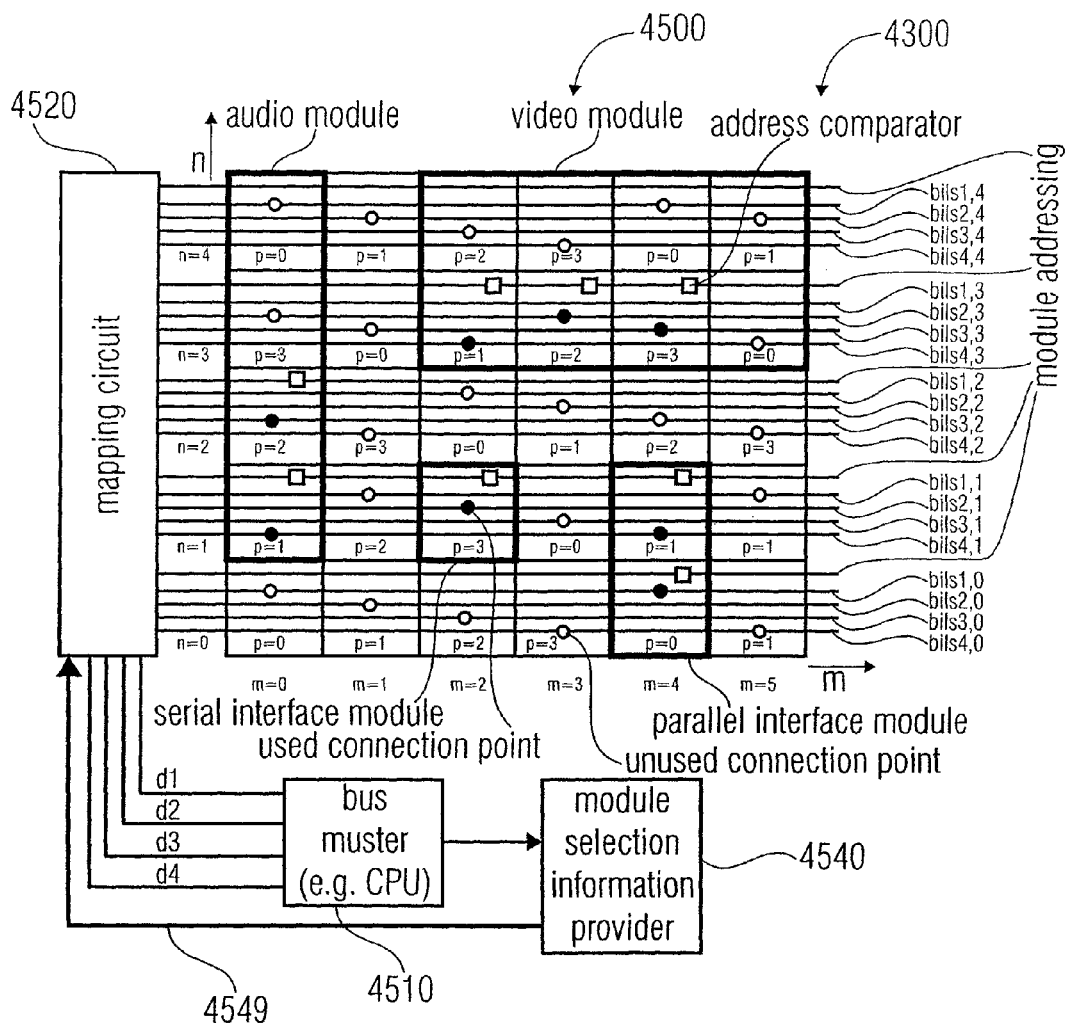
FIG. 16a shows a block schematic diagram of a logic chip, according to another embodiment of the invention.
FIG. 16b shows a table describing the modulo position information for a plurality of modules.

The 2D embodiment shown in FIGS. 16a and 16b is similar to the 1D embodiment shown in FIG. 3a.

The embodiment shown in FIG. 16a is designated in its entirety with 4500. The circuit 4500 comprises a bus master 4510, which may be equivalent to the bus master 310, and a mapping circuit 4520, which may be equivalent to the mapping circuit 320. The circuit 4500 also comprises a 2-dimensional arrangement 4530 of resource slots, which may be equivalent to the 2-dimensional arrangement 4300 and which may comprise a functionality comparable to the functionality of the resource slot component or module component 330.

Also, the circuit 4500 comprises a control circuit 4540, which may comprise at least a part of the functionality of the control circuit 340. For example, the control circuit 4540 may be configured to provide a control information 4549 for the control of the mapping circuit 4520. The control information 4549 may for example represent the modulo position information P of a currently addressed module. The modulo position information may for example be used to configure the mapping circuit 4520 as described with reference to FIG. 5.

FIG. 16b describes positions of different modules (audio module, video module, serial interface module, parallel interface module) and associated module position numbers (also designated as "modulo position numbers").

Using the chosen permutation scheme, it is irrelevant whether the module connections are aligned horizontally or vertically. From the left lower starting point (also designated as leftmost and bottommost starting point) it is the cyclic sequence bils1, bils2, bils3 and bils4 (independent on whether the module grows to the top or to the right).

In other words, in some embodiments the mapping circuit may be controlled such that a given one of the subsets of bus master information lines (for example the subset d1) is (for example independent on the position of the module) coupled to a reference resource slot (for example the leftmost and lowermost resource slot) of a currently addressed module. Subsequent resource slots (extending away from the reference resource slot) may be coupled to a predetermined sequence of other subsets of the bus master information lines (independent from the actual position of the module within the two-dimensional array of resource slots).

Figure 7:
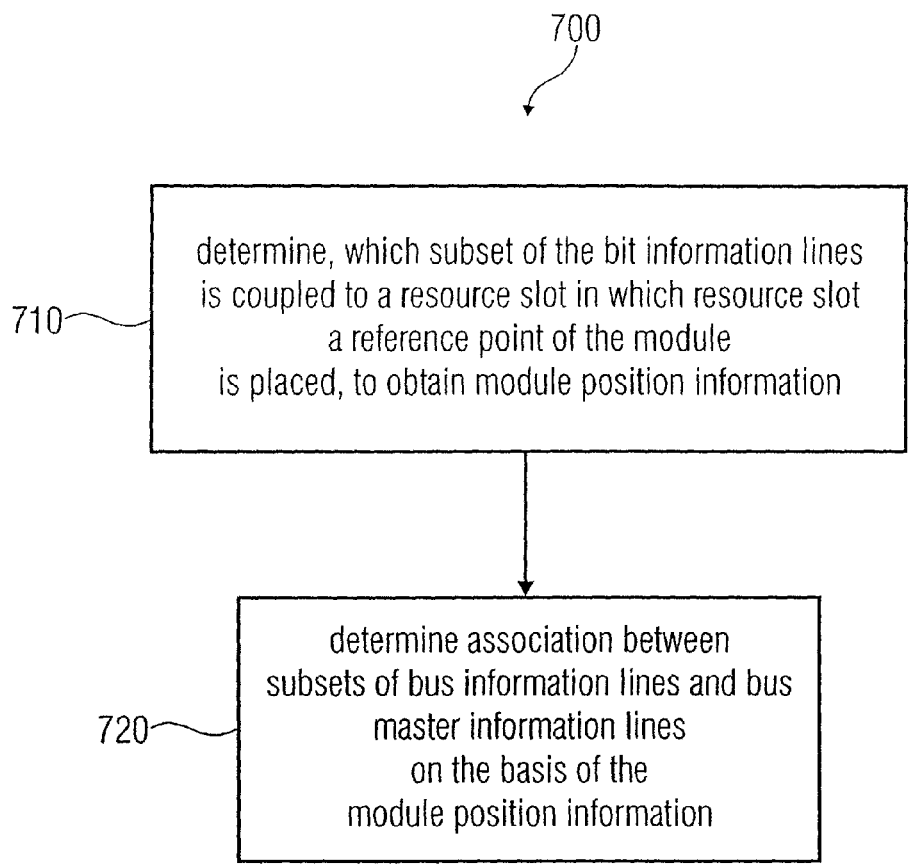
FIG. 7 shows a flow chart of a method for adjusting an association between subsets of bus information lines and bus master information lines.

FIG. 7 shows a flowchart of a method for determining an association between bus master information lines and subsets of bus information lines. The method shown in FIG. 7 is designated in its entirety with 700. The method 700 comprises a step 710 of determining, which subset of the bus information lines is coupled to a resource slot, in which resource slot a reference point of the module is placed, to obtain a module position information. The method 700 comprises a second step 720 of determining an association between subsets of bus information lines and subsets of bus master information lines on the basis of the module position information.

The method 700 according to FIG. 7 may for example be implemented using the mapping circuit 320 and the module position information provider 348. The modulo-4 module position information for an addressed module may be considered as an information, which subset of the bus information lines is coupled to a resource slot in which resource slot a reference point of the module is placed. Further, the mapping provided by the mapping circuit 320 is adjusted on the basis of this information.

Figure 8:
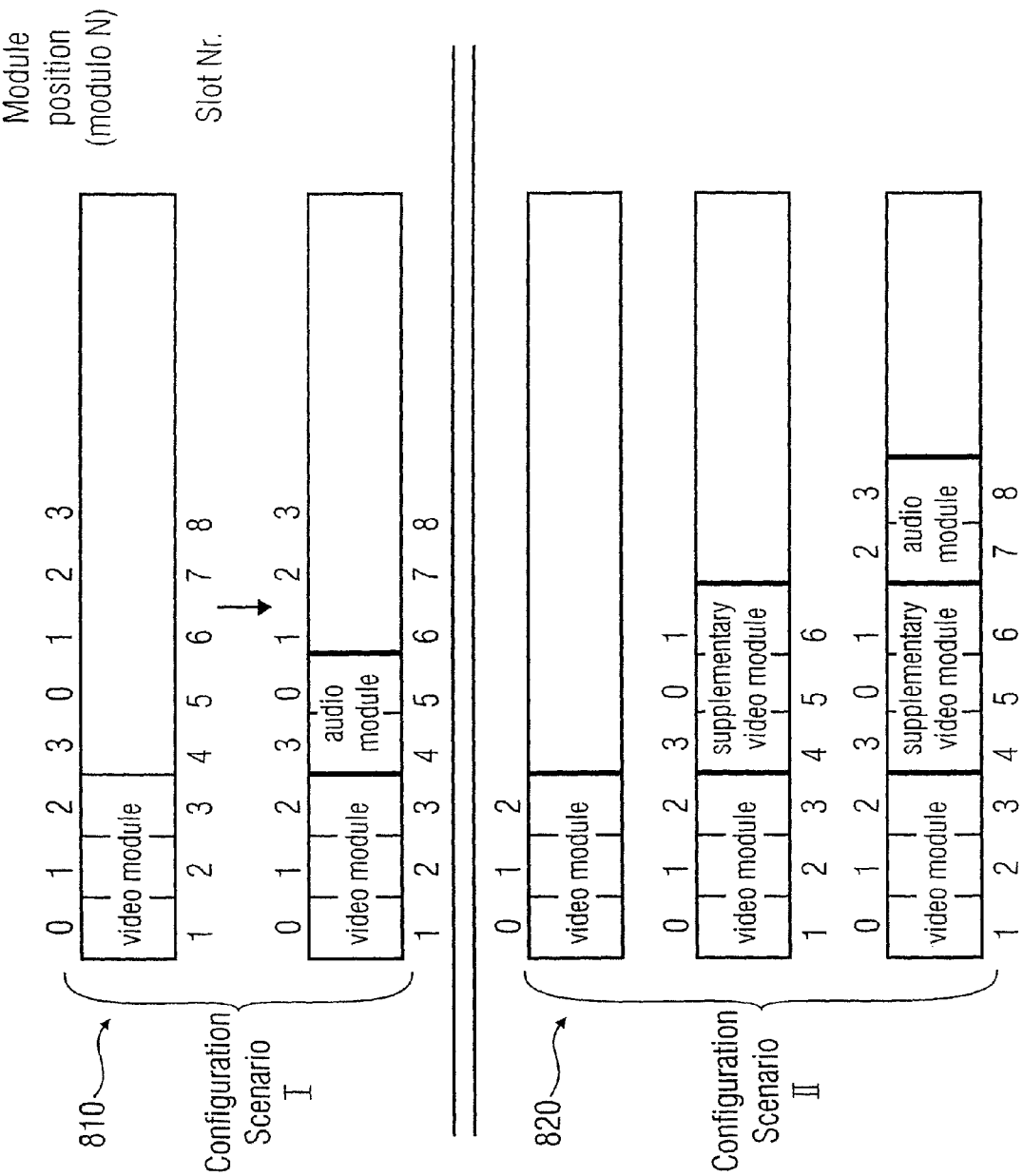
FIG. 8 shows a graphical representation of different configuration scenarios of a logic circuitry, according to an embodiment of the invention.

FIG. 8 shows a graphical representation of different configuration scenarios, which may be applied in the system shown in FIGS. 3a and 4a. A first scenario is designated with 810. In a first scenario, a video module is placed in the first, second and third resource slot (for example, in the resource slots 332a, 332b, 332c). Further, audio module is placed in the fourth and fifth resource slot (for example, in the resource slots 332 and 332e). This configuration is achieved if both a video processing and an audio processing is desired.

A second configuration scenario is designated with 820. The second configuration scenario is obtained if a supplementary video processing is desired. If it is found, for example, by the resource slot manager 350, that a supplementary video processing is desired (which supplementary video processing goes beyond the video processing obtained by the standard "video module"), the resource slot manager may allocate both a video module and a supplementary video module to the resource slots. In this case, the standard video module is placed in the first, second and third resource slots 332a, 332b and 332c. Further, the supplementary video module may be placed in the fourth, fifth and sixth resource slots 332d, 332e, 332f. Consequently, the audio module may be placed in the seventh and eight resource slots 332g, 332h.

To summarize the above, different configuration scenarios may exist, depending on specific requirements of the application. Also, a dynamic reconfiguration may be made. Different types of reconfiguration are possible. For example, if the system 300 is first configured according to the configuration scenario 810 and it is found that the supplementary video module is needed, the configuration scenario 810 can be supplemented by adding the supplementary video module in the unused sixth, seventh and eight resource slots 332f, 332g and 332h. Alternatively, the resource slot manager 350 may change the configuration from the first configuration scenario 810 to the second configuration scenario 820, for example, by replacing the audio module, as used in the first configuration scenario 810, by the supplementary video module (as shown in the configuration scenario 820) and by adding the audio module, as shown in the configuration scenario 820.

To summarize the above, different configuration scenarios will be used in dependence on the requirements. A dynamic change may be possible in some embodiments, while other embodiments use fixed configurations. The mapping between subsets of bus master information lines and subsets of bus information lines may be dynamically adapted to the respective configuration scenarios.

Figure 9:
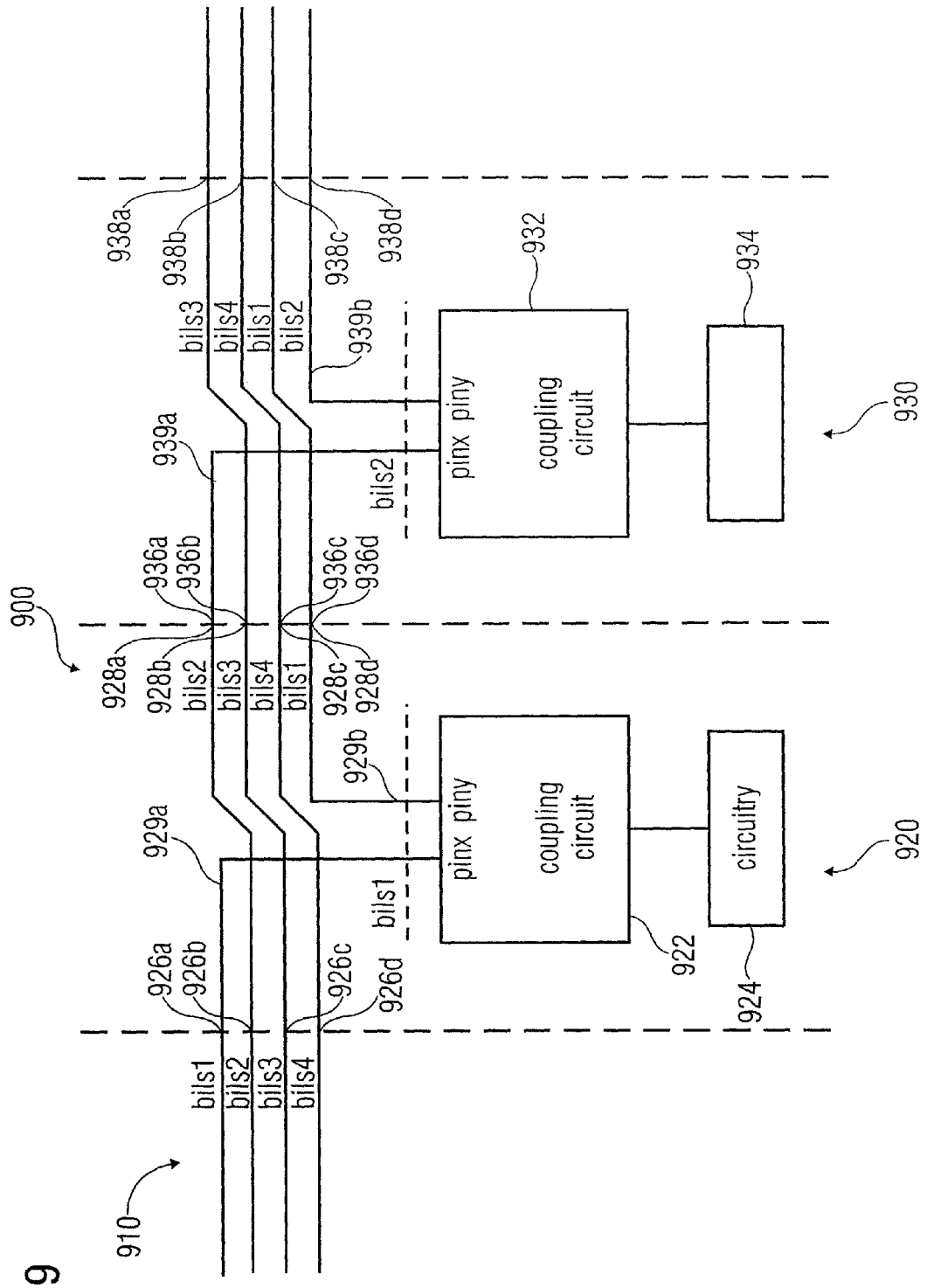
FIG. 9 shows a schematic representation of a physical structure of the bus.

In the following, some hardware details regarding the routing of the bus information lines will be described taking reference to FIG. 9. FIG. 9 shows a block schematic diagram of a bus structure, according to an embodiment of the invention. The bus structure shown in FIG. 9 is designated in its entirety with 900. The bus structure 900 comprises a bus 910. The bus 910 comprises four subsets of bus information lines, which are designated with bils1, bils2, bils3 and bils4. Each of the subsets of bus information lines may comprise one or more bus information lines. For the sake of simplicity, only one bus information line is shown for each subset of the bus information lines.

A first resource slot 920 comprises a corresponding coupling circuit 922, which is configured to provide for a coupling between a circuitry 924 of the first resource slot and one of the subsets of bus information lines. In the given example, the coupling circuit 922 of the first resource slot provides for a coupling between the circuitry 924 and the first subset bils1 of the bus information lines A second resource slot 930 comprises a corresponding coupling circuit 932, which is configured to provide a coupling between one of the subsets of bus information lines and a circuitry 934 of the second resource slot 930. For example, the coupling circuit 932 may provide for a coupling between the second subset bils 2 of the bus information lines and the circuitry 934 of the second resource slot 940.

It should be noted here that the coupling circuits 922, 932 of the first and second resource slots 920, 930 may be pin compatible (i.e., identical with respect to their pin out). For example, the first resource slot 920 may comprise four left-sided interface locations 926a, 926b, 926c, 926d for bus information lines. Further, the first resource slot 920 may comprise four right-sided interface locations 928a, 928b, 928c, 928d for bus information lines. Similarly, the second resource slot 930 may comprise four left-sided interface locations 936a to 936d and four right-sided interface locations 938a to 938d. It should be noted here that the right-sided interface locations of the first resource slot coincide with the left-sided interface locations of the second resource slot, if the first and second resource slots are arranged adjacently. Also, it should be noted that the position of the first left-sided interface location, relative to the boundaries of the first resource slot, is identical to the position of the first left-sided interface location of the second resource slot, with reference to the boundaries of the second resource slot. Similarly, the positions of the second, third and fourth left-sided interface locations of the first resource slot (referenced to the boundaries of the first resource slot) are identical to the positions of the second, third and fourth left-sided interface locations of the second resource slot (referenced to the boundaries of the second resource slot). Similarly, the right-sided interface locations of the first resource slot, referenced to the boundaries of the first resource slot, are identical to the positions of the right-sided interface locations of the second resource slot, referenced to the boundaries of the second resource slot.

A first connection pinx of the coupling circuit 922 is connected via a line 929a, which line 929a extends between the first left-sided interface location 926a in the input pinx of the coupling circuit 922. Further, a connection piny of the coupling circuit 922 is connected, via a line 929b, with the fourth right-sided interface location 928d of the first resource slot 920. Similarly, a connection pinx of the coupling circuit 932 (which is pin compatible to the coupling circuit 922) is connected with the first left-sided interface location 936a of the second resource slot via a line 939a. A connection piny of the coupling circuit 932 is connected with the fourth right-sided interface location 938d of the second resource slot via a line 939b.

Further, the second left-sided interface location 926b is connected to the first right-sided interface location 928a. The third left-sided interface location 926c is connected with the second right-sided interface location 928b, and the fourth left-sided interface location 926d is connected with the third right-sided interface location 928c.

Accordingly, the resource slot comprises a connection between the left-sided interface location and the right-sided interface location, which provides for a shifted connection between the left-sided interface locations and the right-sided interface locations. The shift between the left-sided interface location and the right-sided interface location may be cyclic, for example, in that the first left-sided interface location 926a is connected to the fourth right-side interface location 928d via the coupling circuit 922. The connections between the left-sided interface locations and the right-sided interface locations in the second resource slot 930 may be structurally identical to the connections in the first resource slot 920, as can be seen from FIG. 9. The coupling circuits 922, 932 may provide a read access, or a write access, or a read/modify/write access to the signal which is connected to the coupling circuits 922, 932.

As can be seen from FIG. 9 the different resource slots effectively comprise coupling with different subsets of the bus information lines.

The first resource slot is coupled with the first sub-set BILS1, and the second resource slot 930 is coupled with the second sub-set BILS2. The first resource slot and the second resource slot may comprise identical coupling structures (which are identical with respect to the connections between the left-sided and right-sided interface locations and also with respect to the coupling circuits).

Accordingly, the coupling of different resource slots with different sub-sets of the bus information lines can be achieved using a uniform circuitry.

Figure 10:
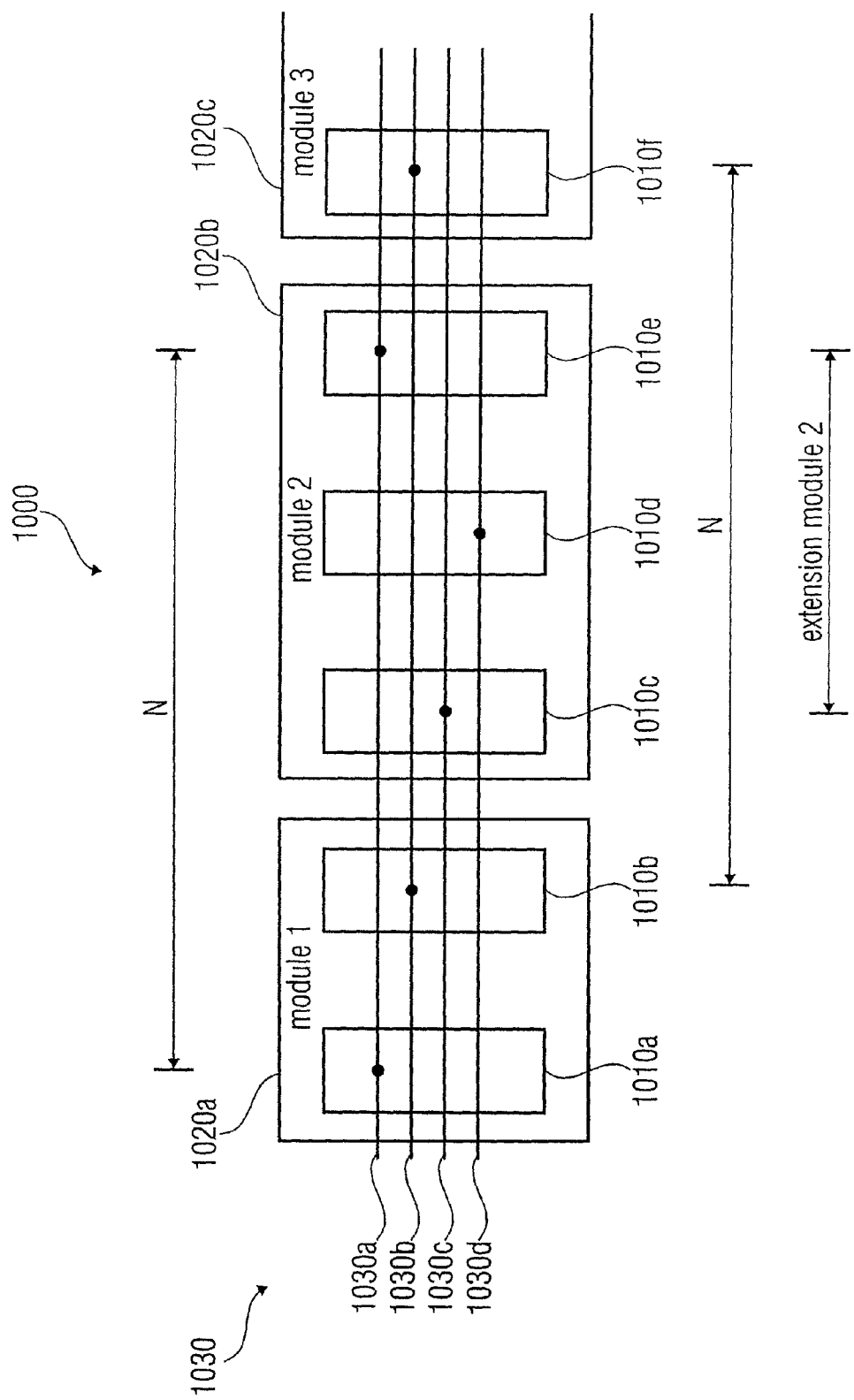
FIG. 10 shows a block schematic diagram of a logic chip according to an embodiment of the invention.

FIG. 10 shows another logic circuit, according to an embodiment of the invention. The logic circuit according to FIG. 10 is designated in its entirety with 1000. The logic circuit 1000, which may be arranged on a logic chip, comprises a plurality of resource slots 1010a to 1010f. Moreover, the logic circuit comprises a plurality of individually-addressable modules, for example, a first module 1020a, a second module 1020b and a third module 1020c. In turn, the modules 1020a, 1020b, 1020c comprises one or more resource slots. For example, the first module 1020a comprises a first resource slot 1010a and the second resource slot 1010b. The second module 1020b comprises the third resource slot 1010c, the fourth resource slot 1010b and the fifth resource slot 1010e. The third module 1020c comprises, among other, the sixth resource slot 1010f.

The logic circuit 1000 further comprises a bus 1030 comprising a plurality of bus information lines. The bus comprises a plurality of strict sub-sets 1030a, 1030b, 1030c, 1030d.

A first strict sub-set of the bus information lines is periodically, in terms of space, connected with resource slot logic circuitry once per N of the resource slots. For example, the first strict sub-set 1030a of the bus information lines is connected with logic circuitry of the first and of the (N+1)-th resource slot. Further, a second strict sub-set of the bus information lines is periodically connected with resource slot logic circuitry once per N of the resource slots. For example, the second strict sub-set 1030b is connected with logic circuitry, the second resource slot and of the (N+2)-th resource slot. N is greater than or equal to 2.

The bus information lines of the first sub-set 1030a are coupled to the slot logic circuitry of different resource slots than the bus information lines of the second sub-set 1030b. An extension in terms of resource slots of an individually-addressable module, which is embedded between two further individually-addressable modules, differs from a bus periodicity of N resource slots. For example, the periodicity N is equal to 4 in the embodiment shown in FIG. 10. In contrast, an extension, in terms of resource slots of the second module 1020b, which is embedded between the first module 1020a and the third module 1020c, is equal to three resource slots.

Thus, a granularity of the individually-addressable modules is chosen to be finer than a bus periodicity, or equal to the bus periodicity. Nevertheless, even with this configuration, an efficient access to the information carried by the bus is possible.

Figure 11:
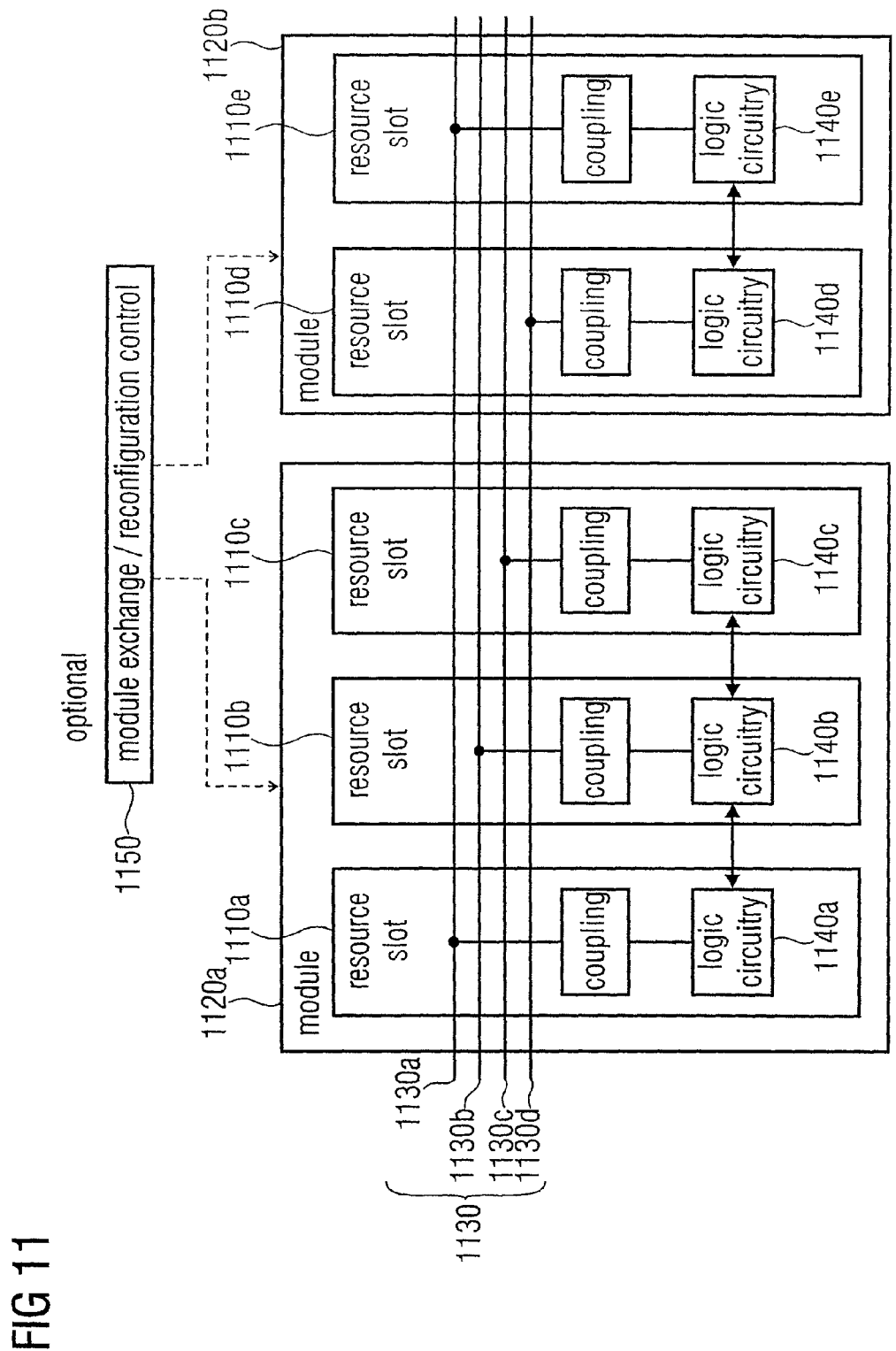
FIG. 11 shows a block schematic diagram of a logic chip according to an embodiment of the invention.

FIG. 11 shows a block schematic diagram of a logic chip, according to another embodiment of the invention. The logic chip shown in FIG. 11 is designated in its entirety with 1100. The logic chip 1100 comprises a plurality of resource slots 1110a to 1110e. The resource slots 1110a, 1110b and 1110c may belong to a first module 1120a and the resource slots 1110d and 1110e may belong to a second module 1120b. The logic chip further comprises a bus 1130, as described above, the bus comprising a plurality of sub-sets 1130a to 1130d of bus information lines. As can be seen, the resource slots each comprise logic circuitry 1140a to 1140e, wherein there is a coupling between the logic circuitry of resource slots 1110a to 1110c belonging to the same module 1120. Similarly, there is a module-internal coupling between logic circuitry 1140d, 1140e belonging to the second module 1120b. Optionally, there may be a module exchange/reconfiguration control 1150, as already mentioned above.

Figure 12:
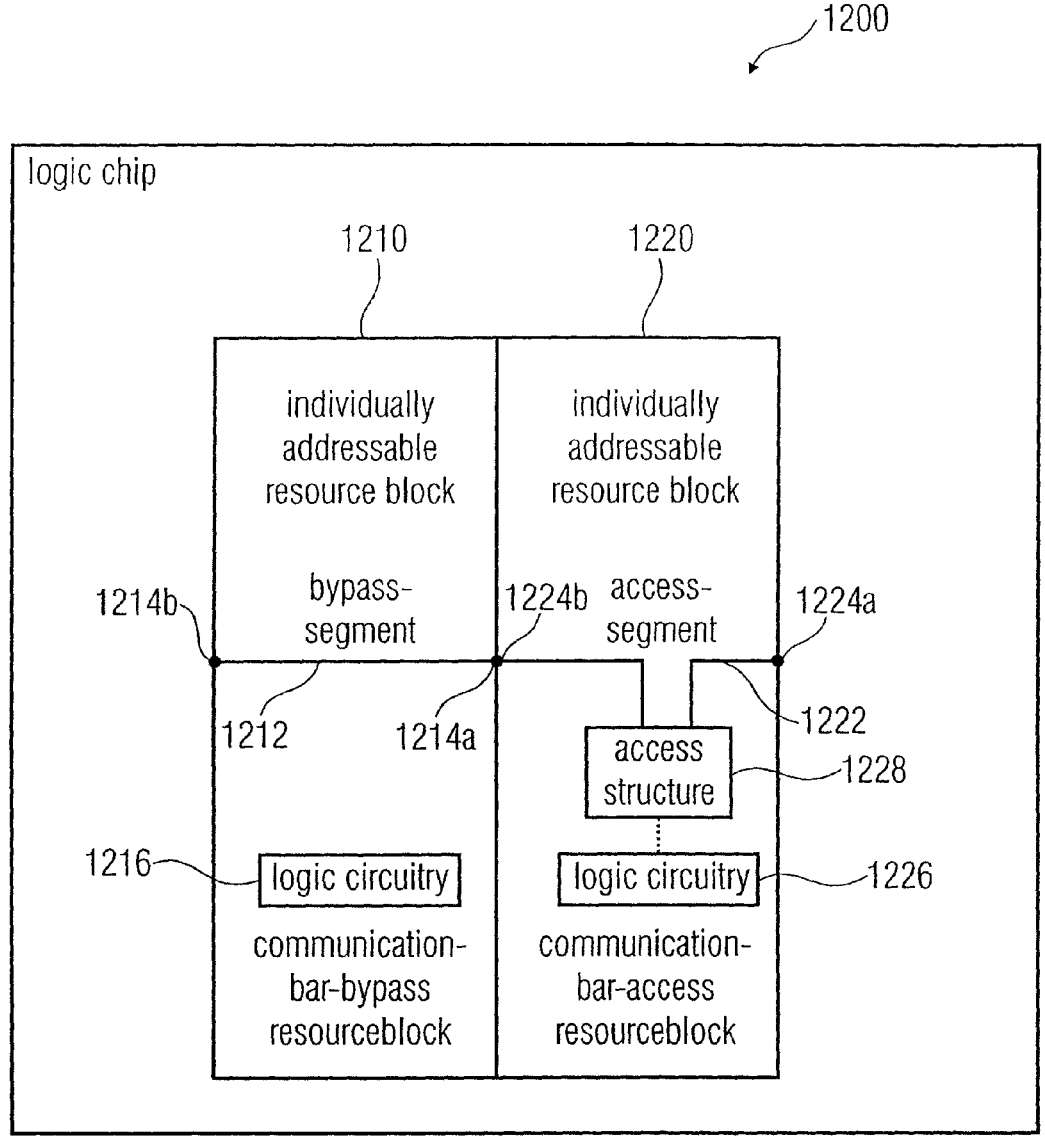
FIG. 12 block schematic diagram of a logic chip according to an embodiment of the invention.

FIG. 12 shows a block schematic diagram of a logic circuit, according to another embodiment of the invention. The logic circuit shown in FIG. 12 is designated in its entirety with 1200. The logic chip 1200 comprises a first individually-addressable resource block 1210 and a second individually-addressable resource block 1220 (which individually addressable resource blocks may for example be resource slots or modules).

The logic chip 1200 further comprises a communication bar extending across a plurality of the individually-addressable resource blocks. The communication bar comprises a plurality of communication bar segments associated with the resource slots 1210, 1220, for example, a bypass segment 1212 and an access segment 1222. The communication bar segments 1212, 1222 of the individually addressable resource blocks 1210, 1220 comprise identical interface locations with respect to the boundaries of the resource slots, such that an input interface location of a first resource block 1210 matches an output interface location of an adjacent second resource block. For example, if it is assumed that a signal is passed from the right to the left via the communication bar comprising the bypass segment 1212 and the access segment 1222, the following definition regarding the interface locations can be given: The bypass segment 1212 of the first resource block comprises an input interface location 1214a at the first (right-hand side) boundary of the first resource block 1210, and an output interface location 1214b at a second (left-hand side) boundary of the first resource block 1210. The access segment 1222 of the second individually addressable resource block 1220 comprises an input interface location 1224a and a first (right-hand side) boundary of the second resource block, and an output interface location 1224b at a second (left-hand side) boundary of the second resource block.

Assuming, for example, that the first resource block 1210 and the second resource block 1220 comprise identical sizes, the first boundary of the first resource block 1210 comprises the same dimensions as the first boundary of the second resource block. Similarly, the second boundary of the first resource block comprises the same dimensions as the second boundary of the second resource block. Further, the input interface location 1214a of the bypass segment, measured with reference to the first boundary of the first resource block 1210, may be identical to the input interface location 1224a of the access segment 1222, measured with respect to the first boundary of the second resource block 1220. Similarly, the output interface location 1214b of the bypass segment 1212, measured with respect to the second boundary of the first resource block 1210, is identical to the output interface location 1224b of the access segment 1222, measured with respect to the second boundary of the second resource block 1220.

Further, the first resource block 1210 and the second resource block 1220 may be arranged, adjacent with respect to each other, such that the output interface location 1224b of the access segment 1222 of the second resource block coincides with the input interface location 1214a of the bypass segment 1216 of the first resource block 1210. In other words, the resource blocks 1210, 1220 may be pin-compatible with respect to the input interface locations 1214a, 1224a and with respect to the output interface locations 1214b, 1224b.

To summarize the above, the communication bar segments of the individually-addressable resource slots 1210, 1220 comprise identical interface locations with respect to the boundaries of the resource slots, such that the input interface location 1214a of the first resource slot 1210 matches an output interface location 1224b of the adjacent second resource slot 1220.

As can be seen from FIG. 12, the first resource slot 1210, which is addressable individually from the second resource slot 1220, can be considered as a communication-bar-bypass resource slot, as the first resource slot comprises a bypass segment of the communication bar. The bypass segment 1212 of the communication bar bypasses a logic circuitry 1216 of the first resource block.

The second resource slot can be considered as a communication-bar access resource slot, as the second resource slot 1220 comprises an access segment 1222 of the communication bar. The access segment 1222 of the communication bar comprises an access structure 1228 inserted between a first interface location (for example, the input interface location 1224a) and a second interface location (for example, the output interface location 1224b) to allow for a read access or a write access or a combined read/write access to the communication bar.

As will be discussed in detail below, the bypass segment 1212 may, for example, be implemented using a switch matrix of an FPGA, which switch matrix is configured to provide a bypass route from the input interface location 1214a to the output interface location 1214b, avoiding any additional logic circuitry of the FPGA (like, for example, lookup tables (LUTs) of configurable logic blocks; a configurable logic block CLB may comprise logic and wiring, wherein the wiring may be used in some embodiments). In contrast, the access structure 1220a of the access segment 1222 may be implemented using a switch matrix of the FPGA, which switch matrix of the FPGA provides for an access path providing a coupling between the logic circuitry 1226 of the FPGA (for example, in the form of one or more configurable logic blocks) and the access segment 1222. In other words, the switching matrix is used to couple the access segment 1222 with the logic circuitry 1226, as will be described in detail below.

Figure 13:
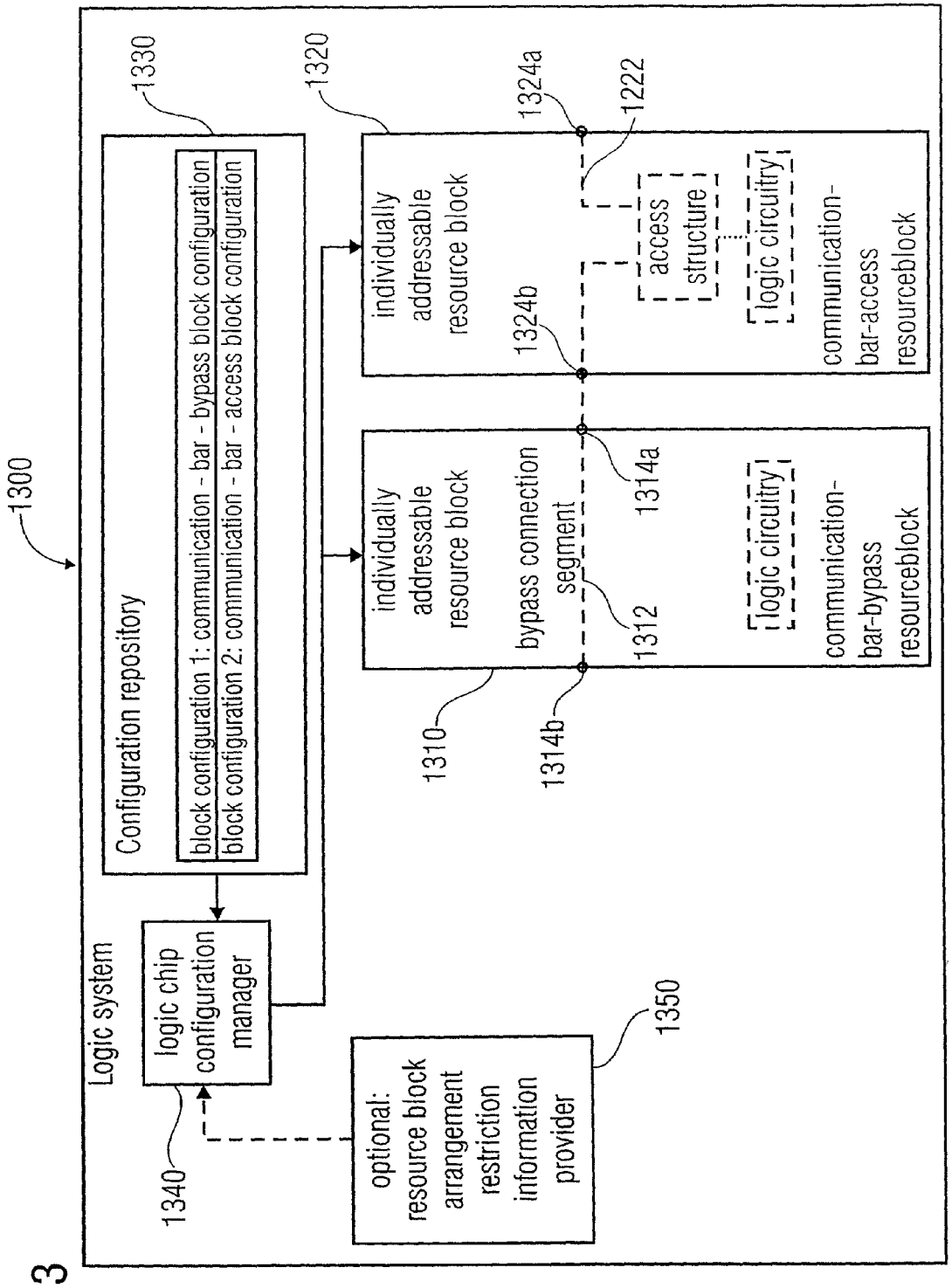
FIG. 13 block schematic diagram of a logic system, according to an embodiment of the invention.

In the following, another embodiment will be described taking reference to FIG. 13. FIG. 13 shows a block schematic diagram of a logic system, according to an embodiment of the invention. The logic system shown in FIG. 13 is designated in its entirety with 1300. The logic system 1300 comprises a plurality of individually-addressable resource blocks, for example a first resource block 1310 and a second resource block 1320. The individually-addressable resource slots (which may be considered as resource blocks) are arranged at different block positions on a reconfigurable logic chip.

The logic system further comprises a configuration repository 1330 comprising a plurality of slot configurations (or block configurations) describing configurations of resource slots (or resource blocks). In other words, the configuration repository comprises configuration data describing a configuration of a resource slot. For example, the configuration repository comprises a plurality of digital bitstreams, wherein each of the digital bitstreams describes a possible configuration of the resource slots or resource blocks. In an embodiment, different configuration bitstreams may, for example, be compatible in that a first one of the configuration bitstreams can be selectively used to configure the first resource slot 1310 or the second resource slot 1320. Similarly, the second configuration bitstream can also be flexibly applicable both to the first resource block 1310 and to the second resource block 1320. Accordingly, a configuration manager 1340 may be adapted to configure the individually-addressable resource blocks or resource slots using the block configurations or slot configurations stored in the configuration repository.

One of the block configurations or slot configurations stored in the configuration repository 1330 may be a communication-bar bypass block configuration, and another of the block configurations stored in the configuration repository may be a communication-bar access block configuration.

For example, the communication bypass configuration (or communication-bar-bypass block configuration) or the module access configuration (or communication-bar-access block configuration) may be a sub-configuration that may be merged with the logic circuitry of the module.

However, this sub-configuration can be identified independently within the merged configuration in some embodiments. The sub-configuration for bypassing or connecting the information line (for example a line or "channel" of the communication bar) within a resource slot or resource block may be generated on-the-fly within the system.

As a consequence, the system may be self-adaptive in some embodiments.

The communication-bar bypass block configuration may comprise a configuration information describing a bypass connection segment extending between corresponding communication bar interface locations. The corresponding communication bar interface locations may be arranged at opposite boundaries of a resource block. The communication bar interface locations may be predetermined with respect to the boundaries of the resource block. Accordingly, the communication-bar bypass block configuration may, for example, describe the configuration of the first individually-addressable resource block 1210 described with reference to FIG. 12.

Moreover, the communication-bar access block configuration may comprise configuration information describing an access structure to be inserted between the first of the predetermined communication bar interface locations and the second of the predetermined communication bar interface locations to allow for a read access or a write access or a combined read/write access to the communication bar.

As mentioned above, the logic chip configuration manager may be adapted to configure the individually-addressable resource blocks 1310, 1320 using the communication bar bypass block configurations and the communication bar access block configurations to establish a communication bar extending across a plurality of adjacent resource blocks. The communication bar may be established such that the communication bar signal is routed to bypass one or more of the resource blocks configured in accordance with the communication bar bypass block configuration, and such that the communication bar signal is coupled to a resource block circuitry in one or more of the resource blocks configured in accordance with a communication bar access slot configuration.

For example, the configuration shown in FIG. 13 may be obtained by configuring the reconfigurable resource blocks 1310, 1320 in accordance with the communication-bar bypass block configuration and the communication-bar access block configuration. For example, the reconfigurable first resource block 1310 may be configured in accordance with the communication-bar bypass block configuration, such that a bypass connection segment 1312 is established between a first interface location 1314a and a second interface location 1314b of the first reconfigurable resource block

1310. Further, the second reconfigurable resource block 1320 may be configured using the communication-bar access block configuration information, such that an access connection segment 1222 is established between a first interface location 1324a and a second interface location 1324b of the second resource block 1320. The access connection segment 1222 and the bypass connection segment 1312 may be connected via the first interface location 1314 of the first resource block 1310 and the second interface location 1324b of the second resource block, which interface locations may coincide or may be electrically coupled.

Furthermore, the logic chip configuration manager 1314 may optionally be configured to dynamically reconfigure the resource blocks 1310, 1320. For this purpose, the logic chip configuration manager 1314 may be configured to configure a given one of the resource blocks 1310, 1320 in accordance with different possible sets of block configuration information. For example, the logic chip configuration manager 1314 may change the functionality of a communication-bar bypass resource block to the functionality of a communication-bar access resource block by reconfiguring the respective resource block. Accordingly, different possible configurations can be achieved. For example, in the presence of at least three individually-addressable resource blocks, a total of at least 8 possible combinations can be obtained. This is due to the fact that each of the, for example, 3 individually-addressable resource blocks can either be configured as a communication-bar bypass resource block, comprising a bypass connection segment, or as a communication-bar access resource block, comprising an access connection segment.

Moreover, in some embodiments, the logic chip configuration manager 1340 may freely allocate the different block configurations (communication-bar bypass block configurations and communication-bar access block configurations) to the available resource blocks. However, in another embodiment, there may be an optional resource block arrangement restriction information provider 1350, which may provide an information to the logic chip configuration manager 1340 indicating a position relationship between some or all of the block configurations. For example, in some embodiments, it may be necessitated that a certain block configuration (describing a block having a specific functionality) is applied upstream with respect to a communication in the direction of the communication bar when compared to another block configuration (describing a block having a different functionality). Accordingly, an information provided to the communication bar via the upstream resource block may be further processed by the downstream resource block coupled to the communication bar.

Further Details

The address of the select generator may alternatively be set by selectively manipulating the value of the logic function block that is implementing the select generator, while keeping the rest of the communication interface logic or the module logic untouched.

In the following some further embodiments will be briefly discussed taking reference to FIGS. 17, 18 and 19.

Figure 17:
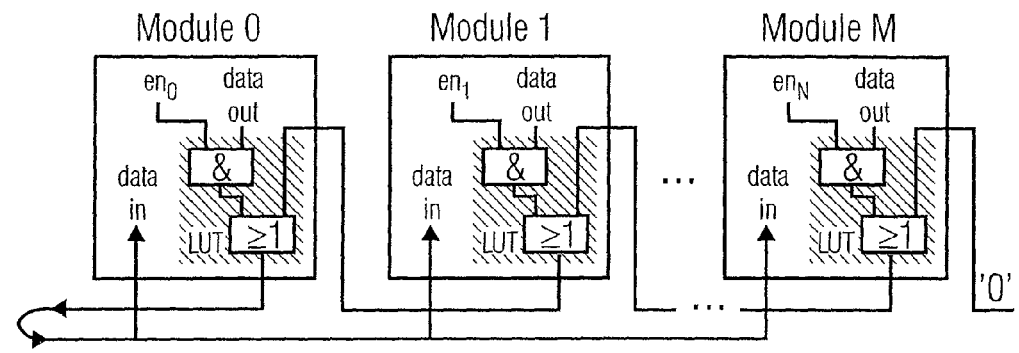
FIG. 17 shows a block schematic diagram of an implementation of a shared master read signal via a distributed logic-based bus.

The logic decomposition within the resource slots or modules for forming a regular structure is not limited to a chain of OR-gates as demonstrated in FIG. 17.

Figure 18:
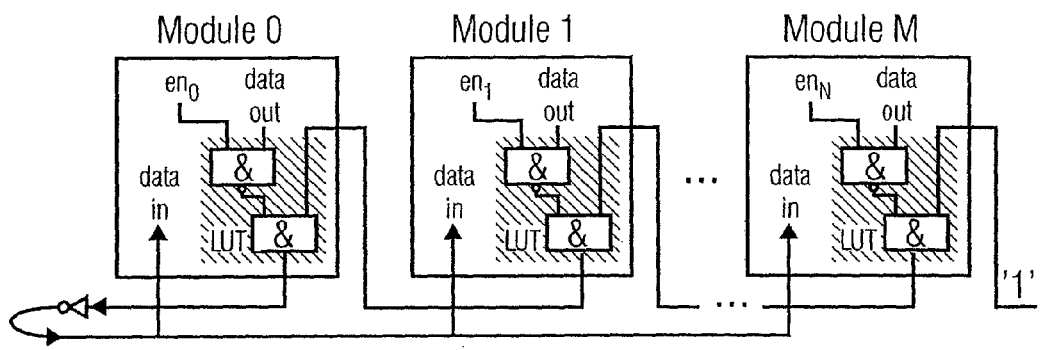
FIG. 18 shows a block schematic diagram of an implementation of a shared master read signal via a distributed logic-based bus.
Figure 19:
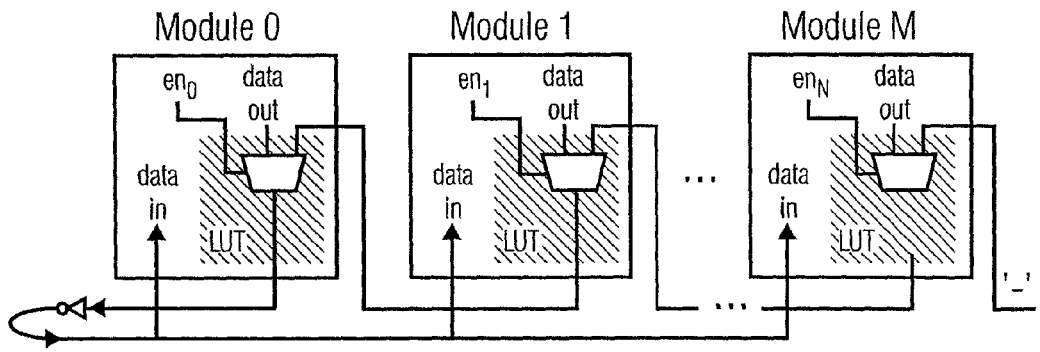
FIG. 19 shows a block schematic diagram of an implementation of a shared master read signal via a distributed logic-based bus.

Alternatively, by applying DeMorgan's theorem, we can implement the chain as a chain of AND-gates, as illustrated in FIG. 18.

As a further implementation alternative (see FIG. 19), it is possible to use a serial chain of multiplexers for building the regular structure among multiple resource slots or modules.

Further Aspects

In the following, some further aspects and developments regarding Efficient Reconfigurable On-Chip Buses will be described.

In the following, we present further developments related to the reconfigurable bus architecture. The further approaches can be summarized into two categories. In the first one, we present how the techniques for distributing bus signals in a uniformed manner can be adapted for providing communication to external pins or modules. In the second category, we will present a design flow for easy building partial reconfigurable systems and completely static systems based on our communication infrastructure.

Module-Environment Communication

In this section we will present some techniques needed to connect the modules of a reconfigurable system bus to the environment. With the term environment we summarize all resources that are not connected by the reconfigurable bus itself. Examples for such resources are I/O pins, on-chip resources like embedded memory blocks, or some other modules on the FPGA. The module-environment communication has to follow some rules in order to keep the flexibility of our reconfigurable bus, such as module relocation. In the following, we will reveal adaptations of our techniques suitable for the module-environment communication.

Connection Bars

Some of the techniques introduced in the original ReCoBus report can be adapted for the communication of a reconfigurable module with the environment. For instance, the communication of a reconfigurable audio module with the interface to an external analogue/digital converter may be implemented by the use of dedicated read or dedicated write signals. This communication will fall into the circuit switching category as presented in the section titled "Circuit Switching". The presented techniques for dedicated read and dedicated write signals can be seen as a special case of a circuit switched point-to-point communication with typically single bit signals. In order to provide communication between a reconfigurable module to a surrounding resource outside its module boundary, we propose to place signals parallel to the bus in such a way that these signals use also a homogenous routing scheme. This scheme has to support module replacements at the bus by partial reconfiguration without inferring any running communication with the environment. In general, the surrounding resources are somehow specialized and only one or a few modules at the reconfigurable bus demand links to these resources. For instance, an external digital/analogue converter of an audio interface may only be connected exclusively with one module of the bus. Thus, the communication between the module and the interface to the converter is dedicated. In general, different sets of such dedicated signals may be supported at the same time without interfering each other. For instance, a set of signals may be used for the communication between an audio module and the according interface to the digital/analogue converter and another separated set of signals may provide the communication between an UART connected to the reconfigurable bus and the external signal drivers.

Figure 30A:
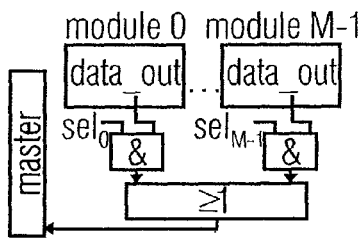
FIG. 30a shows a block schematic diagram of a common implementation of a shared read signal in a multiplexer-based bus.
Figure 30B:
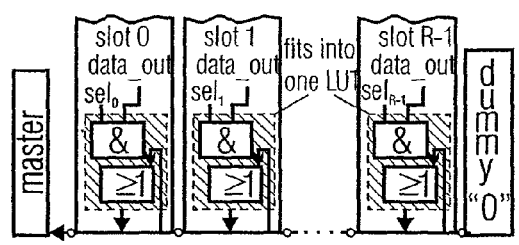
FIG. 30b shows a block schematic diagram of a distributed read multiplexer chain implementation that is suitable for partial re-configuration.

To solve this problem, we propose to use separate connection bars for each set of signals connecting a surrounding resource. Such a bar has to provide a routing in a uniformed manner as discussed before for all kinds of bus signals crossing the resource slots. Thus, the routing is suitable for partial reconfiguration including module relocation. Analog to the reconfigurable bus, each bar can be implemented as a macro (In our case, a macro follows the definition of a Xilinx hardmacro. A hardmacro is a module with placed logic resources performing fixed logic functions (e.g., the look-up tables building a read multiplexer chain as shown in FIG. 30b) that are linked by fixed routing resources. Instantiated Macros necessitate no logic synthesis step. During the place and route step, all macros will be placed prior to all other logic resources and the original internal routing of the macro will be maintained.).

Such a macro will be located at a fixed position over the modules. Note that all macros discussed in this description reserve logic and routing resources that are used to provide the communication demands for dynamic reconfigurable modules at runtime. Thus, we term the macro location over the modules as these macros build a logical routing plane on top of the physical logic and routing resources used for implementing the static and the dynamic parts of the system. Later at runtime, this logical routing plane will be set according to the communication demands and the used communication technique. For instance, if an interrupt signal has to be connected to the reconfigurable bus with the multi-slot bus request demultiplexer technique this will necessitate setting some control flip-flops on the logic level over some internal bus signals. In the other case, where an interrupt signal is provided by the demultiplexing through FPGA configuration technique, this necessitates to modify the according configuration codeword for interrupt connection crosspoint through the reconfiguration interface.

Figure 20:
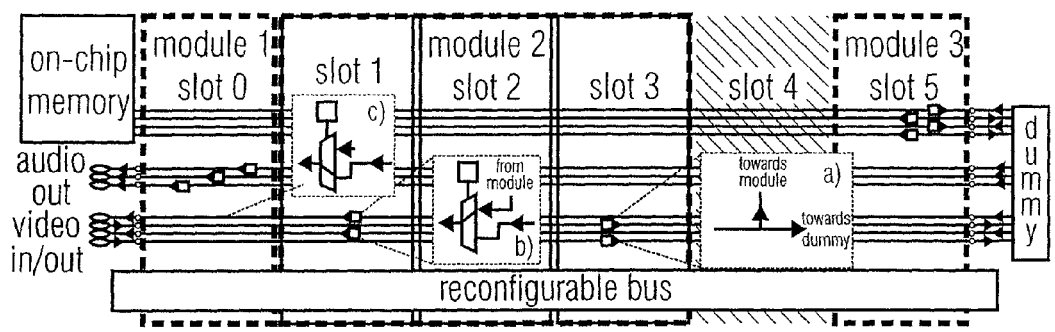
FIG. 20 shows a schematic diagram of an example of a system with 3 modules that are linked together by the reconfigurable bus technology.

FIG. 20 shows an example of a system with three modules that are linked together by our reconfigurable bus technology. Some modules can communicate to other on-chip or of-chip resources outside the reconfigurable resource area (the area of the six resource slots) by the reconfigurable bus and by connection bars on three different levels. A module can access input signals by tapping the corresponding bar (Box a)). For all output wires of a module we have to define in each slot of the bus if the next output wire segment is connected either to the module (Box b)) or just passed through (Box c)). The multiplexers in Box b) and Box c) represent a fraction of the FPGA routing fabric that is configured via the configuration interface.

FIG. 20 presents an example of a system where three modules communicate with the environment using the connection bar approach. A bar can utilize any arbitrary amount of input or output wires. All resource slots that do not access a wire of a bar have to route through this wire. As a consequence, modules can be placed freely at the bus while still being able to communicate with the surrounding. The connection bar technique is very efficient, because it necessitates no logic resources in the resource slots where signals are only passed through. Furthermore, a significant amount of wire resources picked for implementing the bars will be wires passing the module boundary, and these wires are not allowed for implementing the internal routing of the modules themselves.

Figure 21:
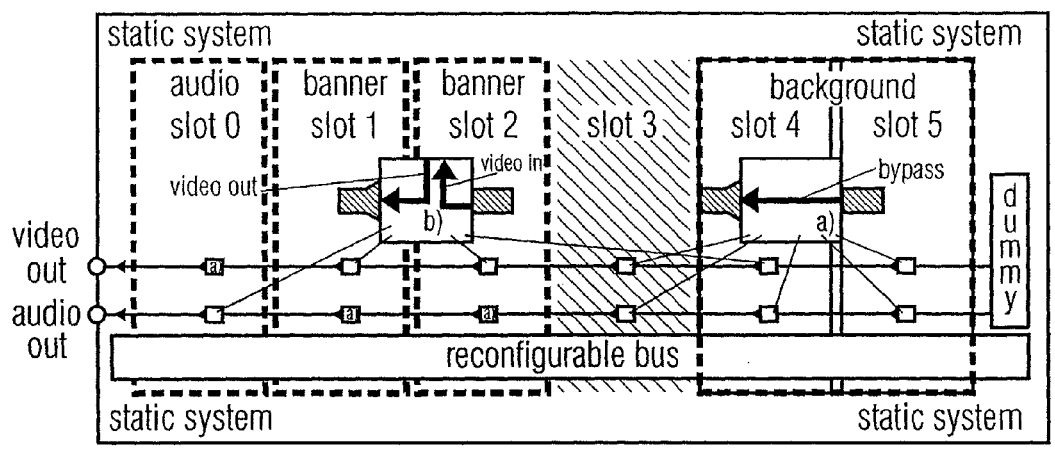
FIG. 21 shows a block schematic diagram of an exemplary system with an audio module that is connected in slot 0 to the audio bar in three video modules (banner, banner prime, and background) that are connected in the slots 1, 2 and 4 to the video bar.

FIG. 21 shows an examplary system with an audio module that is connected in slot 0 to the audio bar and three video modules (banner, banner', and background) that are connected in the slots 1, 2, and 4 to the video bar. Banner and banner' are two instances of the same module that manipulate theirs incoming video data and send the results further to the left hand side towards the video output pins.

As demonstrated in FIG. 21, the connection bar approach is ideal for implementing signal processing applications with data streaming from module to module. In this case, a single connection bar can provide multiple point to point connections at the same time combined with a minimum resource overhead. In the example, the module background produces a video data stream that is send over a connection bar to the module banner'. In this module, the incoming stream is processed by overlaying a text into the video data stream. The modified stream is fed again to the connection bar inside the same resource slot where module banner' is accessing the stream from the background module, as shown for slot 2 in FIG. 21. Thus, the connection bar link can be cut within a resource slot in such way that the input data is passed to the attached module and the output data from the module is streamed further towards the connection bar. This may me repeated multiple times with different or the same modules as demonstrated by module banner in resource slot 1 that is a second instance of a module overlaying a text banner into the video stream.

Note that logic resources are only needed in the resource slot that is currently providing an interface to a specific connection bar. With respect to all FPGAs shipped by the Xilinx Inc., a single look-up table is sufficient to provide a module input connection and the module output connection per single bit signal of the connection bar. In this case, we pass one stream through the look-up table and the other one through the additional register available on all Xilinx architectures. The modules may necessitate a different amount of resource slots while only one slot is sufficient for providing the interface to the according bar (or even multiple bars). In addition, the modules may be placed free to the resource slot and module relocation is possible. However, the placement has to follow the data dependencies between the modules, where in some cases the dependencies may change. For instance, we are allowed to exchange the placement position of the two modules banner and banner' without changing the output result, but the background module has to be placed on the right hand side of both banner modules.

It is not essential that all bars have the same signal direction or a connection to the static part of the system that is located at the same left or right corner in the case of horizontal aligned resource sots. A bar connection to the static system can be located at any corner of the system and the signal direction can be chosen towards any direction regardless to the preferential direction of the reconfigurable bus or any other bar. For instance, the background module in FIG. 21 may be part of the static system and consequently not placed within the area allocated for the reconfigurable resource slots. In this situation, the right side of the video connection bar is not connected to a dummy but to the background module that is in this case not located within the reconfigurable resource slots. Note that the same connection bar may include different signals with different directions, e.g., for implementing a handshake protocol.

In general, a connection bar contains multiple individual single bit lines and these lines may be arranged in any horizontal or vertical order while still allowing a regular interconnect from resource slot to resource slot. This results also in the same placement order for the logic within the resource slots implementing the access to the connection bar. However, for maintaining the placement flexibility provided by the reconfigurable bus, the connection bars should follow the grid chosen for the reconfigurable bus. For instance, the grid for the bus resources slots should be the same as the grid chosen for all connection bars. The design steps needed to build reconfigurable systems based on our ReCoBus techniques and the connection bars will be revealed in the following section.

In the system shown in FIG. 21 module generates the VGA sync signals and the background pattern and two instances of a banner module impose each a ReCoBus text banner into the video stream before sending the video data to the monitor.

Design Flow

The connection bar approach allows including all module access points to a bar statically, thus significantly reducing the design complexity and the work for the reconfiguration management in the runtime system. This allows modules to connect to the reconfigurable bus and a connection bar without modifying the module reconfiguration data. In this section, we will reveal how to design reconfigurable systems that communicate by the use of our reconfigurable bus and some I/O connection bars. Let us assume the system presented in FIG. 21 as a case study to demonstrate the design flow for building reconfigurable systems.

At design time, when the system is built, the parameters of the bus protocol are specified. The protocol may follow existing bus standards including AMBA, CoreConnect, AVALON, or Wishbone. These parameters include the data word width, the address range the maximum number of interrupts from the reconfigurable modules, and the number of master and slave modules connected to the reconfigurable bus. In addition, we have to define if the communication is pipelined and where the according pipeline registers are located. This allows us to automatically generate an RTL model of the reconfigurable bus for simulation as well as for synthesizing the complete system as a static only system. Beside the bus parameters, we have to define all connection bar parameters including the number of input and output wires, the interface or interfaces to the static part of the system, and the placement of optionally included pipeline registers. These parameters allow building RTL models for all connection bars likewise to the reconfigurable bus RTL model.

After simulating the complete system, the design is partitioned into the static part and the partial reconfigurable modules. This includes a floorplaning process, where the placement of the static system, the positions of the communication infrastructure (the reconfigurable bus and the connection bars), and the area for the resource slots are planed. This necessitates to specify some additional ReCoBus specific parameters. These parameters include the number of resource slots R, the width of a single slot W, the number of interleaved read multiplexer chains N, the height H of the resource slots, and the preferential signal direction of the bus. A detailed description of these parameters is given above. In addition, we have to specify the signal directions of the signals of the connection bars. With this information, we can automatically build separate macros for the bus and all connection bars that will be placed at fixed positions inside all further design steps.

At this stage we have to define the timing on the communication macros providing the communication between the static part of the system and the reconfigurable modules. In the easiest case, all signals from or to the static part of the system pass a (pipeline) register, thus, defining the bus propagation delays for all read or write signals for the static part as well as for the dynamic reconfigurable modules.

When the static system is build, the resource slots will contain only the reconfigurable bus and the I/O bar wires (all bar access points are in the bypass mode). Logic and routing from the static part of the system may not use resources from the slots.

Reference is also made to the section titled "Timing Model". If the bus contains combinatory paths without a register between the static part and the reconfigurable part, so called timing constraints can be applied in order to distribute the slack to fixed values. For instance, if a shared write signal has a worst case propagation delay of 3 ns, and the system is working with 100 MHz, the total remaining slack is 10 ns−3 ns=7 ns. Then we can constrain the static system with a slack of, e.g., 4 ns and the partial modules with a slack of 3 ns. With these timing constraints, we will direct the following synthesis steps and the place and route phases to generate hardware with a valid timing. In the static case of this example, the most critical propagation delay from all registers over any combinatory path to the input of the reconfigurable bus should be below the 4 ns. By assigning the timing either by the use of pipeline registers or by timing constraints, it is possible to build the static part completely independent from partially reconfigurable modules. Note that this includes that the static part as well as the partial modules can be build multiple times, e.g. to fix an error, without any influence to other parts of the system.

After the timing assignment, we can build the static system containing all I/O pins, the reconfigurable bus, all I/O bars, and all other static logic. It is only allowed to place the communication infrastructure inside the area for the reconfigurable modules (slot 0, . . . , slot 5), thus, any logic and routing related to the static part of the system should not be located inside this region. The placement of the communication macros is constrained for providing the connection points inside the resource slots to the reconfigurable bus and the I/O bars at the same position. If needed, modules being located inside the reconfigurable area may be built together with static system in one step. This is one possibility, for building an initial configuration that contains not only empty resource slots but modules being connected to our communication infrastructure. In this case, some I/O bar connection points may be connected to the modules as shown in FIG. 21 and not just bypassed. Another possibility to generate an initial system containing some modules within the reconfigurable resource area is based on hardware linking and will be revealed later in this section.

The modules may be built completely independent from the static part or other reconfigurable modules.

When the banner module is build, a design is created containing only the reconfigurable bus, all I/O bars, and the logic of this module. This module is only connected to the bus and to its according I/O connection bar (in this case the video bar). The module should not use any logic or routing resources outside its assigned resource slot region.

The setup for a module contains only the communication infrastructure and the according module that is fitted into a bounding box tailored to the minimum amount of resource slots. The bounding box will be located at the position leading to the most critical timing with respect to the routing infrastructure. This will guarantee that the modules will hold a valid timing regardless to the placement position (the start slot) of the module to the reconfigurable bus. Let us assume that the reconfigurable bus is connected to the static system at the left side, then the module will be placed at the most right resource slot (or slots if multiple slots are needed to fulfill the logic or communication demands).

When a partial reconfigurable module is built that is connected to an I/O connection bar, we automatically generate an initial setup with an I/O bar macro containing the according connection point within the module bounding box. As a consequence, the connection to the I/O bar will become a fixed part of the partial module configuration data and the module will automatically connect to the bar when its configuration is written to any allowed resource slot.

It is not essential to build the partial modules for exactly the FPGA device intended to be used in the final system. It is sufficient if the FPGA family is the same, that the resource slots have the same shape, and that the communication infrastructure provides the connection points at exactly the same relative position inside the resource slots as specified for the static system. In addition, the propagation delays may have to be constrained in the case if not all signals are pipelined within the partial module itself. The shape of a resource slot is given by its height and width. In the case of inhomogenities located inside the resource slots, e.g., dedicated RAM blocks, the relative positions of these resources are also part of the shape and have to be maintained. Note, this technique includes that also the modules may be used on different FPGAs providing different amounts of logic resources within the same FPGA family. This is possible if the resource slots have the same shape and if the communication resources are located at the same relative position. This may open new options for IP-core (intellectual property) distribution by selling a core as a fixed bitstream while hiding all further design related information from the customer.

The partial modules are located in rectangle regions on the FPGA that leads to also bounded regions within the configuration data. Thus, by cutting out the according configuration data related to the resource slots used by a partial module, it is possible to generate the partial configuration data for a particular reconfigurable module. When the static system is built according to the example in FIG. 21, the configuration data will contain only the information of the communication infrastructure at the positions related to the reconfigurable resource slots. A technique for cutting out a rectangular module by manipulating the configuration data of a Xilinx Virtexil device was presented in [BJRK+03]. In this paper, the authors present a tool called XPART that is capable to relocate rectangular modules on these devices. However, the authors omit completely the communication issues that arise when modules are dynamically placed on an FPGA. Furthermore, the work mentioned neither any applications nor any methodologies for composing systems out of such rectangular modules, as we propose for building static and/or dynamically reconfigurable systems.

In order to include some reconfigurable modules in the initial configuration data that is loaded to the device after power-on, the configuration data of some partial modules is copied to the positions of the free resource slots within the initial configuration data. Note that multiple instances necessitate also multiple copies in the initial configuration. In this case, the partial configuration of one instance is sufficient to build the initial configuration. For instance, when we want to include the two instances of the blocker module into the initial configuration, we can copy the same partial reconfiguration two times to different resource slot positions of the initial bitstream generated for the static system (see FIG. 21).

We call this step hardware linking as it has some similarities with the linking phase known from the development of software. Analog to the memory map in the link phase in the software domain where object files are placed onto the memory, hardware linking will map partial module configurations into the initial bitstream. In addition, the initial configuration values of the reconfigurable bus will be set in the initial bitstream, thus, omitting an extra configuration of the partial modules in the initial system. This will simplify the system start and will also speedup the startup process of the system. These configuration values include the setting of the reconfigurable select generators in the modules or the setting of the dedicated read signal demultiplexers (refer to the original ReCoBus report). This has also some similarities to the linking known from the software domain, where jump addresses in the object files are adjusted with respect to the final memory positions of the memory. In the hardware case, address ranges for a specific module are set in the reconfigurable select generator located in the connection of the according resource slot. Note that these modifications are bounded to the look-up table entries while leaving the routing completely untouched. As a consequence this manipulation of the configuration data has no impact timing of the design.

As indicated in the last paragraph, hardware linking may be used to massively speed up the design process of FPGA-based systems. Different modules may be developed and optimized individually and implemented in parallel design teams. In this case, all optimizations will be preserved in the final design, because partial modules are not touched by a synthesis or a place and route process during the system integration process. The system integration process is uncritical because all timing and communication issues are planned prior to the implementation. In addition, small changes will not affect the complete system and changes can be made transparent for all modules not involved in this change. For instance, if an error is fixed in one module connected to the reconfigurable bus, it is only essential to resynthesize and to place and route this particular module while leaving the rest of the system untouched. This is a further commonality of hardware linking and software linking. Hardware linking is only possible because of the homogeneous communication infrastructure. This infrastructure provides communication over a bus, e.g., for a shared memory communication, as well as dedicated communication channels between some modules or external pins. As a consequence modules can be built and integrated into an FPGA-based system without an additional place and route process for building the communication with the rest of the system. Note that this technique is also applicable for (structured) ASIC design processes.

In contrast to the current design flow provided by the Xilinx Inc. for building partial reconfigurable systems, the hardware linking phase omits the so called merge phase [LBM+06]. In this phase, all permutations of a combined system with the static part and all dynamic modules will be created. This includes the routed and placed netlists as well as all bitstream permutations. By the use of hardware linking, only one bitstream for the static system and one partial bitstream for each module is sufficient for building an initial bitstream and the configuration data needed at runtime to exchange modules. Note that the Xilinx flow restricts the system to place only one module exclusively to a reconfigurable resource area. As a consequence the flexibility of FPGA runtime reconfiguration can not be fully exploited with this flow. In contrast, our flow targets on building systems where a reconfigurable resource area is clustered into a plurality of resource slots that can be assigned very flexible to different modules at runtime.

Further Aspects According to the Invention

In the previous sections, we reveal further developments related to the system described above.

The two major contributions are: 1) adaptations to the presented dedicated write signals for efficient I/O communication, and 2) issues related to the design process of static only or runtime reconfigurable FPGA-based systems. In addition to the aspects mentioned above, embodiments according to the invention also comprise the following aspects:

An embodiment according to the invention creates a homogeneous structured I/O Connection bars for connecting on-chip resources or I/O pins that allow multiple segmented transfers along the same bar. The connections can be set by Online bitstream manipulation (FIG. 20),
Specialized embedded streaming macros for simultaneous input/output streaming (FIG. 21).

Embodiments according to the invention create design methodologies for building FPGA-based systems:
Communication infrastructures with fixed specified timing delays
Hardware linking for integrating multiple modules into one system without an additional place and route step.
Integration of modules designed for different sized FPGAs within the same FPGA family by hardware linking.
Multi instantiation of a module by duplicating the configuration data within a hardware linking step.
(Offline) bitstream manipulation for setting individual module parameters.

Efficient Reconfigurable On-Chip Buses for FPGAs

The following sections present techniques for generating on-chip buses suitable for dynamically integrating hardware modules into an FPGA-based SoC by partial reconfiguration. In contrast to other approaches, our generated buses permit direct connections of master and slave modules to the bus in, combination with a flexible fine-grained module placement and with minimized latency and area overheads. The generated reconfigurable buses can be easily integrated into classical design flows and can consequently be used to reduce system cost by time variant FPGA resource sharing and/or to enhance component-based system design by specifying encapsulated and exchangeable interfaces that allow to compose systems based on completely routed components.

The performance of our techniques will be demonstrated by a test system that is capable to transfer 800 MB/s and a comparison with the best competing design will show a 7-8 times area improvement, while providing a higher placement flexibility.

Some embodiments relate to an FPGA, On-chip-bus, Partial runtime reconfiguration Introduction The ability of partial reconfiguration allows FPGA-based systems to adapt to different demands that can occur anytime at runtime. As a consequence, such systems can react on resource defects, time variant work load scenarios, or changing system environments (e.g. the remaining battery life time of a mobile system) by modifying fractions of the hardware.

The practical applications for partial runtime reconfiguration are manifold. For example, it may be used to exchange some modules after the start-up phase. In this case, an FPGA may be configured with test modules, boot-loader modules, or a cryptographic accelerator to speed up some authentication processes in a secure embedded system at start-up. In the following, when these modules are not longer needed, we can use the same resource area for the application tasks of the system. In another embodiment, reconfiguration may be used to adapt a system to time-variant demands. For example, at daytime we may have a high demand for voice-over-IP packets in a network processing system, while later the system may adapt to some other protocols by partial reconfiguration. At nighttime, we may change the configuration to packet processing units optimized for reduced power consumption.

The main goal of utilizing partial runtime reconfiguration is to reduce the FPGA size and consequently cost and power consumption. This may help to apply FPGA technology in systems where cost and power constraints would otherwise demand (Structured-) ASIC implementations. However, partial runtime reconfiguration comes along with 1) resource overheads for providing the communication to partially reconfigurable modules and for the reconfiguration management, 2) timing penalties for the communication, and 3) a more complicated design process. These circumstances have prevented a wide usage of partial runtime reconfiguration in commercial applications. In these days, the runtime reconfiguration facilities of some FPGAs (such as all Xilinx Virtex FPGA families) are used at the most for field updates but seldom for a time-variant resource sharing.

FIG. 22a shows an example of a traditional FPGA-based System on a Chip (SoC)

In order to take more benefit from partial runtime reconfiguration, we have developed an efficient reconfiguration interface module [13] that allows module relocation and high speed reconfiguration with up to 400 MB/s through bitstream decompression (on Xilinx Virtex-V devices) while only consuming about a 100 look-up tables. In this disclosure, we present a reconfigurable bus architecture and corresponding tools which extends current SoC designs on FPGAs such that not only static peripherals may be integrated, but also hardware modules may be dynamically integrated into the SoC as shown in FIG. 22b. FIG. 22b shows an alternative system that allows exchanging reconfigurable master or slave modules through partial reconfiguration in order to share reconfigurable resource slots over time. This work presents methodologies that allow to change modules connected to a reconfigurable bus offering the following main features:

i) Direct interfacing: Reconfigurable modules have a direct interface to the on-chip bus (OCB) with the option to include bus masters to the bus.
ii) Module relocation: Instead of binding modules to a fixed reconfigurable area, they can be placed freely within the span of the reconfigurable OCB.
iii) Flexible widths: Modules can be connected to the bus with a fine module grid. The module grid is a quantity for the granularity of how fine the bounding box of a module can be adjusted to just fit the area demands of a particular module.
iv) Multiple instances: Modules can be instantiated a couple of times and connected together to the bus.
v) Low logic overhead to implement the bus architecture.
vi) High performance: The communication bandwidth and the latency of the reconfigurable bus can compete with traditional static only systems.

All points together permit to exchange communicating hardware modules in a system at runtime in a way that can be compared to an exchange process of a card plugged into a backplane bus. But here, partial reconfiguration is used to automatically plug-in a new module to the system and the complete system may be integrated on a single FPGA.

The disclosure continues as follows: After giving an overview of the related work in the field of integrating reconfigurable hardware modules into SoCs at runtime in the following section, we will present our new techniques for building flexible and fast reconfigurable buses in the section entitled new technologies for dynamically reconfigurable busses. Afterwards, in the section entitled experimental results, we demonstrate the capabilities and performance of our techniques by some examples.

Related Work

Buses

A bus is the most common way for linking together communicating modules within an SoC. All major FPGA vendors offer tools that allow easily integrating a set of user-defined modules or IP cores into complete systems by the use of on-chip buses. Consequently, buses are good candidates for integrating also partially reconfigurable modules into a system at runtime. Most work done in this field is based on older Xilinx Virtex FPGA architectures that provide wires spanning over the complete horizontal device width and that can be used to build buses with tristate drivers [20, 16, 12, 6, 18]. However, tristate buses come along with some place and route restrictions and necessitate timing parameters that should be met to turn buffers on-and-off. This leads typically to lower clock speeds as compared to multiplexer-based buses. Consequently, most established bus standards including AVALON, CoreConnect, and Wishbone provide multiplexer-based bus implementations with unidirectional wires and all newer FPGA architectures possess no more internal tristate drivers.

It is advantageous to implement the communication infrastructure for partially reconfigurable modules in such way that logic and routing resources that are related to the module communication are located in a homogenous manner. This allows modules to be exchanged and relocated to different positions on the chip. In the case of a bus, this means that it should be constructed in a regular fashion with regular tiles, each having exactly the same internal logic and routing layout for providing the connectivity among the tiles and to the modules. This is straightforward to implement for shared bus signals, when studying FIG. 23, but it comes along with some difficulties for providing dedicated signals (e.g., Interrupts or module selects), because of their inhomogeneous routing nature. FIG. 23 shows an example of a system consisting of a master and two slave modules communicating through a bus.

New Techniques for Dynamically Reconfigurable Buses

In this section, we will present techniques for building buses that support a direct plugging or unplugging of modules into an SoC through partial runtime reconfiguration. These buses may meet any common standards including, e.g., AMBA, AVALON, CoreConnect, or Wishbone. In addition, our methodologies aim for reconfigurable buses with numerous sockets for a fine-grained module placement in combination with high throughputs, low latencies and low area overheads. We prevent the usage of tristate drivers in order to support a wide range of different FPGA architectures which in particular includes newer devices like Xilinx Virtex-IV and Virtex-V FPGAs.

A bus is a set of signals having different purposes (see FIG. 23) that establish a shared communication medium between different modules connected to the bus. These modules can be divided into two classes namely 1) master modules and 2) slave modules. Only masters are allowed to control the bus, whereas slaves are only allowed to respond to requests from a master. However, by the use of interrupt lines, slaves can notify a master to initialize a communication with a master. The Table shown in FIG. 24 (also designated as "Table 1") presents an overview of signals found in typical on-chip buses. The table distinguishes whenever signals are driven by masters (write) or by slaves (read). Furthermore, the table differentiates if a signal is shared among different modules, or if there is a dedicated connection between a slave or a master module provided by the bus. Each quadrant in the table represents an own problem class requiring individual solutions for being efficiently implemented on FPGAs.

TABLE 1

Classification of Bus signals (see also FIG. 23).

|  | shared | dedicated (non-shared) |
|---|---|---|
| write | address<br>data_out<br>write_enable<br>read_enable<br>byte_select | module_enable<br>bus_request* |

TABLE 1-continued

Classification of Bus signals (see also FIG. 23).

|  | shared | dedicated (non-shared) |
|---|---|---|
| read | data_in<br>address_in | interrupt<br>wait_request<br>bus_grant* |

If multiple masters are connected to the same bus, an arbiter is essential to resolve conflicts. The communication of an arbiter takes only place with the master modules by the use of dedicated bus signals for each master (e.g., bus_request or bus_grant). However, with respect to reconfigurable on-chip buses, these bus signals form no extra problem class. For instance, an interrupt request of a slave to a master is basically the same problem as a bus request to an arbiter. Thus, we will not further discuss the communication with an arbiter.

In the following, we assume that partially reconfigurable modules are bound to rectangular regions. This can be achieved by applying some place and route constraints to the interchangeable modules. In addition, dedicated signals may be defined and constrained to be mapped to the same wires so that a static part of a system can communicate with a dynamic reconfigurable part of the system over these wires. Such wires will be used to link together the static and the dynamic part of the system among different modules placed into an area allocated for dynamically partial reconfiguration. There exists a lack of adequate constraints on wires inside commonly used synthesis tools that prevent the tools to map a signal to a specific (user-defined) wire or a set of wires. However, this lack can be avoided by constructing macros built of logic resources that will be used as connection points in combination with the desired wires between this resources. Such macros allow to constrain signals to fixed wires in such a way that communication between a static part and a dynamic reconfigurable part of a system can be performed among different partial modules.

After introducing a generic FPGA architecture model, we will present our new techniques for implementing each problem class that is listed in Table 1 separately in the following four sections. All these different approaches are suitable for building special macros and come along with some specific advantages that can be discussed with respect to the resource requirements, latency aspects, and system integration issues.

Generic FPGA Architecture Model

Figure 25:
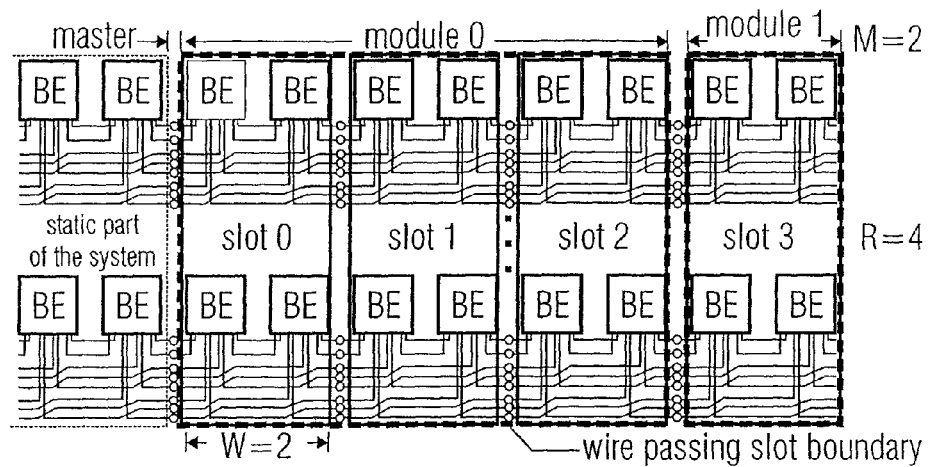
FIG. 25 shows a block schematic diagram of a simplified FPGA architecture model.

Our assumed FPGA architecture model is presented in FIG. 25. FIG. 25 shows a simplified FPGA architecture model. The shown basic elements (BE) contain the programmable switches and the logic resources. On Xilinx FPGAs a BE would be equivalent to a so-called complex logic block (CLB) [21] that consists of multiple look-up tables (LUT) for implementing the logic functions. The equivalent to an CLB on FPGAs from Altera Inc. is called a logic array block (LAB) [3]. However, all commercial available FPGAs follow the assumed FPGA architecture model in FIG. 25. Hence, all FPGAs are suitable to implement our reconfigurable bus architecture.

To simplify the figure, we illustrated only some horizontal routing wires. The wires may be arranged in any regular horizontal or vertical fashion. Onto such architecture, we will build the logic and the routing of our reconfigurable bus architecture. The system will be divided into a static part that typically contains a CPU for managing the reconfigurable area and the resource slots for hosting the partially reconfigurable modules. The system provides altogether R identical slots that are W BEs wide and up to M modules may be connected to the bus at the same time. A resource slot is equivalent to a socket in a traditional backplane system and modules may use resources from multiple slots in such way that only signals from the reconfigurable bus will pass a module's border. Note that some commercial FPGAs may contain a few irregularities in the otherwise homogeneous architecture of the device. For instance, some FPGAs provide dedicated RAM blocks that may necessitate to widen selectively resource slots that contain such irregularities in order provide a homogeneous structure of the bus with respect to the wires that cross a resource slot boundary.

In all following figures that show some bus details, the static part is located at the left side of the bus and the bus is horizontally aligned. This matches best to Xilinx FPGAs that feature a column based configuration scheme. However, the presented techniques can be transferred easily to build reconfigurable on-chip buses towards any direction.

Shared Write Signals

Figure 26A:
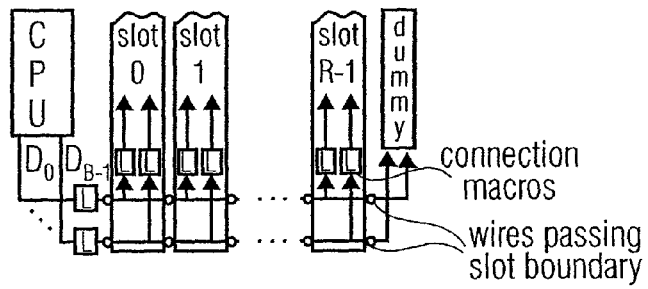
FIG. 26a shows a block schematic diagram of a distribution of shared write data from the master (CPU) in a common case, wherein each signal has to pass a connection macro (e.g. a LUT) in each slot of the bus (explicit connection)

Examples for write signals shared by multiple masters and slaves are address lines, write data lines, and read or write control signals. For dynamically reconfigurable buses, all approaches that can be found up to now are based on a macro approach [17] that necessitates some logic resources inside every module connection point for shared signals driven by a master. Thus, a 32-bit data bus would occupy also additional 32 look-up tables (or some other logic resources) multiplied by the number of resource slots R just for supplying the write data from the bus to the reconfigurable modules. Instead of connecting module signals with bus signals explicitly through connection macros (see FIG. 26a)), our approach allows to connect shared write signals directly to the modules. Such a direct connection to a bus signal is not bounded to a fixed location. The only restriction is that such a connection does not utilize routing resources outside the bounding box of the module. Therefore, we call this an implicit connection.

Figure 26B:
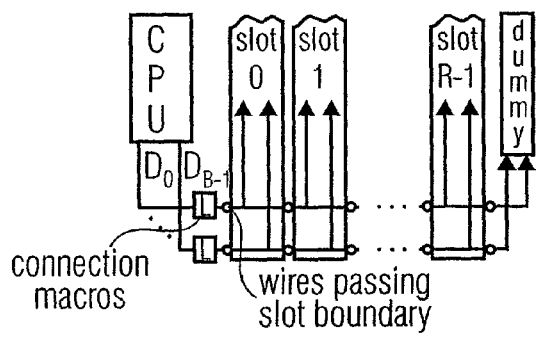
FIG. 26b shows a block schematic diagram of a distribution of shared write data from the master (CPU) according to an inventive technique, wherein the inventive technique allows connecting the modules directly to the wires forming the bus (implicit connection)

FIG. 26 shows a distribution of shared write data from the master (CPU). In the common case a), each signal has to pass a connection macro (e.g., a LUT) in each slot of the bus (explicit connection). In contrast, our technique b) allows connecting modules directly to the wires forming the bus (implicit connection).

In order to allow a relocation of modules connected to the bus, we have to constrain the routing such that bus signals occupy the same equivalent routing wire within and at the edges of the resource slots. This necessitates a dummy termination resource right to the last module slot, as shown in FIG. 26. Note that one logic resource may be used to terminate multiple bus wires of a master write signal. A LUT, for example, can terminate a wire at every input, thus making the overhead for the dummy sink negligible. When using the implicit connection technique, the amount of k-bit look-up tables $L_{SW}$ needed to distribute $S_{SW}$ shared write signals is:

$$L_{SW} = S_{SW} + \left\lceil \frac{S_{SW}}{k} \right\rceil \quad (1)$$

Dedicated Write Signals

Figure 27A:
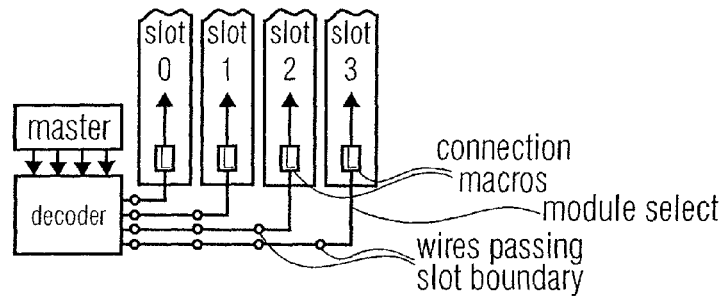
FIG. 27a shows a block schematic diagram of a distribution of module enable signals using an inhomogeneous routing.

A bus master usually demands some control wires connected directly to an individual slave where such a particular signal is not shared among other slaves. An example for such a dedicated control signal is a module_select signal that is equivalent to a chip_select or a chip_enable signal. In the following, we will describe how a master can activate a specific module_select signal by applying an according address onto the bus. A straight implementation for distributing dedicated master write signals would be to use an inhomogeneous routing scheme as presented in FIG. 27a). FIG. 27a shows a distribution of module enable signals using inhomogeneous routing. This has been demonstrated in [18] and [6] and comes along with some drawbacks for flexible partial reconfiguration as mentioned in the section entitled related work.

Figure 27B:
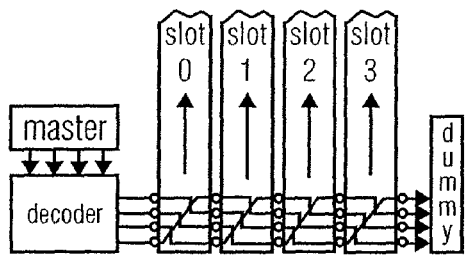
FIG. 27b shows a block schematic diagram of a distribution of module enable signals using a homogeneous routing formed by rotating module select signals.

To overcome the limitations of a non-uniformed routing of module select signals, different approaches have been proposed and the most practical ones can be summarized into three groups: 1) A slot-wise rotated module select distribution scheme, as shown in FIG. 27b), is discussed in [9]. FIG. 27b shows a distribution of module enable signals using homogeneous routing formed by rotating module select signals. The next group 2) is based on fixed resource slot addresses and has been proposed in [11] and was also used in [8]. This approach is tailored to Xilinx FPGAs, where the flip-flops in the basic elements keep their state despite a configuration process. Some of these flip-flops have been used to store an individual fixed address that is compared within each resource slot with an address supplied by a master to the bus. The last group 3) uses a counter in each resource slot to decrement the incoming address that is send further to the next consecutive slot performing the same operation. The slot getting a zero at its input will be the selected one. This approach results in an unlikely deep combinatorial path of counter stages. However in [14] this technique was efficiently used for a serial bus to access individual reconfigurable modules in a system where access times do not matter.

In all these three groups, the amount of look-up tables needed for a complete bus implementation of a system providing R resource slots scales with $R \times \log_2(R)$ LUTs for the address decoder in 1), the comparator units in 2), or the counters in 3). Thus, it is useful only for smaller systems providing only a few slots.

Reconfigurable Select Generators

So far, for all presented approaches, the system accessing a reconfigurable module should be aware of the resource slot position in order to access a particular module. For instance, this demands that a software driver for a reconfigurable module may have to update the base address if the module could be placed to different positions at the bus. In order to simplify the hardware-software interface, we designed so called reconfigurable module select generators where modules can be accessed individually independent to the placement by configuring a module address directly into the resource slots providing the bus sockets. This configuration process is carried out on two levels. Firstly, after loading a module onto the FPGA device through partial reconfiguration (device level), the module will be in a state where it is deactivated (e.g., by applying a module wide reset) and where it is logically isolated from the bus. In this state, the module select generator can be configured on the second level, the system level, in order to write the particular module address upon which the specific module_select signal is to be activated in the following.

Figure 28:
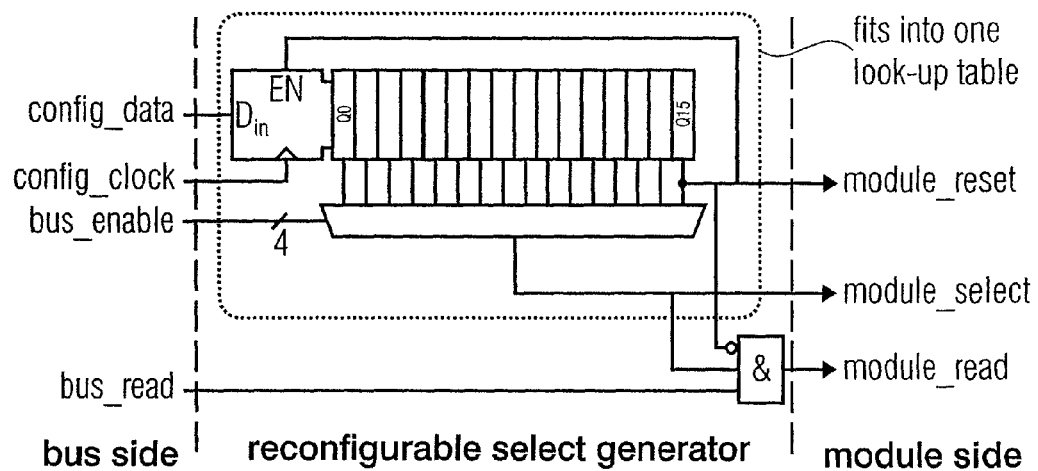
FIG. 28 shows a block schematic diagram of a re-configurable select generator based on a shift register primitive.

FIG. 28 shows a reconfigurable select generator based on a shift register primitive. At FPGA reconfiguration time, the shift-register is enabled by configuring a 1 to all LUT values (Q0, . . . , Q15). In the following, a configuration word starting with a 0 is shifted into the LUT for self locking the register after shifting a complete new table into the LUT (Q15=0). This automatically releases module_reset and the register is used in the LUT mode to generate the module_select signal by decoding the bus_enable signal.

Figure 29:
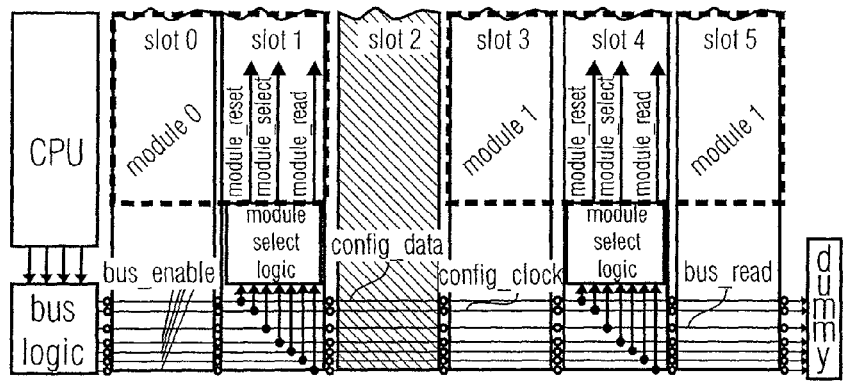
FIG. 29 shows a block schematic diagram of a system composed of a CPU and some modules of different widths, wherein each module necessitates one module select block that contains the re-configurable select generator shown in FIG. 28.

FIG. 28 presents the approach of our methodology tailored to distributed memory FPGA architectures, such as all Xilinx Virtex devices, where look-up tables can also be used as memory and as shift registers. In addition, FIG. 29 gives an example of how such reconfigurable select generators are used within the bus. FIG. 29 shows a system composed of a CPU and some modules of different widths. Each module necessitates one module select block that contains the reconfigurable select generator shown in FIG. 28.

Whenever the FPGA is configured for plugging in a new module, one look-up table that is implementing the logic of a reconfigurable select generator will be used in the shift-register mode and it will be initialized completely with ones. Thus, the cascade output Q15 in FIG. 28 becomes one, too. This will enable the shift register and additionally activate the module_reset signal provided to the attached module. After this first configuration step, the look-up table of the reconfigurable module select generator is armed to be filled with a function table for decoding the module_select output based on the bus_enable input in a second configuration step. This is performed by shifting in a zero followed by typically a one-hot encoded value by the use of the config_data and the config_clock inputs. The zero value in the beginning will automatically lock the shift register and will further release the module_reset signal when the second reconfiguration process finishes.

Note that the select generator can be used as a reconfiguration sensor that indicates at the module_reset output if a resource slot was involved in a reconfiguration process. The rest of the look-up table values depends on the address of the bus_enable signal at which the module_select output is to be activated. For instance, if we take the reconfigurable select generator in FIG. 28 and if we want the module_select signal to be active only when the bus_enable signal is equal to 0011, then we have to shift the value 0001 0000 0000 0000 into the look-up table. By configuring more than one 1 value to the table it is possible to use the configurable select generator for multicast operations. For instance, let us assume that we have a module 1 mapped to the bus_enable address 0001 and a module 2 mapped to 0010 and that both modules should further be accessible at the multicast address 0100. Then we have to shift the value 0100 1000 0000 0000 into the look-up table of the select generator in module 1 and the value 0010 1000 0000 0000 into the LUT in module 2. Note that in the case when bus_enable is equal to 1111, no module is selected, because this address is reserved for the cascade output Q15 locking the shift register. Thus, it is possible to generate $2^k-1$ individual module select signals when using one k-input LUT as a shift-register inside the reconfigurable module select generator. On all Xilinx Virtex FPGAs it is possible to cascade the shift register with an additional flip-flop within the logic blocks, what can be used to generate module_select signals for up to $2^k$ individual modules.

With this enhancement, the complete amount of look-up tables $L_{DW}$ needed to provide $S_{DW}$ dedicated master write signals in all R resource slots is for systems with up to M simultaneously running modules:

$$L_{DW} = R \cdot S_{DW} \cdot \left\lceil \frac{M}{2^k} \right\rceil + I_{config}. \quad (2)$$

Where $I_{config}$ denotes the amount of LUTs needed to implement the configuration interface for the second configuration step. As k is at least 4 in current FPGA architectures $L_{DW}$ becomes $R \times S_{DW} + I_{config}$ for most practical systems. Thus, we can provide high flexibility and simple system integration at little hardware cost.

Shared Read Signals

As a counterpart to shared write signals, the bus has to provide some signals in backward direction for driving data from a selected module through some shared wires to the static part of the system. An example for shared read signals is the read data bus from several slaves to a master located in the static part of the system. Typical on-chip buses for completely static systems use unidirectional wires and some logic in order to avoid on-chip tristate buses as demonstrated in FIG. 30a). FIG. 30a) shows a common implementation of a shared read signal in a multiplexer-based bus. This structure can be implemented in a regular distributed read multiplexer chain that is especially suitable for partial reconfiguration as presented in FIG. 30b). FIG. 30b) shows a distributed read multiplexer chain implementation that is suitable for partial reconfiguration This technique has been used in [11], [8], and [4]. However, using distributed read multiplexer chains for connecting partial reconfigurable modules by a bus leads to very long combinatorial paths and consequently to low bus throughputs.

Figure 31:
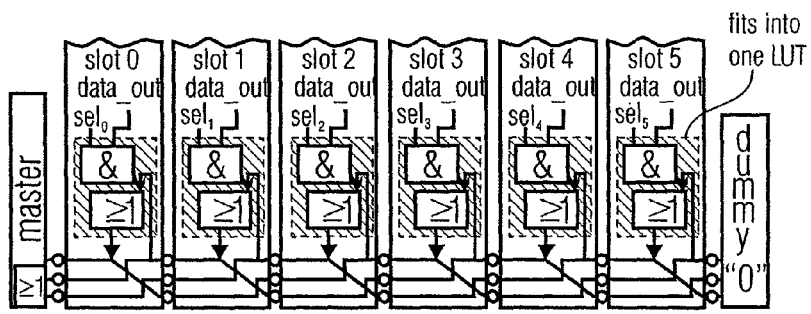
FIG. 31 shows a block schematic diagram of multiple interleaved read multiplexer chains, which allow reducing the bus latency.

This is unlikely to be solved by the use of pipeline registers within each resource slot, because this would lead to position dependent latencies. Instead to this, we accelerated the simple read multiplexer chain by interleaving N chains in such a way that the output of an OR-gate from one resource slot is connected to a slot that is located N positions further towards the static part of the system as shown in FIG. 31. FIG. 31 shows multiple interleaved read multiplexer chains allow reducing the bus latency.

Beside the latency issues, the simple chained read multiplexer chains for connecting partial reconfigurable modules by a bus necessitate $L_{SR}^{SC}=(1+R)\times S_{SR}$ look-up tables for connecting $S_{SR}$ shared master read signals in each resource slot and for the resources providing the connection to the static system (not shown in the figures). We do not further consider the necessitated dummy sources as they can be shared with other dummy LUTs. In the case of N interleaved read chains, it necessitates $$L_{SR}^{IC} = \left(\left\lceil\frac{N-1}{k-1}\right\rceil + R\right) \cdot S_{SR}$$

k-bit LUTs to implement the final OR-gate and the read multiplexer chain. When N≤k, then $L_{SR}^{IC}$ is equal to $L_{SR}^{SC}$.

For increasing the placement flexibility (slot position and module width), it is desirable to reduce the resource slot width W while increasing the number of resource slots R. Unfortunately, this would enormously increase the look-up table count. In addition, this would waste logic inside the resource slot, because modules will typically occupy more than one slot and a module requiring r resource slots would leave $(r-1)\times S_{SR}$ look-up tables unused, because one plug would be sufficient to connect this module to the bus. Furthermore, practical experience showed that the interface width is usually related to the complexity (=size) of the according module and consequently to the amount of needed resource slots. For instance, a master module may necessitate more shared read signals for driving its address and data signals on the bus and demands more logic resources for implementing the bus logic as compared to a simple slave module. (According to our classification of bus signals in Table 1, the address output of a master port is a shared read signal with respect to the static part of the system.). Hence, wider interfaces with more shared master read signals are usually only necessitated for modules occupying multiple resource slots.

Figure 32:
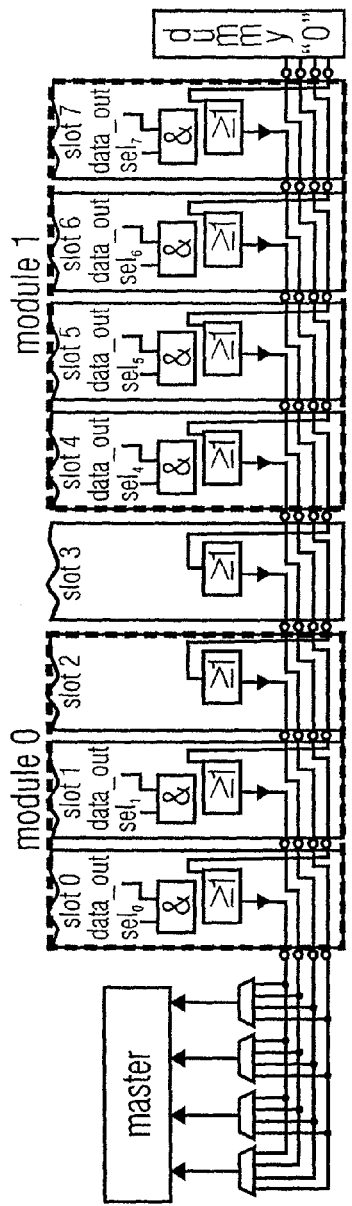
FIG. 32 shows a block schematic diagram of a multi-slot read technique with N=4 interleaved read multiplexer chains and additional attached alignment multiplexers.

This observation has led us to the multi-slot read technique that provides only a subset of all shared read signals within a resource slot while allowing to combine consecutive slots for connecting more read signals to the bus as demonstrated in FIG. 32. FIG. 32 shows a multi-slot read technique with N=4 interleaved read multiplexer chains and additional attached alignment multiplexers. In this approach, again N distributed read multiplexer chains are interleaved for reducing the signal latency. In order to establish a better relationship with existing systems, let us assume that each signal shown in the figure represents one byte and that the data width of the bus is up to 32-bit. Then module 0 has a 16-Bit interface while module 1 uses the complete interface width of the bus. In our example, modules may have interface widths of 8, 16, 24, and 32 bits, thus requiring at least 1, 2, 3, or respectively 4 resource slots. Additional alignment multiplexers in front of the master arrange the order of the incoming sub-words according to the master interface and they allow to place modules regardless to the first bus socket. This necessitates a small register file, that stores for each module the position of the most left used bus socket modulo N for controlling the alignment multiplexers, e.g., a 0 for module 1 in the example in FIG. 32. This register file can be implemented efficiently on distributed memory FPGA architectures by using a few LUTs as a dual-ported RAM primitive.

If the alignment multiplexer is implemented with two LUTs for each shared read signal $S_{SR}$, then the amount of look-up tables for implementing the multi-slot read technique with N interleaved chains and R resource slots is:

$$L_{SR}^{MR} = 2 \cdot S_{SR} + \left\lceil \frac{S_{SR}}{N} \right\rceil \cdot R. \quad (3)$$

Under all circumstances, the bus logic has to prevent modules to drive data to a shared signal if the module is not selected. This is ensured by the reconfigurable select generators (see the section entitled dedicated write signals) by connecting the select inputs of a read multiplexer chain (abbreviated with sel in the figures) for one module to the module read output of the according reconfigurable select generator within the same slot.

Appraisal of Results

In this section, we have presented various techniques for efficiently implementing regular bus structures for any kind of bus signal. Even if we design systems with lots of resource slots, the amount of additional logic needed for providing the communication will remain within reasonable limits. The benefit of our techniques becomes obvious if we compare it with the most advanced competing solution. In [8] an advanced bus based communication infrastructure was presented that aims also on a flexible module placement, varying module sizes, and the capability to instantiate a module multiple times. The authors presented a case study of a 32-bit Wishbone compatible bus implementation with 16 resource slots, each capable to host a master or a slave module. Already the bus needed 4072 dense packed slices (=logic units providing two 4-bit LUTs) and 2380 tristate drivers what is equivalent to 18% of the complete logic resources available on the test device (a Xilinx VirtexII-4000-4 FPGA). By applying our techniques, the implementation of the case study in [8] would need only 1054 LUTs (≈550 slices) and no tristate drivers or 2.3% of the logic resources. In this case we would offer the double density of resource slots (R=32) within the same overall width of the bus. Note that we are the first providing such high densities for the placement of reconfigurable modules. If we interleave N=4 chains, the look-up table count would be as follows:

$L_{SW}$=88 LUTs for altogether $S_{SW}$=70 shared master write signals (32-bit data, 32 address lines plus 4 byte select signals, and 2 control signals) (see Eq. 1).

$L_{DW}$=96 LUTs for together $S_{DW}$=3 dedicated master write signals (a module select, a read enable, and a master grant) (see Eq. 2).

$L_{SR}$=714 LUTs for all $S_{SR}$=69 shared master read signals (32-bit data, 32 address lines plus 4 byte select signals, and 1 read/write signal) (see Eq. 3).

$L_{DR}$=128 LUTs for $S_{DR}$=16 dedicated master read signals (bus request or interrupt) (see Eq. 5).

28 LUTs for the configuration interface used at the system level to assign addresses and interrupts to the individual modules.

Beside the massive logic savings, our solution would further allow to place modules in a finer grid and to take modules in smaller bounding boxes. In addition, as shown in the following section, our solution has lower latencies for providing a higher throughput.

We can also roughly estimate how much logic a completely static design would necessitate to implement a bus for a system that is not capable for exchanging modules by partial reconfiguration. If we assume a system with altogether 6 masters (each one also providing a slave interface) and 6 additional slaves, it necessitates (32+4)·5=180 LUTs for the address-multiplexer and another 32·10=320 LUTs for the read-data-multiplexer with 12 inputs. (The values for the needed 4-bit look-up tables to build a 6:1-multiplexer are from the QuartusII IP-MegaCore-Wizard obtainable by the Altera cooperation. According to this, a single 6:1-multiplexer necessitates 5 LUTs and a 12:1-multiplexer necessitates 10 LUTs, respectively.) If we assume that all dedicated signals and shared master write signals are distributed without additional logic, our technique necessitates about the double amount of logic resources to provide a reconfigurable system backplane bus. Thus, we can conclude that applying our technology starts to amortize even if just relatively small parts of the resources are shared over time and the benefit increases rapidly with the amount of shared FPGA resources.

Experimental Results

In this section, we will demonstrate that our reconfigurable bus architecture allows a high throughput on available FPGAs. In order to determine the throughput on different FPGAs, we will firstly present a parametrizable timing model and some synthesis results to determine the signal latencies for different implementation variants of the bus. After this, we reveal details of an test system that is capable to transfer up to 800 MBytes/s over our bus technology without any timing or logic influence due to partial reconfiguration processes.

Timing Behavior

Figure 33:
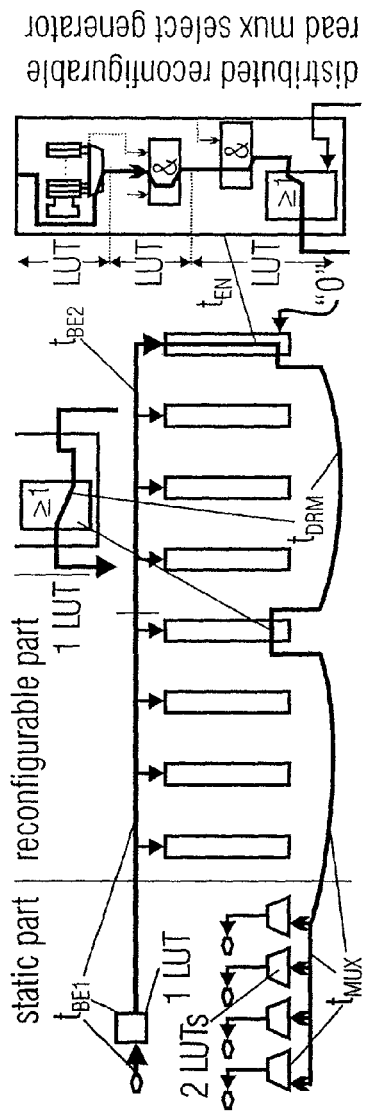
FIG. 33 shows a schematic representation of propagation delays of read operations.

The maximum throughput of a bus is given by the data word width B of the bus multiplied by the reciprocal of the propagation delay $t_{prop}$ of the most critical combinatorial path. With respect to our proposed reconfigurable bus architecture, we found the critical path on data read operations. This path consists of a forward path with the module select logic (see FIG. 28 and FIG. 29) and a backward path consisting of a distributed read multiplexer followed by a final multiplexer for aligning the correct byte order (see FIG. 32). We can define a timing model for this path that is independent of the final FPGA implementation based on the bus architecture presented in FIG. 33. FIG. 33 shows propagation delays of read operations. If the bus architecture is built upon N interleaved read multiplexer chains, the annotated delays in the architectural view have the following meanings:

TABLE 2

Propagation delays (in ns) reported for some examined FPGAs.

| FPGA | Spartan 3-4 | | Virtex II-6 | | Virtex IV-11 | |
|---|---|---|---|---|---|---|
| | W = 1 | W = 2 | W = 1 | W = 2 | W = 1 | W = 2 |
| $t_{BE1}$ | 1.637 | 1.972 | 1.095 | 1.581 | 1.828 | 1.415 |
| $t_{BE2}$ | 0.335 | 0.670 | 0.486 | 0.972 | 0.374 | 0.748 |
| $t_{EN}$ | 1.239 | 1.239 | 1.988 | 1.988 | 1.244 | 1.244 |
| $t_{DRM}$ | 1.563 | 1.535 | 0.986 | 1.053 | 0.658 | 0.691 |
| $t_{MUX}$ | 3.169 | 4.098 | 2.068 | 2.099 | 1.531 | 1.801 |

$t_{BE1}$ denotes the time needed for a bus_enable signal to pass a connecting dummy resource plus the propagation delay for the wiring to the reconfigurable select generator within the first N resource slots (see FIG. 29).

$t_{BE2}$ specifies the additional time to reach the select generator that is N resource slots further away.

$t_{EN}$ gives the propagation delay for the reconfigurable select generator (see FIG. 28) plus the chunk of a distributed read multiplexer that feeds in the data.

$t_{DRM}$ specifies the time to pass the look-up table of one distributed read multiplexer stage plus the propagation delay on the wiring between two chunks.

$t_{MUX}$ is the propagation delay for the alignment multiplexers and the routing within the first N resource slots.

All these timing values specify the worst case propagation delay over all considered wires within a particular case, thus, leading to conservative estimations. The values allow extrapolating the propagation delay to any size of the bus:

$$t_{prop} = \underbrace{t_{BE1} + t_{EN} + t_{MUX}}_{fixed} + \underbrace{\lambda \cdot (t_{BE2} + t_{DRM})}_{variable} \quad (6)$$

The factor $\lambda$ specifies the width in addition to the first N resource slots of the complete reconfigurable bus as a multiple of the number of interleaved distributed read multiplexer chains N. Thus, the complete bus offers $R=(\lambda+1)\cdot N$ resource slots, each capable to connect a module.

As we have obtained all experimental results with Xilinx FPGAs, where a basic building block is called a CLB (complex logic block), we will bound our following examinations to CLBs only. A CLB provides 8 look-up tables, thus a resource slot being W CLBs wide and H CLBs high provides 8·W·H LUTs and the complete reconfigurable resource area provides 8·($\lambda$+1)·N·W·H LUTs respectively. We have to reduce these values by the bus logic requiring a few percent of the logic, as shown in the section entitled appraisal of results).

Figure 34:
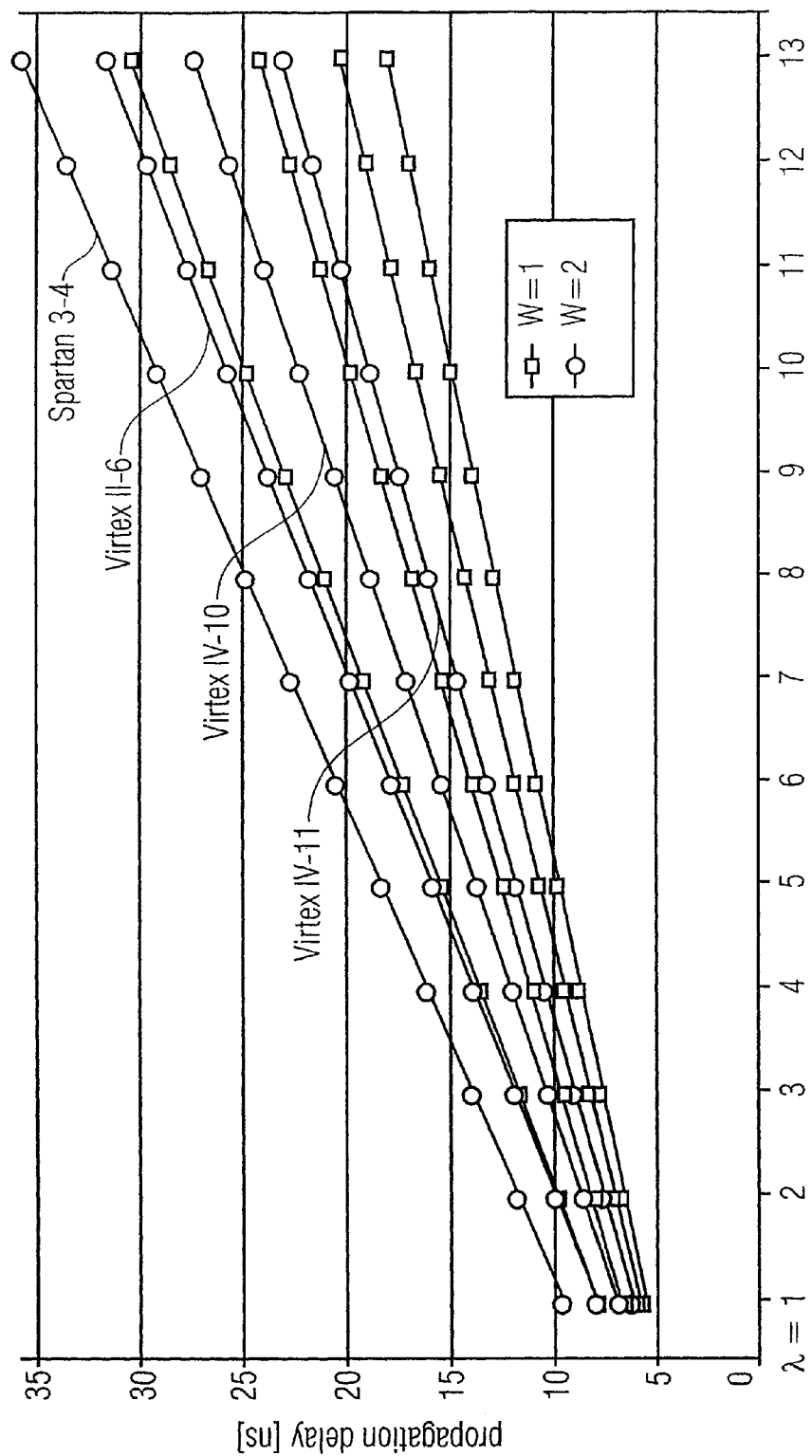
FIG. 34 shows a graphical representation of extra propagation delays for different FPGAs over $\lambda$ for the width W=1 and W=2.

We have implemented buses with a data word width of B=32 for the resource slot width of W=1 and W=2. Note that such high densities have never been reported before and the best competing solutions [8] and [12] achieve just a W of 4. The reported propagation delays for the critical read data path are listed in Table 2 and FIG. 34 displays the extrapolated delay over the number of attached resource slots $\lambda$. FIG. 34 shows extrapolated propagation delays for different FPGAs over $\lambda$ for the widths W=1 and W=2. The Figure allows to determine possible bus parameters for a given time budget. In the case of high speed buses e.g., with 100 MHz ($t_{prop}$=10 ns) we see that only narrow buses with only a few resource slots are implementable. For instance, the slowest device, the Spartan3-4 would provide up to R=(2+1)*4=12 slots when W is chosen to 1. Note that for W=2 the system may only provide 8 resource slots for all partial modules, but the complete Bus would be W·R=16 CLB-columns wide.

Example System

Current synthesis tools are not able to directly use our techniques for building reconfigurable buses. As a consequence, we built a tool called ReCoBus-Builder that allows to parameterize and to generate a monolithic macro containing the complete logic and routing of a reconfigurable bus. Currently, the tool is supporting all Spartan 3, Virtex II(Pro), and some Virtex IV FPGAs from Xilinx.

Figure 35:
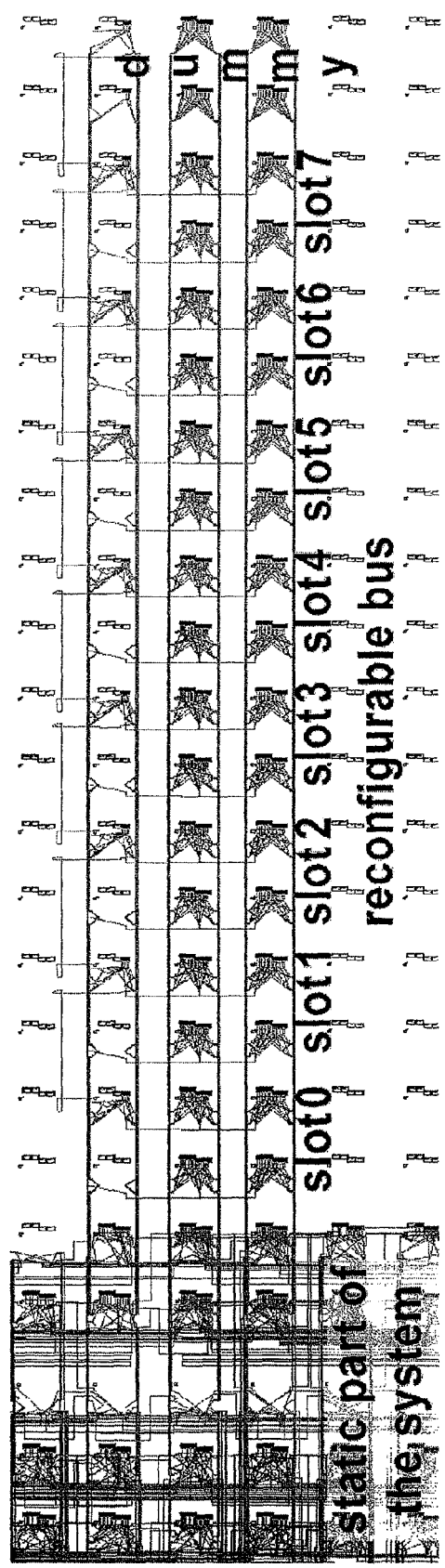
FIG. 35 shows a graphical representation of an un-pipelined bus with 8 resource slots and a dummy resource slot at the left-hand side of the bus, wherein each resource slot is W=2 CLB columns wide and allows for connecting a slave with data bus width of up to 32 bits.

In order to demonstrate our methodology, we built a system containing a stimuli pattern generator in the static part of the system that is connected to a reconfigurable bus on a Xilinx Virtex II-6000-6 FPGA. After specifying the bus parameters with B=32 bit and R=8 resource slots that are not interleaved (N=1) and that are W=2 CLB-columns wide, our tool ReCoBus-Builder generated a macro containing the complete logic and routing of the bus. In addition to these parameters, the user can chose between simple slave or master mode and it is possible to select up to two address buses (in the slave mode) for simultaneous read and write operations. We also generated macros that are completely compatible to the Wishbone standard and that support to integrate given IP-cores without any interface modifications into a reconfigurable bus-based system. Note that these macros can be directly instantiated by the Xilinx tools. However, in these systems, we achieved only clock rates of up to 50 MHz that was limited by the IP-cores but not by the bus. As a consequence, we implemented a special stimuli generator for testing our buses at full speed. The stimuli generator contains a set of simple test modules that consist of a small amount of logic and an output register (adders, Boolean functions, and permutations). A chip view on this system is presented in FIG. 35. FIG. 35 shows an unpipelined reconfigurable bus with eight resource slots and a dummy resource slot at the left hand side of the bus. Each resource slot is W=2 CLB columns wide and allows for connecting a slave with a data bus width of up to 32 bit.

Figure 36:
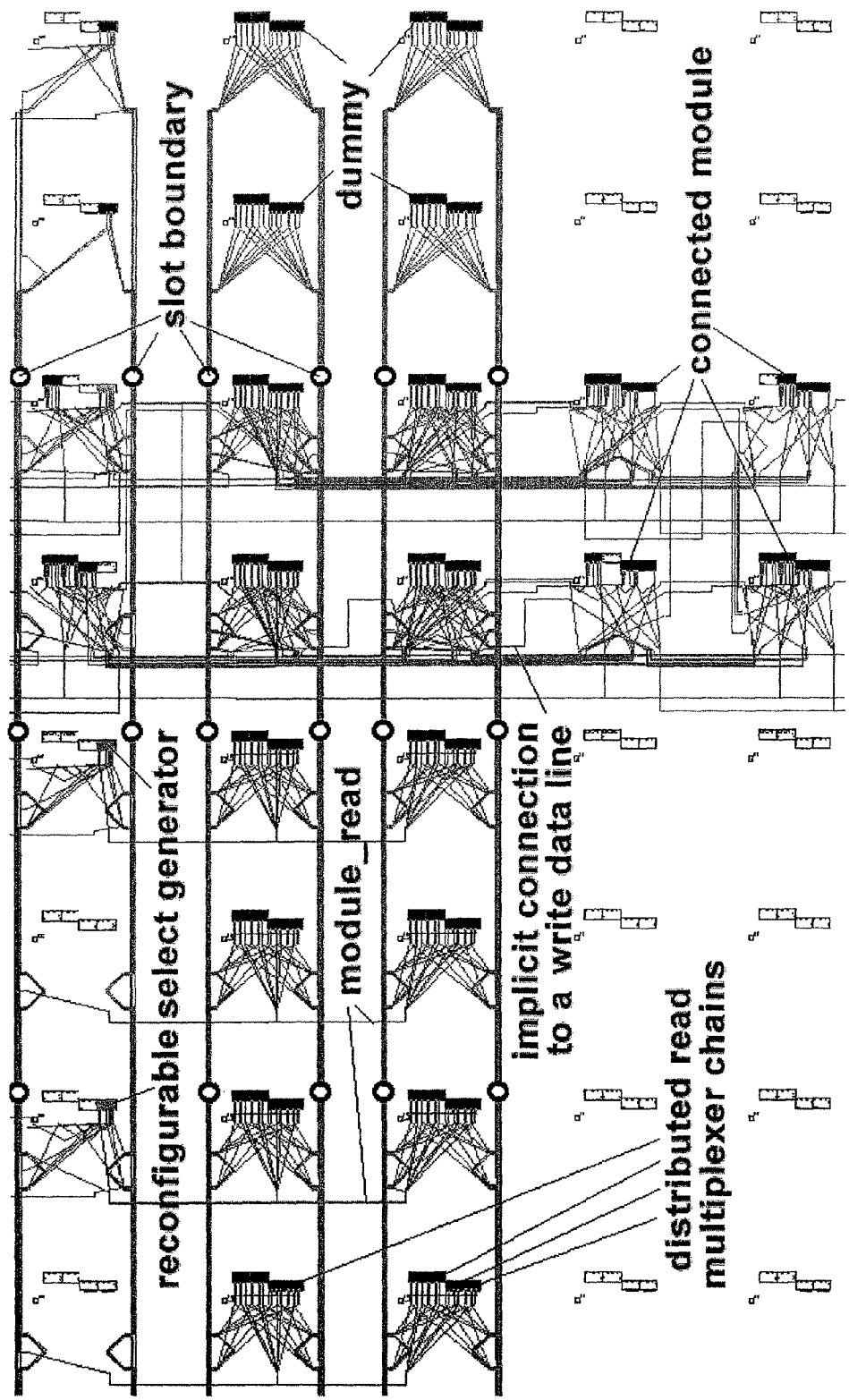
FIG. 36 shows an enlarged view of the bus with a connected 32-bit wide slave test module.

Based on this design, we used an incremental design flow to build the same set of test modules once again, but this time the modules are connected to the reconfigurable bus. All partial modules have been built one after another at the rightmost possible resource slot that is located at the farthest position from the stimuli generator as shown in FIG. 36. This ensures that the timing can be guaranteed for all reconfigurable modules at any position at the bus. With each synthesis step of a partial module, we generate the partial reconfiguration data exactly for this particular module. Note that it is possible to assign a slack to all signals of the bus, thus, allowing to (re-) synthesize the static part of the system independent to the partial modules. This hold true, if the bus is constrained to a fixed location.

The stimuli generator can write a portion of data to its internal test module and simultaneously to the equivalent module connected to the bus, thus being capable to verify the data transfers. By designing the bus using two independent address buses for read as well as for write operations, we have doubled the number of bus transfers in order to gain the number of tests per time. The complete configuration process and the work of the stimuli generator is controlled by an external host. In this system, the bus is the limiting factor restricting the clock rate to 104 MHz when using the unpipelined transfer mode between the static part and any generated partial test modules. Therefore, the accumulated bus throughput on the 32 bit wide data channels with simultaneous read and write capability was 800 MB/s. More than 20.000 tests with changing configuration patterns of test modules connected to random bus positions have demonstrated that the configuration process can be performed reliable without any corruption to data transferred over the reconfigurable bus. FIG. 36 shows an enlarged view on the bus with a connected 32-bit wide slave test module.

CONCLUSIONS

In this disclosure, we presented a set of new techniques that enhance the flexibility of integrating hardware modules efficiently to a reconfigurable on-chip bus by dynamically partial reconfiguration. With these techniques, we are the first to offer high placement flexibility and simple system integration of reconfigurable slave modules as well as of master modules in combination with high bus bandwidths and low resource overheads. We achieved a reduction of logic resources for implementing the bus to almost one eighth as compared to the best existing approach. By implementing a test system, we demonstrated that our buses are suitable for high speed systems. Our reconfigurable buses permits to swap modules in an embedded system without any user intervention. Here, was before only known from racks where cards where plugged into backplane buses (e.g., VME-buses).

Current work targets on supporting more FPGA architectures including all Xilinx Virtex-V devices and on improving the RECOBUS-BUILDER tool.

Mapping of a ReCoBus onto an FPGA

In the following, some further details regarding the mapping of a ReCoBus onto an FPGA will be described. In the following example, an example is used, in which there is a non-crossed-over (or non-interleaved) read multiplexer chain of the width 2 logic columns (upper read multiplexer chain). Further, there are two chains of the same width, which are crossed over into each other (or folded into each other, or interleaved with respect to each other) (lower chains).

Figure 37:
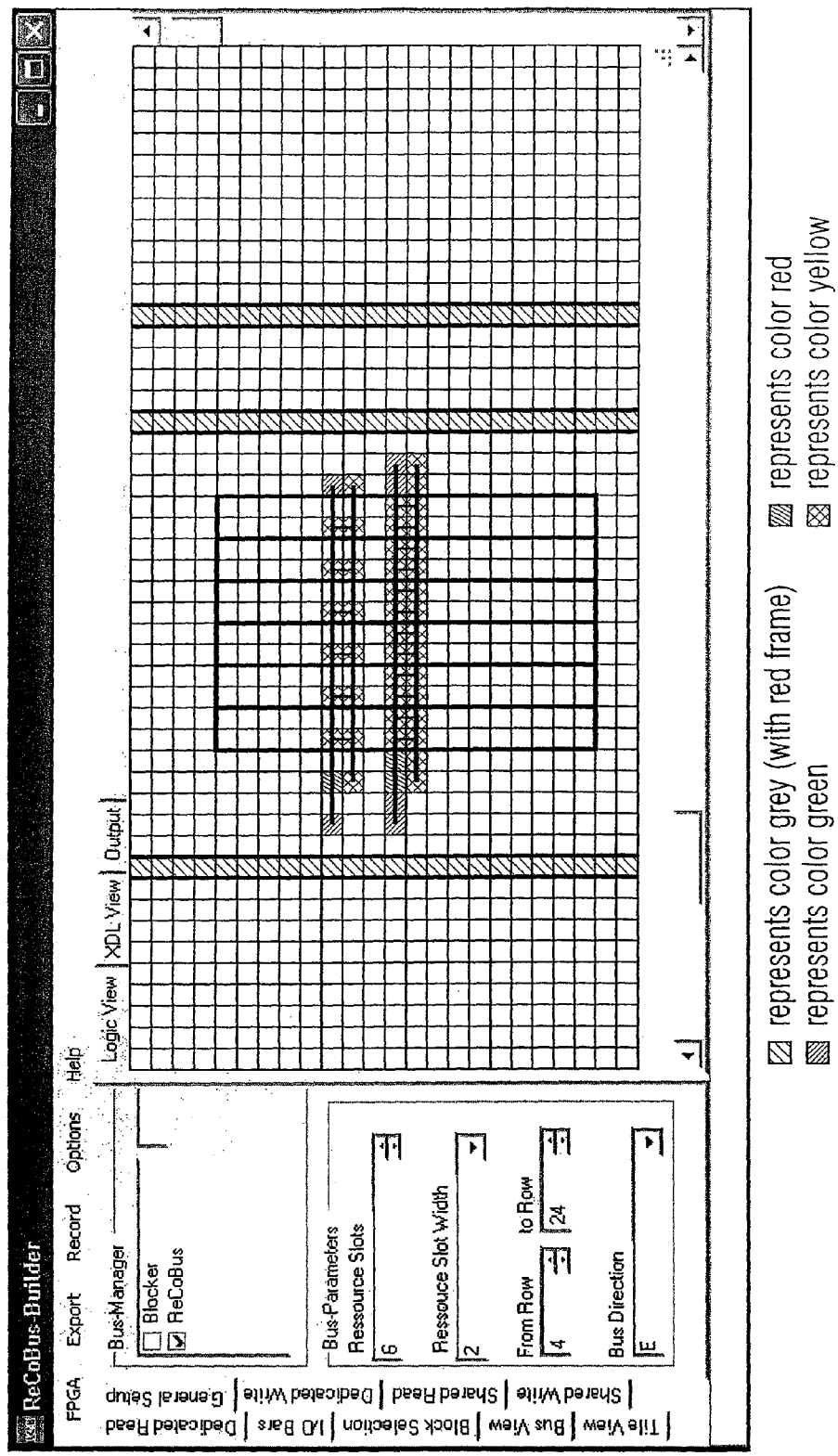
FIG. 37 shows a view of the bus in the graphical user interface of a tool called "ReCoBus-Builder", wherein the upper bus segment provides 6 slots of the width 2, while the lower bus provides 12 slots of the width 1.

FIG. 37 shows a view of the bus in the graphical user interface of a tool called "ReCoBus-Builder". The upper bus segment provides six slots of the width 2, while the lower bus provides 12 slots of the width 1.

The following different types of cells are used:

Light blue: unused cell (one cell consists of 4 sub cells (called slices in the Xilinx documentation), the sub cells comprising two look-up tables (LUTs) each.

Dark grey: RAM-cells (are present column wise on most FPGAs).

Green, yellow, orange or red: Number of the occupied sub cells 1/4, 2/4, 2/4 or 4/4.

Figure 38:
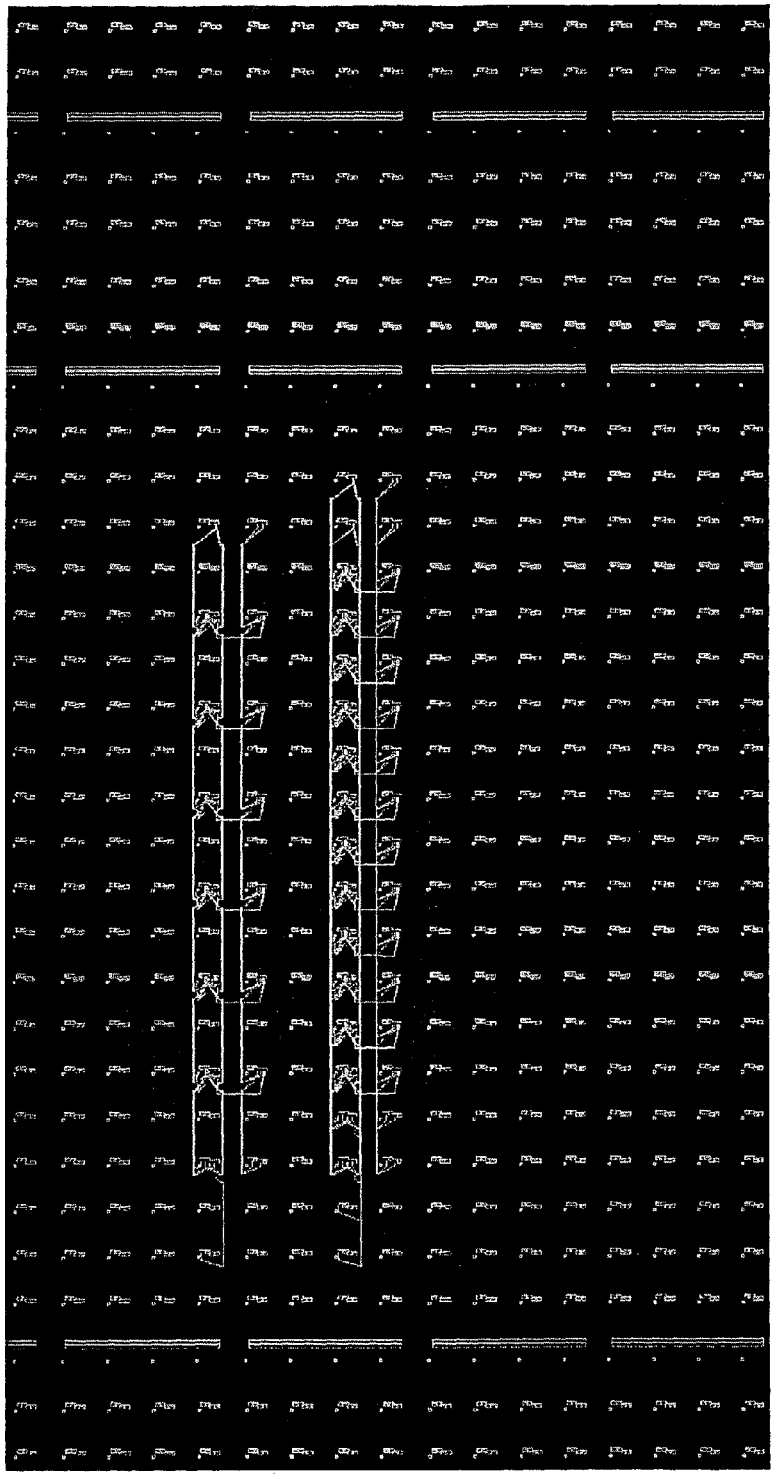
FIG. 38 shows a view of the bus in the tool "FPGA-editor", which is provided by Xilinx in its development environment.

FIG. 38 shows a view of the bus in the tool "FPGA editor", which is provided by Xilinx in its development environment.

Figure 39:
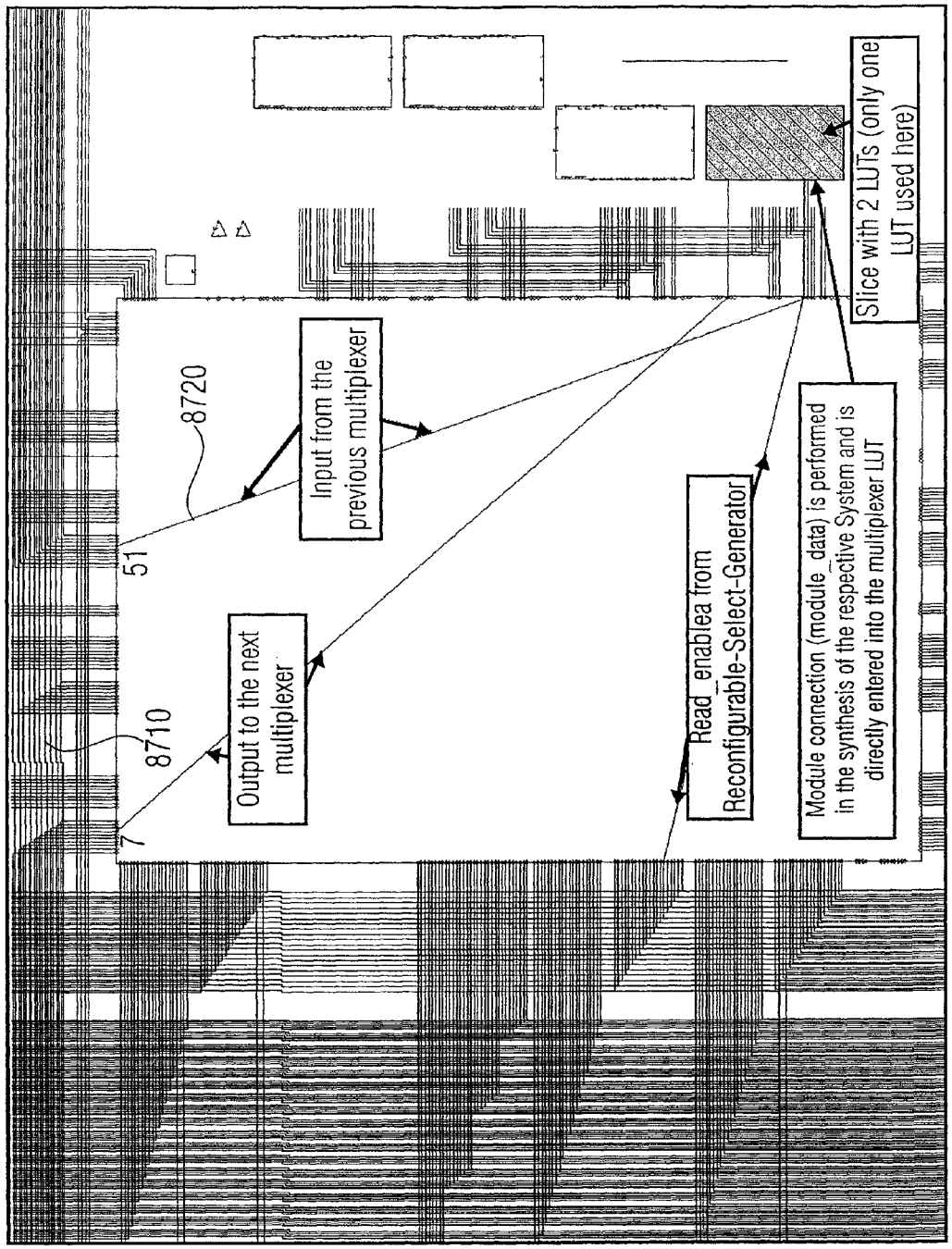
FIG. 39 shows a magnified view of the upper (non-interleaved) read multiplexer chain.

FIG. 39 shows an enlarged view of the upper non-interleaved (or non-crossed-over) read multiplexer chain.

Figure 40:
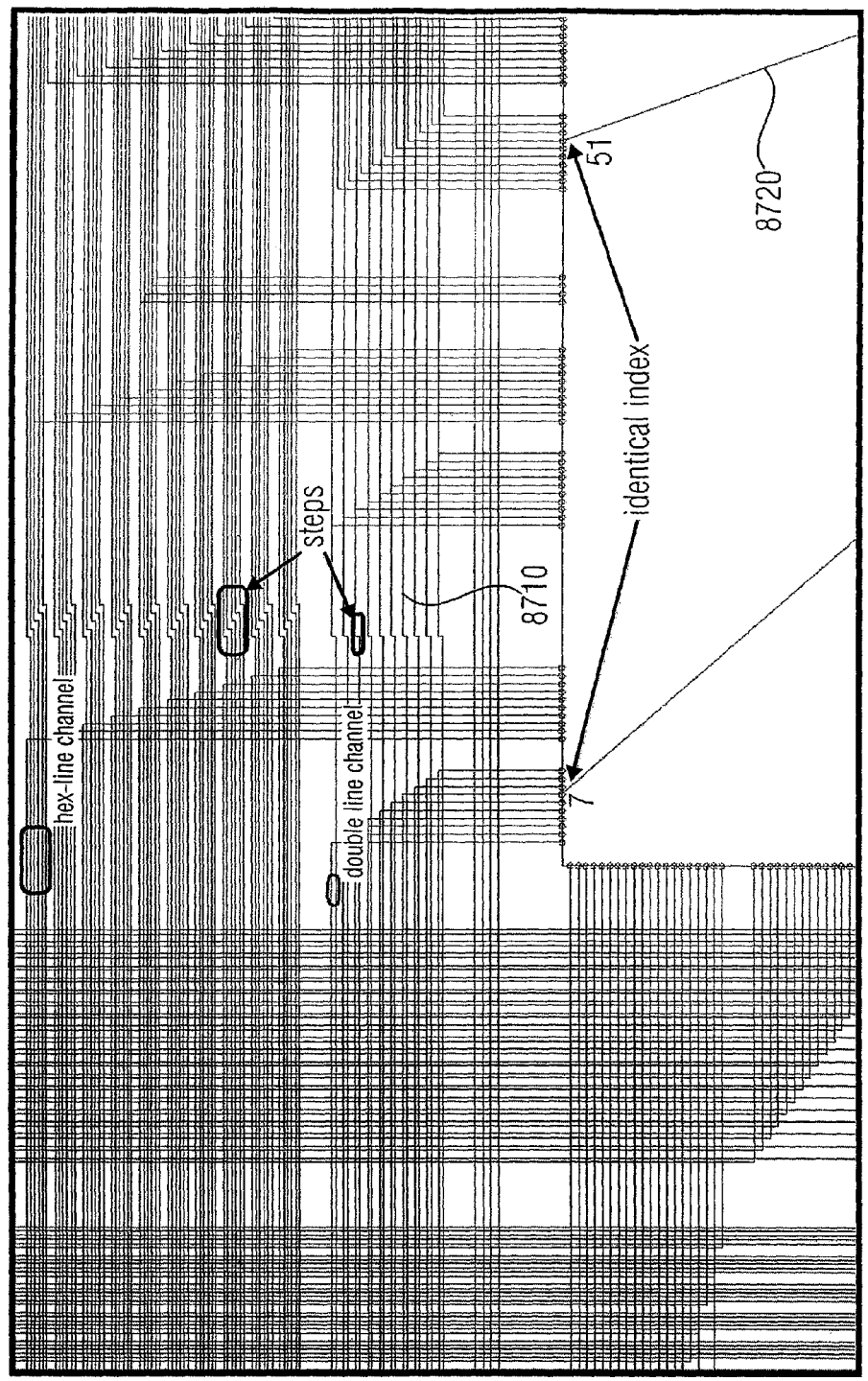
FIG. 40 shows a magnified representation of a bus portion in the lower interleaved bus, which is equivalent to the bus portion shown in FIG. 39, wherein channels of some double lines and hex lines can be seen.

FIG. 40 shows a bus portion, which is equivalent to the bus portion shown in FIG. 39, in the lower interleaved (or crossed-over) bus. The difference is only defined by the thin upper line 8710, which indicates the signal of the additional interleaved (or crossed-over) read multiplexer chain. It should be noted the two signal lines of the both interleaved (or crossed-over) chains are arranged directly (or immediately) side by side.

FIG. 40 shows an enlarged representation. Channels of some double lines and/or hex lines can be seen in FIG. 40.

Figure 41:
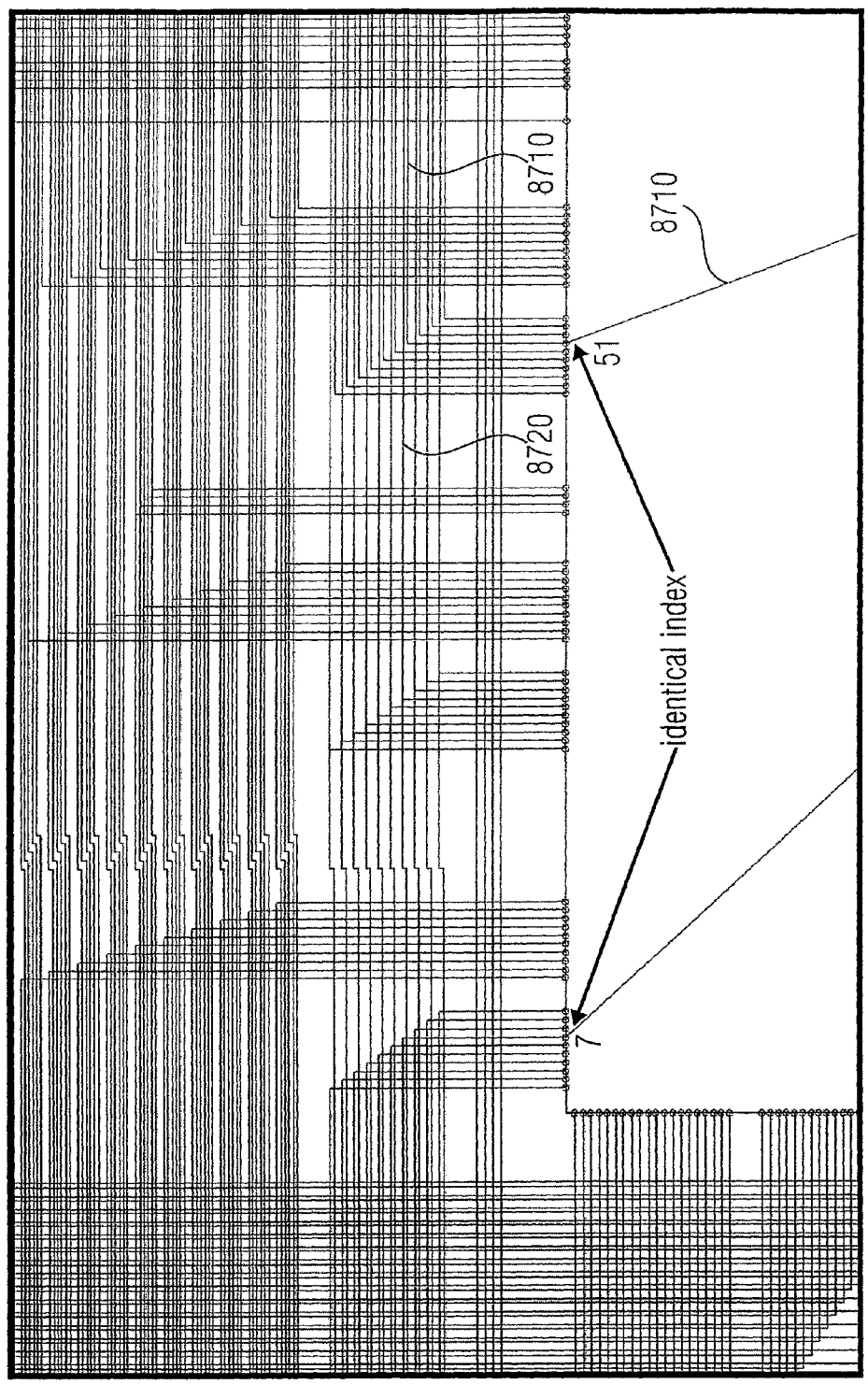
FIG. 41 shows a view of a neighbor cell of the cell shown in FIG. 40.

FIG. 41 shows a neighboring cell of the cell shown in FIG. 40. This time the signal 8710 runs into the cell, and the signal 8720 reaches the current cell. In each cell, the signal (which is coupled to the circuitry) arrives at the same index (or position index), for example at the position index 51. In the same way, in each cell, the signal leaves the cell starting at the same line index (for example at the line index or position index 7).

The input line index does not necessarily need to be equivalent to the output line index.

Figure 42:
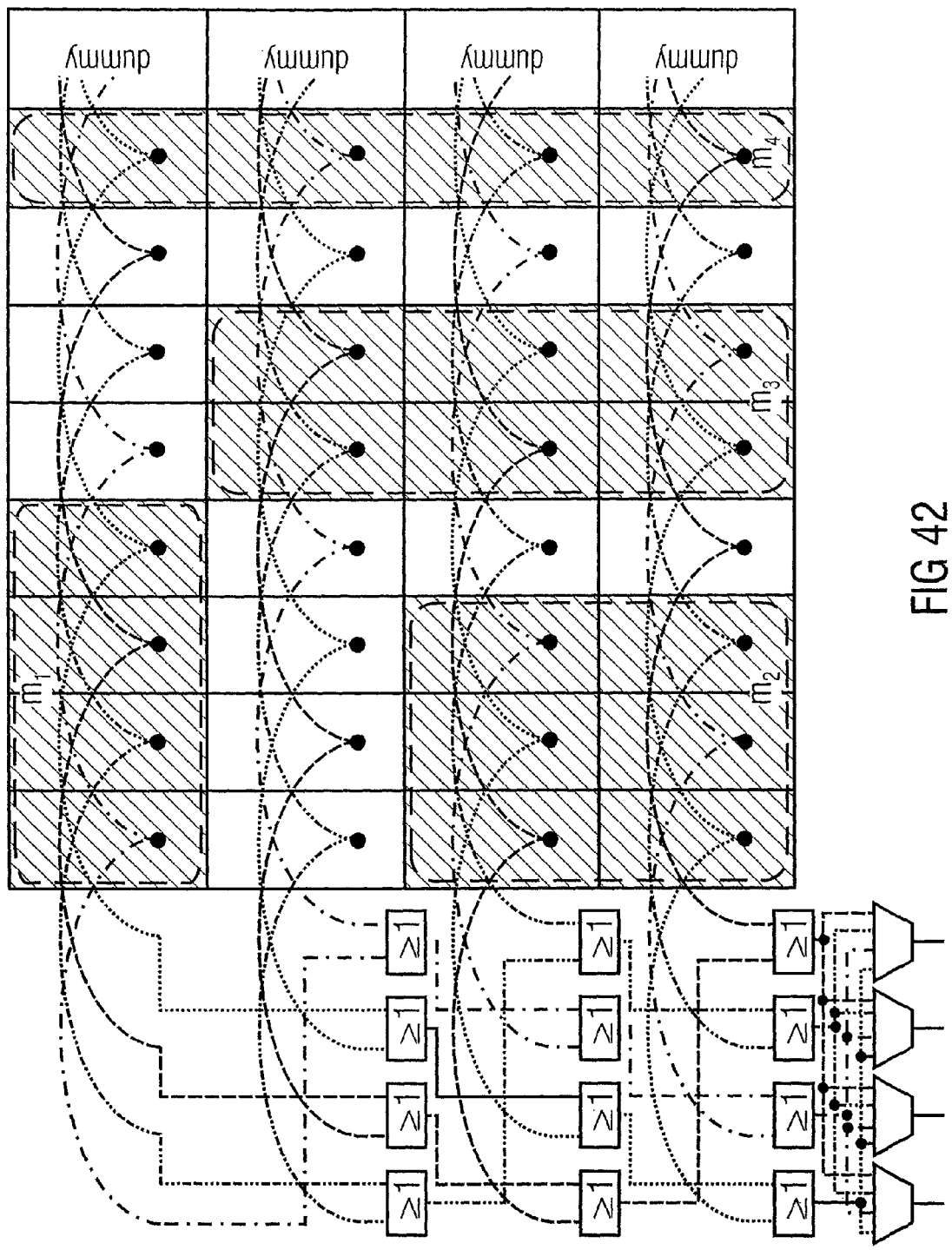
FIG. 42 shows a graphical representation of two dimensional interleaved read multiplexer chains.

Remarks Regarding the Two Dimensional Interleaving (or Crossed-Over Arrangement) of Read Multiplexer Chains:

The method for interleaving (or for a cross-over arrangement) of read data and write data can be extended to two dimensions, as shown in FIG. 42.

By multiple instantiation of a ReCoBus (or of parts of a ReCoBus), a resource slot can be divided into a plurality of sub slots, by which modules become two dimensionally placeable. This reduces an internal fragmentation, for example in the case that special resources are distributed over the full height of the reconfigurable area (as it is usual on FPGAs of the company Xilinx).

The different colors (or types of lines) represent independent cords, which represents a subset of the total data word width. The colored dots or dots having different hatching represent multiplexers, at which signal can be fed into the chains. A module, which necessitates the total data word width, should consequently comprise "dots" (or couplings) with all possible colors (or hatchings, or line types). If a signal direction is reversed and the lower alignment multiplexer is replaced by a de-multiplexer, the same arrangement can be used for "shared write" lines. Because of the vertical interleaving (or crossing-over), special resources which are available column-wise can be used by more than one module, as it is shown for the modules $m_1$ and $m_2$ in the example.

Building Dynamically Reconfigurable Systems

In the following, a concept will be described which facilitates the building of dynamically reconfigurable systems. In the following, different aspects will be described. In particular, details of the "Virtex-II" FPGA will be described. Further, reconfiguration styles, a ReCoBus communication, an I/O bar communication, and a design flow, for example using the ReCoBus-builder, will be described.

A ReCoBus communication is shown in FIG. 43. An efficient solution is obtained by using a multiple interleaved read multiplexer chains. In some embodiments, a low logic overhead of ⅙=17% can be obtained. Further, a low latency and a fine granularity can be obtained.

Figure 44:
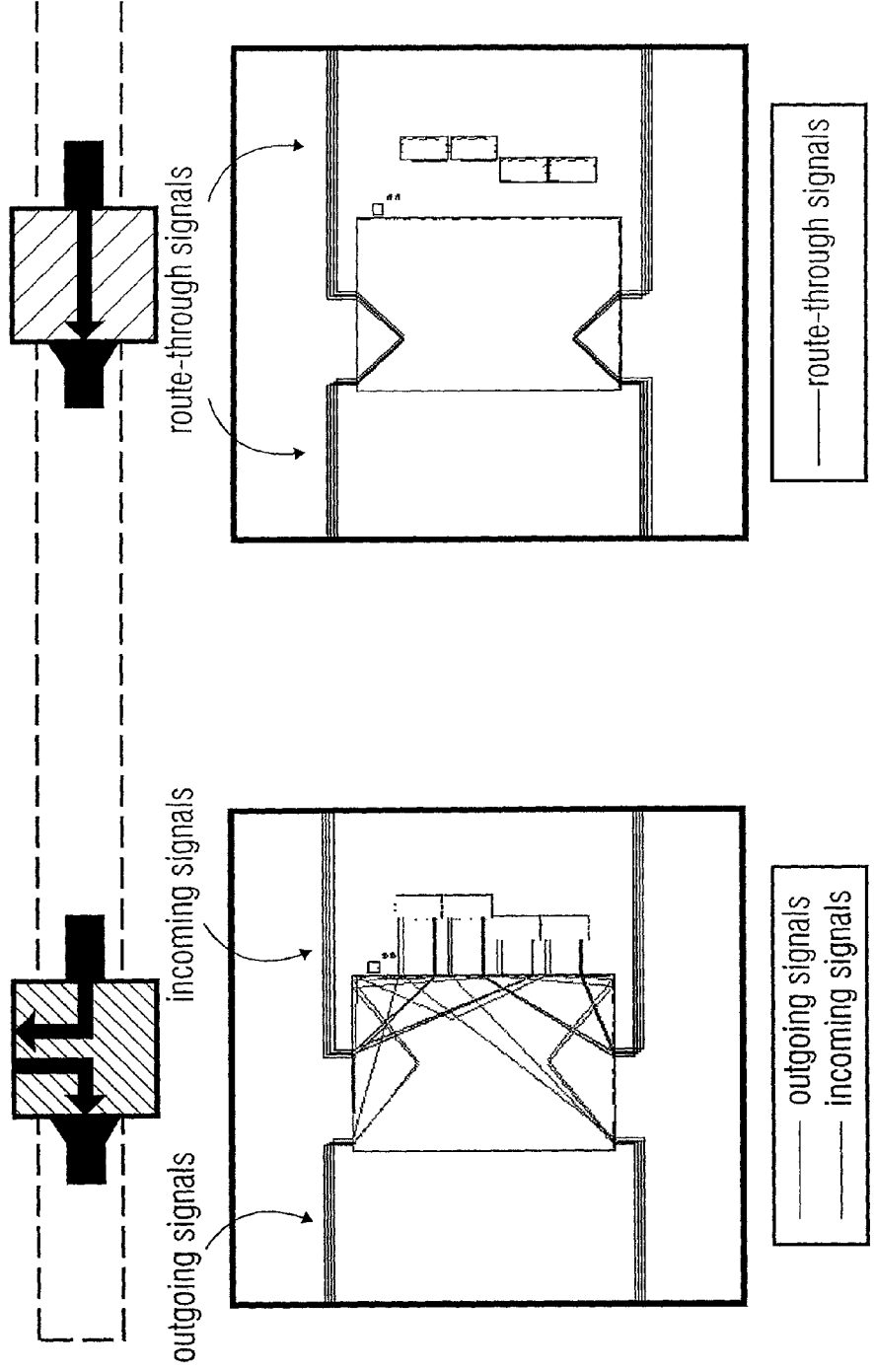
FIGS. 44a and 44b show graphical representations of I/O bar implementations.

In the following, some hardware implementations of I/O bars for point-to-point links will be described taking reference to FIGS. 44a and 44b. In other words, FIGS. 44a and 44b shows I/O bar implementations. FIG. 44a shows a hardware implementation of a read-modify-write connection. In contrast, FIG. 44b shows a hardware implementation of a bypass connection.

In the case of the read/modify/write connection, incoming signals and outgoing signal are distinguished but it is assumed that corresponding incoming signals and outgoing signals belong to the same communication bar. In the case of the bypass connection, route-through-signals are routed through a switch matrix (for example, of the FPGA). In the case of the read-modify-write connection, the connection between the incoming signals and the outgoing signals is established via the switch matrix and one or more of the configurable logic blocks.

Figure 45:
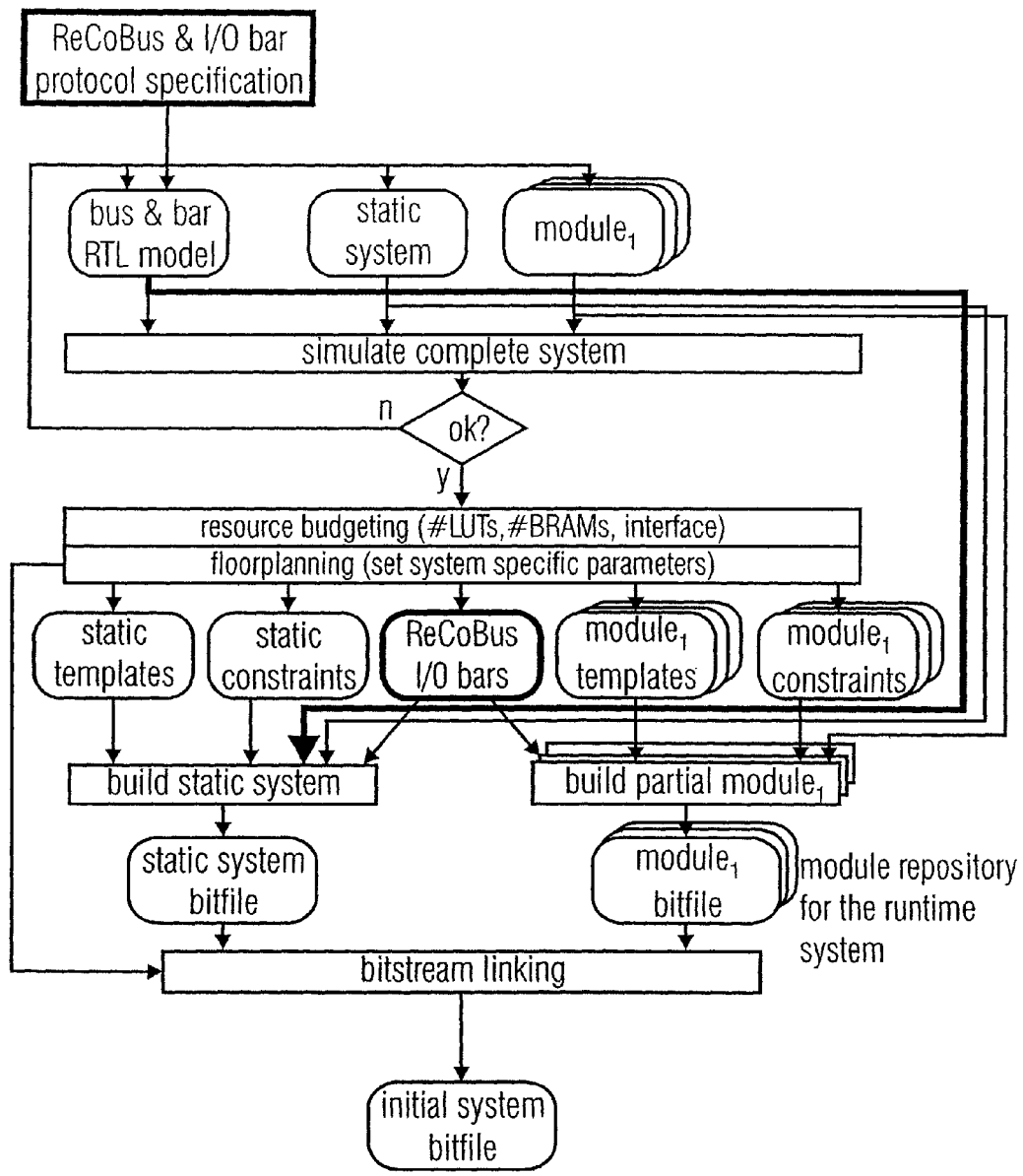
FIG. 45 shows a flow chart of a design flow, according to an embodiment of the invention.

A possible design flow is illustrated in FIG. 45.

Building advanced runtime reconfigurable FPGA-based systems with the ReCoBus-Builder is easy: firstly, assign a certain area for the reconfigurable modules in a floorplaning step, and then, divide this area into an arbitrary one- or two-dimensional tile grid. After this, include the communication architecture—including Buses and I/O bars—on top of this tile grid. Next, implement the static system strictly around the reconfigurable area. In the following, we can implement all reconfigurable modules, one after the other, within flexible bounding boxes that may be adjusted in terms of tiles of the grid. Note that this steps can be carried out in parallel design teams.

The result of the last step is a module repository that may be used at runtime as well as for composing an initial configuration for the system start. We call the initial bitstream generation "bitstream linking" as it has many similarities with linking known from the software domain. As exemplarily illustrated in the next figure, these few steps can be plainly integrated into most typical existing design flows.

Further Remarks

In the following, some remarks regarding the different variants for the distribution of dedicated write lines will be given. Some embodiments solve the problem to efficiently provide dedicated and parametrizable (for example for setting addresses) write lines within a multitude of neighboring reconfigurable areas, such that the modules can be placed within these areas as freely as possible.

Other embodiments according to the invention use, as a common solution approach, a regularly designed evaluation logic and connection structure, which can be implemented identically within each of the reconfigurable areas.

Different shapings are possible:
configurable module select generation;
parameter setting by shift registers (shift register primitive or discrete shift register)
parameter setting by online configuration data manipulation;
(Möbius-) counter based module select generation.

In [HKKP07] a possible solution is described, which allocates fixed addresses to the individual reconfigurable areas, which fixed addresses are then evaluated within the respective reconfigurable area. Here, the internal wiring can also be designed uniformly, but the evaluation logic is significantly more expensive, as the logic scales with a number of reconfigurable areas and not, like in the case of a ReCoBus, with the number of modules. Further, in the ReCoBus approach, module position and module parameter (e.g. an address) can be determined independently from each other. Also, a multi-cast addressing is not possible in the system described in the [HKKP07], as it is described in the Section titled "Reconfigurable Select Generators".

Some of the embodiments according to the invention go well beyond the conventional approaches and allow for an economically relevant application of a reconfiguration at run time using a bus-based communication.

In the following, some details will be described:

Crossed-Over (or Interleaved) Bus Lines:

Using the crossing-over (or interleaving), it is possible to chose the granularity to be fine while keeping the latency low and thus the speed high. This can be used, among others, for a time multiplexing of dedicated write lines, like, for example, interrupts. In this case, the individual crossed-over (or interleaved) cords are OR-ed, Alternatively, the Law of De Morgan can be applied. Accordingly, the AND-gates can be replaced by OR gates or vice versa.

Using an "Alignment Multiplexer", the concept of interfaces growing with the complexity of the module can be implemented, without causing a dramatic increase of the logic resources.

Using a fine granularity, the internal fragmentation can be reduced, i.e. possible clippings, which come into existence in that a module is inserted into a fixed grid, wherein the cells of this grid cannot be filled completely.

Some embodiments according to the invention create a method of a horizontal, one-dimensional crossing-over (or interleaving).

Some embodiments according to the invention create an extension to a two-dimensional method.

Overview of Further Aspects:

Shared Master Write Signals

If the focus is put onto the aspect of the interleaved (or crossed-over) bus lines, the interleaving (or crossing-over) can also be applied to the "shared write" lines. In this case, the alignment multiplexer becomes an alignment de-multiplexer, and the signal directions are inverted. However, the replacement of the alignment multiplexer by an alignment de-multiplexer can naturally also be applied in other embodiments.

The interleaving (or crossing-over) can basically be applied advantageously for each signal class (for example for the wiring of the "reconfigurable address comparator" blocks).

In some embodiments, the "dummy sink resources" can be cancelled and the lines can be routed at the end, as a sort of antenna. This is offered by the tool "ReCoBus Builder" as an option.

Dedicated Master Write Signals

Other embodiments are related to the provision of a signal for the module selection within each of the resource slots. In the publication "Design of Homogenous Communication Infrastructures for Partially Reconfigurable FPGAs" of Hagemeyer, such signals are implemented by address comparators, which evaluate a resource slot address. This method is, however, expensive, if there are many slots. Further, it is not directly suitable for a ReCoBus, as multiple subsequent resource slots (in the case of broad module interfaces) should react to the same address.

Based on the different proposals described above, a common solution approach can be derived: a regularly designed address comparator structure, which evaluates a module specific address.

Some embodiments according to the invention focus to solve the problem how to set the module specific addresses in the resource slots, such that the address assignment is transparent for the connected module. Here, variants are particularly advantageous in which the address can be directly stored in a look-up table.

Thus, in some embodiments it is important how the module address is entered into the look-up table. For this purpose, the manipulation of the bit stream during the configuration has been proposed. Also, a method using the shift register approach has been proposed.

Shared Master Read Signals

As mentioned above, the aspect of the interleaved (or crossed-over) bus lines is an important aspect for some embodiments according to the invention.

Dedicated Mater Read Signals

The described time multiplex method is an application of an (optionally interleaved) read multiplexer chain.

Connection Bars

The concept of the connection bars (sometimes designated as communication bars) is very interesting and can be used both independently (autonomously) and together with a ReCoBus. Our tool "ReCoBus Builder" is able to generate such connection bars via a mouse click.

Besides I/O wiring, connection bars are ideally usable for streaming applications (audio, video, networking and others).

Each object is (generated by) an autonomous module in a test system, which manipulates the pixel data stream coming in via a connection bar and forwards the pixel data stream (or the manipulated pixel data stream) on the same bar. In the case of the Pac-Man-Modules, the pixel data are faded in by overwriting the input data stream. All modules are additionally connected to a ReCoBus, via which, for example, the color of an object can be modified.

Design Methods

As described, bitstream linking constitutes an important progress which allows to accelerate the design of FPGA systems drastically. Presently, the logic available on an FPGA increases much faster than it can be processed by design tools, such that the calculation of the placement and routing (or wiring) can take multiple hours. Bit stream linking is a good solution, which is based on the ReCoBus and connection bar technology.

It should be noted that instead of bit streams, netlists with logic information, placement information and wiring information can be used, as the bit streams can directly be mapped from this netlist.

Computer Implementation

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium) comprising the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein. Al A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein.

Some embodiments described herein provide a novel possibility for integrating hardware modules using On-Chip Buses on FPGAs. In some embodiments, an exchange of individual modules by partial reconfiguration at runtime is possible without affecting the running operation of other parts of the system. This allows for a modular system integration, as it was only known from hot-plug-enabled backplane buses (e.g. VME bus).

Embodiments according to the invention create solutions for the implementation of a regularly designed bus architecture, which allows the placement of modules of different size on an FPGA with an unequaled flexibility.

Techniques have been described for all types (or classes) of bus signals, to place modules freely on an FPGA in a very fine grid at low resource consumption.

A comparison with the solution described in [HKKP07] shows, that our solution comprises at least a doubled flexibility (referred to the placement grid), double speed and a simplified system integration, although some embodiments according to the present solution necessitate only 12 percent of the logic cost.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[ABM+05] Ali Ahmadinia, Christophe Bobda, Mateusz Majer, Jbrgen Teich, Sõndor Fekete, and Jan van der Veen. DyNoC: A Dynamic Infrastructure for Communication in Dynamically Reconfigurable Devices. In *Proceedings of the International Conference on Field-Programmable Logic and Applications (FPL)*, pages 153-158, Tampere, Finland, August 2005.

[Adv07] Advanced RISC Machines Ltd. AMBA System Architecture, May 2007. http://www.arm.com/products/solutions/AMBAHomePage.html.

[Ali05] Ali Ahmadinia and Christophe Bobda and Ji Ding and Mateusz Majer and Jbrgen Teich and Sõndor Fekete and Jan van der Veen. A Practical Approach for Circuit Routing on Dynamic Reconfigurable Devices. In *Proceedings of the 16th IEEE International Workshop on Rapid System Prototyping (RSP)*, pages 84-90, Montreal, Canada, jun 2005.

[Alt07a] Altera Corporation. Avalon Memory-Mapped Interface Specification V3.3, 2007. Available online: www.altera.com/literature/manual/mnl_avalon_spec.pdf.

[Alt07b] Altera Inc. Alera Devices, jun 2007. www.altera.com/products/devices/dev-index.jsp.

[BM02] Luca Benini and Giovanni De Micheli. Networks on Chips: A New SoC Paradigm. *Computer*, 35(1):70-78, January 2002.

[BMG06] C. Bieser and K.-D. Mueller-Glaser. Rapid prototyping design acceleration using a novel merging methodology for partial configuration streams of xilinx virtex-ii fpgas. rsp, 0:193-199, 2006.

[ESS+96] Hossam A. ElGindy, Arun K. Somani, Heiko Schroeder, Hartmut Schmeck, and Andrew Spray. RMB—A Reconfigurable Multiple Bus Network. In *Proceedings of the Second International Symposium on High-Performance Computer Architecture (HPCA-2)*, pages 108-117, February 1996.

[HBB04] Michael Huebner, Tobias Becker, and Juergen Becker. Real-time LUT-based Network Topologies for Dynamic and Partial FPGA Self-Reconfiguration. In *SBCCI '04: Proceedings of the 17th Symposium on Integrated Circuits and System Design*, pages 28-32, New York, N.Y., USA, 2004. ACM Press.

[HKKP07] Jens Hagemeyer, Boris Kettelhoit, Markus Koester, and Mario Porrmann. Design of Homogeneous Communication Infrastructures for Partially Reconfigurable FPGAs. In *Proceedings of the 2007 International Conference on Engineering of Reconfigurable Systems and Algorithms (ERSA '07)*, Las Vegas, USA, June 2007. to appear.

[HKP06] Jens Hagemeyer, Boris Kettelhoit, and Mario Porrmann. Dedicated Module Access in Dynamically Reconfigurable Systems. In *Proceedings of the 20th International Parallel and Distributed Processing Symposium (IPDPS)*, 2006.

[HSKB06] Michael Hь bner, Christian Schuck, Matthias K ь hnle, and Jь rgen Becker. New 2-Dimensional Partial Dynamic Reconfiguration Techniques for Real-time Adaptive Microelectronic Circuits. In *ISVLSI '06: Proceedings of the IEEE Computer Society Annual Symposium on Emerging VLSI Technologies and Architectures*, page 97, Washington, D.C., USA, 2006. IEEE Computer Society.

[Inc04] Xilinx Inc. Two Flows for Partial Reconfiguration: Module Based or Difference Based, September 2004. Available online: www.xilinx.com/bvdocs/appnotes/xapp290.pdf.

[Inc07a] Xilinx Inc. Xilinx Answer Record 18278, May 2007. Available online: http://www.xilinx.com/xlnx/xil_ans_display.jsp?getPagePath=18278.

[Inc07b] Xilinx Inc. Xilinx User Guides, May 2007. http://www.xilinx.com/support/library.htm.

[Int99] International Business Machines Corporation (IBM. The CoreConnect'Bus Architecture, 1999. Available online: http://www-03.ibm.com/chips/products/coreconnect/.

[KD06a] Shannon Koh and Oliver Diessel. COMMA: A Communications Methodology for Dynamic Module-based Reconfiguration of FPGAs. In *ARCS 2006-19th International Conference on Architecture of Computing Systems*, Workshops Proceedings, pages 173-182, march 2006.

[KD06b] Shannon Koh and Oliver Diessel. Comma: A communications methodology for dynamic module reconfiguration in fpgas. fccm, 0:273-274, 2006.

[KHT07] Dirk Koch, Christian Haubelt, and Jbrgen Teich. Efficient Hardware Checkpointing—Concepts, Overhead Analysis, and Implementation. In *Proceedings of the 15th ACM/SIGDA International Symposium on Field-Programmable Gate Arrays (FPGA 2007)*, pages 188-196, Monterey, Calif., USA, February 2007. ACM.

[KJdlTR05] Yana E. Krasteva, Ana B. Jimeno, Eduardo de la Torre, and Teresa Riesgo. Straight Method for Reallocation of Complex Cores by Dynamic Reconfiguration in Virtex II FPGAs. In *Proceedings of the 16th IEEE International Workshop on Rapid System Prototyping (RSP '05)*, pages 77-83, Washington, D.C., USA, 2005. IEEE Computer Society.

[KPR04] H. Kalte, M. Porrmann, and U. Rbckert. System-on-Programmable-Chip Approach Enabling Online Fine-Grained 1D-Placement. In *11th Reconfigurable Architectures Workshop (RAW 2004)*, page 141, New Mexico, USA, 2004. IEEE Computer Society.

[KT04] Dirk Koch and Jbrgen Teich. Platform-Independent Methodology for Partial Reconfiguration. In *CF '04: Proceedings of the 1st conference on Computing Frontiers*, pages 398-403, New York, N.Y., USA, 2004. ACM Press.

[LBM+06] Patrick Lysaght, Brandon Blodget, Jeff Mason, Jay Young, and Brendan Bridgford. Invited Paper: Enhanced Architecture, Design Methodologies and CAD Tools for Dynamic Reconfiguration of Xilinx FPGAs. In *Proceedings of the 16th International Conference on Field Programmable Logic and Application (FPL '06)*, pages 1-6, August 2006.

[PdMM+02] Josй Carlos Palma, Aline Vieira de Mello, Leandro Mц ller, Fernando Moraes, and Ney Calazans. Core Communication Interface for FPGAs. In *SBCCI '02: Proceedings of the 15th Symposium on Integrated Circuits and Systems Design*, page 183, Washington, D.C., USA, 2002. IEEE Computer Society.

[SC07] Pete Sedcole and Peter Y. K. Cheung. Parametric Yield in FPGAs Due to Within-die Delay Variations: A Quantitative Analysis. In *Proceedings of the 15th ACM/SIGDA International Symposium on Field-Programmable Gate Arrays (FPGA 2007)*, pages 178-187, Monterey, Calif., USA, February 2007. ACM.

[Sil02] Silicore™. WISHBONE System-on-Chip (SoC)Interconnection Architecture for Portable IP Cores Rev. B.3, 2002. Available online: http://www.opencores.org/projects.cgi/web/wishbone/wbspec_b3.pdf.

[UHB04] Michael Ullmann, Michael Hь bner, and Jь rgen Becker. An FPGA Run-System for Dynamical On-Demand Reconfiguration. In *Proceedings of 18th International Parallel and Distributed Processing Symposium (IPDPS '04)*, Santa Fe, N. Mex., April 2004.

[WP04] Herbert Walder and Marco Platzner. A Runtime Environment for Reconfigurable Operating Systems. In *Proceedings of the 14th International Conference on Field Programmable Logic and Application (FPL '04)*, pages 831-835. Springer, September 2004.

[Xil07] Xilinx Inc. Xilinx: Silicon Devices, jun 2007. www.xilinx.com/products/silicon_solutions/.

FURTHER REFERENCES

[BJRK+03] Brandon Blodget, Philip James-Roxby, Eric Keller, Scott McMilla, and Prasanna Sundararajan. A Self-reconfiguring Platform. In *Proceedings of International Conference on Field-Programmable Logic and Applications (FPL)*, pages 565-574, Lisbon, Portugal, 2003.

[CKL+] Curt, Derick, Kalara, Punit, Leblanc, Richard, Eck, Vincent, Trynosky, Stephen, Lindholm, Jeffrey, Bauer, Trevor, Blodget, Brandom, McMillan, Scot, James Philip, Sundararajan Prasanna, and Keller, Eric. RECONFIGURATION OF THE PROGRAMMABLE LOGIC OF AN INTEGRATED CIRCUIT. WO Patent WO002004055986A3, issued 25 Nov. 2004.

[LBM+06] Patrick Lysaght, Brandon Blodget, Jeff Mason, Jay Young, and Brendan Bridgford. Invited Paper: Enhanced Architecture, Design Methodologies and CAD Tools for Dynamic Reconfiguration of Xilinx FPGAs. In *Proceedings of the 16th International Conference on Field Programmable Logic and Application (FPL '06)*, pages 1-6, August 2006.

[SBB+06] Pete Sedcole, Brandom Blodget, Tobias Becker, Jason Anderson, and Patrick Lysaght. Modular dynamic reconfiguration in Virtex FPGAs. *IEE*, 153(3):157-164, 2006.

FURTHER REFERENCES

[1] C. Bieser and K.-D. Mueller-Glaser. Rapid Prototyping Design Acceleration Using a Novel Merging Methodology for Partial Configuration Streams of Xilinx Virtex-II FPGAs. In *17th IEEE Int. Workshop on Rapid System Prototyping*, pages 193-199, Los Alamitos, Calif., USA, 2006.

[2] J. Hagemeyer, B. Kettelhoit, M. Koester, and M. Porrmann. Design of Homogeneous Communication Infrastructures for Partially Reconfigurable FPGAs. In *Proceedings of the ERSA '07 conference*, Las Vegas, USA, June 2007.

[3] J. Hagemeyer, B. Kettelhoit, and M. Porrmann. Dedicated Module Access in Dynamically Reconfigurable Systems. In *Proceedings of the 20th International Parallel and Distributed Processing Symposium (IPDPS)*, Rhodes Island, Greece 2006.

[4] H. Kalte, M. Porrmann, and U. Rückert. System-on Programmable-Chip Approach Enabling Online Fine-Grained 1D-Placement. In *11th Reconfigurable Architectures Workshop (RAW 2004)*, page 141, New Mexico, USA, 2004.

[5] Y. E. Krasteva, A. B. Jimeno, E. de la Torre, and T. Riesgo. Straight Method for Reallocation of Complex Cores by Dynamic Reconfiguration in Virtex II FPGAs. In *Proc. of the 16th IEEE Int. Workshop on Rapid System Prototyping (RSP '05)*, pages 77-83, Washington, D.C., USA, 2005.

[6] J. C. Palma, A. V. de Mello, L. Möller, F. Moraes, and N. Calazans. Core Communication Interface for FPGAs. In *SBCCI '02: Proc. of the 15th Symp. on Integrated Circuits and Systems Design*, page 183, Washington, D.C., USA, 2002.

[7] H. Walder and M. Platzner. A Runtime Environment for Re-configurable Operating Systems. In *Proc. of the 14th FPL '04*, pages 831-835, Antwerp, Belguim 2004.

FURTHER REFERENCES

[A1] A. Ahmadinia, C. Bobda, M. Majer, J. Teich, S. Fekete, and J. van der Veen. DyNoC: A Dynamic Infrastructure for Communication in Dynamically Reconfigurable Devices. In *Proceedings of the International Conference on Field-Programmable Logic and Applications (FPL)*, pages 153-158, Tampere, Finland, August 2005.

[A2] Ali Ahmadinia and Christophe Bobda and Ji Ding and Mateusz Majer and Jürgen Teich and Sándor Fekete and Jan van der Veen. A Practical Approach for Circuit Routing on Dynamic Reconfigurable Devices. In *Proceedings of the 16th IEEE International Workshop on Rapid System Prototyping (RSP)*, pages 84-90, Montreal, Canada, jun 2005.

[A3] Altera Inc. Alera Devices, jun 2007. www.altera.com/products/devices/dev-index.jsp.

[A4] Bapat, Shekhar and Krishna Murthy, Sridhar. *High Speed Bidirectional Bus with Multiplexers*. WO Patent WO001998016012A1, issued 10 Oct. 1996.

[A5] L. Benini and G. D. Micheli. Networks on Chips: A New SoC Paradigm. *Computer*, 35(1):70-78, January 2002.

[A6] C. Bieser and K.-D. Mueller-Glaser. Rapid Prototyping Design Acceleration Using a Novel Merging Methodology for Partial Configuration Streams of Xilinx Virtex-II FPGAs. In *17th IEEE Int. Workshop on Rapid System Prototyping*, pages 193-199, Los Alamitos, Calif., USA, 2006. IEEE Computer Society.

[A7] H. A. ElGindy, A. K. Somani, H. Schroeder, H. Schmeck, and A. Spray. RMB—A Reconfigurable Multiple Bus Network. In *Proceedings of the Second International Symposium on High-Performance Computer Architecture (HPCA-2)*, pages 108-117, February 1996.

[A8] J. Hagemeyer, B. Kettelhoit, M. Koester, and M. Porrmann. Design of Homogeneous Communication Infrastructures for Partially Reconfigurable FPGAs. In *Proceedings of the International Conference on Engineering of Reconfigurable Systems and Algorithms (ERSA '07)*, Las Vegas, USA, June 2007.

[A9] J. Hagemeyer, B. Kettelhoit, and M. Porrmann. Dedicated Module Access in Dynamically Reconfigurable Systems. In *Proceedings of the 20th International Parallel and Distributed Processing Symposium (IPDPS)*, Rhodes Island, Greece 2006, 2006.

[A10] M. Hübner, C. Schuck, M. Kühnle, and J. Becker. New 2-Dimensional Partial Dynamic Reconfiguration Techniques for Real-time Adaptive Microelectronic Circuits. In *ISVLSI '06: Proceedings of the IEEE Computer Society Annual Symposium on Emerging VLSI Technologies and Architectures*, page 97, Washington, D.C., USA, 2006.

[A11] M. Huebner, T. Becker, and J. Becker. Real-Time LUT-Based Network Topologies for Dynamic and Partial FPGA Self-Reconfiguration. In *SBCCI '04: Proc. of the 17th symp. on Integrated Circuits and Cystem Design*, pages 28-32, New York, N.Y., USA, 2004. ACM Press.

[A12] H. Kalte, M. Porrmann, and U. Rückert. System-on-Programmable-Chip Approach Enabling Online Fine-Grained 1D-Placement. In *11th Reconfigurable Architectures Workshop (RAW 2004)*, page 141, New Mexico, USA, 2004.

[A13] D. Koch, C. Beckhoff, and J. Teich. Bitstream Decompression for High Speed FPGA Configuration from Slow Memories. In *Proceedings of the 2007 IEEE Int. Conf. on Field-Programmable Technology (ICFPT '07)*. IEEE, 2007. submitted to.

[A14] D. Koch, M. Körber, and J. Teich. Searching RC5-Keys with Distributed Reconfigurable Computing. In *Proc. of Int. Conf. on Engineering of Reconfigurable Systems and Algorithms (ERSA 2006)*, pages 42-48, Las Vegas, USA, June 2006.

[A15] S. Koh and O. Diessel. COMMA: A Communications Methodology for Dynamic Module Reconfiguration in FPGAs. In *14th IEEE Symposium on Field-Programmable Custom Computing Machines (FCCM 2006)*, pages 273-274, Los Alamitos, Calif., USA, 2006.

[A16] Y. E. Krasteva, A. B. Jimeno, E. de la Torre, and T. Riesgo. Straight Method for Reallocation of Complex Cores by Dynamic Reconfiguration in Virtex II FPGAs. In *Proc. of the 16th IEEE Int. Workshop on Rapid System Prototyping (RSP '05)*, pages 77-83, Washington, D.C., USA, 2005.

[A17] P. Lysaght, B. Blodget, J. Mason, J. Young, and B. Bridgford. Invited Paper: Enhanced Architecture, Design Methodologies and CAD Tools for Dynamic Reconfiguration of Xilinx FPGAs. In *Proc. of the 16th Int. Conf. on Field Programmable Logic and Application (FPL '06)*, pages 1-6, August 2006.

[A18] J. C. Palma, A. V. de Mello, L. Möller, F. Moraes, and N. Calazans. Core Communication Interface for FPGAs. In *SBCCI '02: Proc. of the 15th Symp. on Integrated Circuits and Systems Design*, page 183, Washington, D.C., USA, 2002.

[A19] M. Ullmann, M. Hübner, and J. Becker. An FPGA Run-Time System for Dynamical On-Demand Reconfiguration. In *Proceedings of 18th International Parallel and Distributed Processing Symposium (IPDPS '04)*, Santa Fe, N. Mex., April 2004.

[A20] H. Walder and M. Platzner. A Runtime Environment for Reconfigurable Operating Systems. In *Proc. of the 14th Int. Conf. on Field Programmable Logic and Application (FPL '04)*, pages 831-835, 2004.

[A21] Xilinx Inc. Xilinx: Silicon Devices, jun 2007. www.xilinx.com/products/silicon_solutions/.

[A22] Christophe Bobda: "Introduction to Reconfigurable Computing: Architectures, Algorithms and Applications", Springer-Verlag, ISBN-10: 1402060882.

The invention claimed is:

1. A logic chip, comprising:
a plurality of individually-addressable resource blocks, each comprising logic circuitry;
a bus comprising a plurality of bus information lines;
wherein a first of the resource blocks comprises a coupling between a first strict sub-set of the bus information lines and the logic circuitry of the first resource block;
wherein a second of the resource blocks, which is adjacent to the first resource block, comprises a coupling between a second strict sub-set of the bus information lines and the logic circuitry of the second resource blocks;
wherein the first and second sub-sets comprise different bus lines;
wherein the bus comprises a plurality of sub-sets of bus information lines;
wherein the first strict sub-set of the bus information lines is periodically, in terms of space, coupled with resource block logic circuitry once per N of the individually-addressable resource blocks;
wherein the second strict sub-set of the bus information lines is periodically, in terms of space, coupled with resource block logic circuitry once per N of the individually-addressable resource blocks;
wherein N is greater than or equal to 2;
wherein the bus information lines of the first sub-set are coupled to block logic circuitry of different resource blocks than the bus information lines of the second sub-set;
wherein the different sub-sets of bus information lines are periodically connected to coupling circuits with a periodicity of N resource blocks, such that each of N subsequent resource blocks comprises a coupling circuit connected to a different sub-set of the bus information lines and such that a line of resource blocks comprises a periodic sequence of couplings with different subsets of the bus information lines with a spatial periodicity of N; and
wherein the coupling circuits are configured to provide a coupling between the bus information lines connected thereto and the logic circuitry of the respective resource blocks.

2. The logic chip according to claim 1, wherein the logic chip comprises a first module, the first module comprising a plurality of resource blocks;
wherein a coupling between a module functional circuitry of the first module and the bus information lines is distributed across the resource blocks of the first module, such that a coupling between the module functional circuitry and different strict sub-sets of the bus information lines is established in different resource blocks;
wherein the logic chip comprises a second module, the second module comprising a plurality of resource blocks;
wherein the resource blocks of the second module are addressable separately from the resource blocks of the first module; and
wherein a coupling between a module functional circuitry of the second module and the bus information lines is distributed across the resource blocks of the second module, such that a coupling between the module functional circuitry of the second module and different strict sub-sets of the bus information lines is established in different resource blocks of the second module; and
wherein the different resource blocks comprise functionally identical coupling circuits configured to allow for a unidirectional or bi-directional access of the bus information lines.

3. The logic chip according to claim 1,
wherein the bus comprises m·N bus information lines;
wherein the resource blocks each comprise a coupling with a sub-set of m of the bus information lines; and
wherein a coupling in the different resource blocks is configured such that the coupling circuits of an entirety of N adjacent resource blocks allow for a coupling with all of the m·N bus information lines.

4. The logic chip according to claim 1,
wherein each of the bus lines comprises a plurality of bus line segments;
wherein first bus line segments of the one or more bus information lines of an n-th strict sub-set of bus information lines extend from an n-th resource block to an (n+N)-th resource block;
wherein second bus line segments of the one or more bus information lines of the n-th strict sub-set extend from the (n+N)-th resource block to an (n+2N)-th resource block; and
wherein third bus line segments of the one or more bus information lines of the n-th strict sub-set extend from the (n+2N)-th resource block to an (n+3N)-th resource block;
wherein 1≤n≤N;
wherein the first bus line segments of the n-th strict sub-set are connected between the n-th resource block and the (n+N)-th resource block; and
wherein ends of the one or more first bus line segments of the n-th strict sub-set are connected with ends of corresponding one or more second bus line segments of the n-th strict sub-set via a coupling circuit arranged in the (n+N)-th resource block.

5. The logic chip according to claim 1,
wherein coupling circuits in different resource blocks, for coupling different strict sub-sets of the bus information lines with the logic circuitry of different resource blocks, comprise identical interface specifications with respect to the bus information lines.

6. The logic chip according to claim 1,
wherein the bus information lines are routed such that a given coupling circuit structure, comprising given interface specifications, provides access to the first strict sub-set of bus information lines when applied in the first of the resource blocks, and provides access to the second sub-set of bus information lines when applied in the second of the resource blocks.

7. The logic chip according to claim 1,
wherein the logic chip comprises a bus master, a mapping circuit and a plurality of modules, wherein the bus master comprises a plurality of bus master information lines to provide information to the modules or to receive information from the modules;
wherein each of the modules comprises one or more resource blocks;
wherein adjacent resource blocks comprise couplings with different strict subsets of the bus information lines; and
wherein the mapping circuit is configured to couple different subsets of the bus master information lines to different subsets of the bus information lines in dependence on a module position information describing a position of a currently addressed module.

8. The logic chip according to claim 7,
wherein the logic chip comprises a resource block manager configured to allocate modules to available resource blocks;
wherein the resource block manager is configured to set up a programmable logic of one or more of the available resource blocks in dependence on an information describing a module, in order to allocate a module to the available resource block; and
wherein the block manager is configured to decide, on the basis of a current usage of the available resource blocks, to which of the resource blocks a module to be added is allocated.

9. The logic chip according to claim 1, wherein a coupling between the different subsets of bus information lines and the resource blocks comprises a spatial periodicity length of N resource blocks; and
wherein the block manager is configured such that a granularity with respect to an allocation of modules to available resource blocks is smaller than N resource blocks.

10. The Logic chip according to claim 1,
wherein the logic chip comprises a two-dimensional mesh of resource blocks,
wherein the bus comprises I different subsets of bus information lines; and
wherein each of the resource blocks comprises a coupling circuit configured to couple a functional circuitry of the resource block with one of the I different subsets of bus information lines; and
wherein the coupling circuits are configured such that I adjacent resource blocks, arranged along a first direction in the mesh of resource blocks, comprise, via their coupling circuits, a coupling with the I different subsets of bus information lines.

11. The logic chip according to claim 1, wherein the logic chip comprises a two dimensional mesh of resource blocks,
wherein the bus comprises I different subsets of bus information lines;
wherein each of the resource blocks comprises a coupling circuit configured to couple a functional circuitry of the resource block with one of the I subsets of bus information lines; and
wherein the coupling circuits are configured such that a sequence of different subsets of the bus information lines, to which adjacent resource blocks of a first row of resource blocks are coupled via corresponding coupling circuits, is spatially shifted with respect to a sequence of different subsets of the bus information lines, to which adjacent resource blocks of a second row of resource blocks are coupled via corresponding coupling circuits; and
wherein the coupling circuits are configured such that a sequence of different subsets of the bus information lines, to which adjacent resource blocks of a first column of resource blocks are coupled via corresponding coupling circuits, is spatially shifted with respect to a sequence of different subsets of the bus information lines, to which adjacent resource blocks of a second column of resource blocks are coupled via corresponding coupling circuits.

12. The logic chip according to claim 1, wherein the logic chip comprises a two-dimensional mesh of resource blocks; and
wherein the logic chip comprises at least a first module and a second module;
wherein the first module comprises a larger number of contiguous resource blocks than the second module;
wherein the first module is coupled with a larger number of bus information lines than the second module; and
wherein a number of bus information lines, to which the modules are coupled, varies in accordance with the size of the modules in terms of resource blocks, such that modules comprising more resource blocks are coupled to more of the bus information lines than modules comprising less resource blocks.

13. The logic chip according to claim 1,
wherein the logic chip comprises a bus master connection, a mapping circuit and a plurality of modules;
wherein the bus master connection comprises a plurality of bus master information lines to provide information to the modules or to receive information from the modules;
wherein each of the modules comprises one or more resource blocks;
wherein adjacent resource blocks comprise couplings with different strict subsets of the bus information lines; and
wherein the mapping circuit is configured to couple different subsets of the bus master information lines to different subsets of the bus information lines in dependence on a module position information describing a position of a currently addressed module.

14. A logic chip, comprising:
a plurality of individually addressable resource blocks, each comprising logic circuitry;
a bus comprising a plurality of subsets of bus information lines;
wherein a first strict subset of the bus information lines is periodically, in terms of space, connected with resource block logic circuitry once per N of the individually addressable resource blocks;
wherein a second strict subset of the bus information lines is periodically, in terms of space, connected with resource block logic circuitry once per N of the individually addressable resource blocks;
wherein N is greater than or equal to 2; and
wherein the bus information lines of the first subset are coupled to block logic circuitry of different resource blocks than the bus information lines of the second subset,
such that a line of resource blocks comprises a periodic sequence of couplings with different subsets of the bus information lines with a spatial periodicity of N.

15. A method for providing a configuration information for a configurable logic chip, the configurable logic chip comprising a plurality of resource blocks, the method comprising;
providing a configuration information describing a plurality of individually addressable modules, such that each of the modules comprises one or more resource blocks;
providing a configuration information describing a bus, such that the bus comprises a plurality of strict subsets of bus information lines,
wherein the configuration information describing the bus defines that a first strict subset of the bus information lines is periodically, in terms of space, connected to resource block logic circuitry once per N of the resource blocks, wherein the configuration information describing the bus defines that a second strict subset of the bus information lines is periodically, in terms of space, connected to resource block logic circuitry once per N of the resource blocks, and wherein N is greater than or equal to 2;

wherein the configuration information describing the bus defines that the bus information lines of the first subset are coupled to block logic circuitry of different resource blocks than the bus information lines of the second subset, such that a line of resource blocks comprises a periodic sequence of couplings with different subsets of the bus information lines with a spatial periodicity of N; and wherein the configuration information describing the plurality of individually addressable modules is provided such that an extension, in terms of resource blocks, of an individually addressable module differs from a bus periodicity of N resource blocks.

16. A non-transitory digital storage medium comprising a computer program for performing the method for providing a configuration information for a configurable logic chip, the configurable logic chip comprising a plurality of resource blocks, the method comprising;

providing a configuration information describing a plurality of individually addressable modules, such that each of the modules comprises one or more resource blocks;

providing a configuration information describing a bus, such that the bus comprises a plurality of strict subsets of bus information lines, wherein the configuration information describing the bus defines that a first strict subset of the bus information lines is periodically, in terms of space, connected to resource block logic circuitry once per N of the resource blocks, wherein the configuration information describing the bus defines that a second strict subset of the bus information lines is periodically, in terms of space, connected to resource block logic circuitry once per N of the resource blocks, and wherein N is greater than or equal to 2;

wherein the configuration information describing the bus defines that the bus information lines of the first subset are coupled to block logic circuitry of different resource blocks than the bus information lines of the second subset, such that a line of resource blocks comprises a periodic sequence of couplings with different subsets of the bus information lines with a spatial periodicity of N; and wherein the configuration information describing the plurality of individually addressable modules is provided such that an extension, in terms of resource blocks, of an individually addressable module differs from a bus periodicity of N resource blocks.

\* \* \* \* \*